US012393116B2

(12) United States Patent
Yamazaki et al.

(10) Patent No.: US 12,393,116 B2
(45) Date of Patent: Aug. 19, 2025

(54) PATTERN FORMING METHOD, PHOTOSENSITIVE RESIN COMPOSITION, CURED FILM, LAMINATE, AND DEVICE

(71) Applicant: FUJIFILM Corporation, Tokyo (JP)

(72) Inventors: Kenta Yamazaki, Shizuoka (JP); Toshihide Aoshima, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 927 days.

(21) Appl. No.: 17/336,337

(22) Filed: Jun. 2, 2021

(65) Prior Publication Data

US 2021/0302836 A1 Sep. 30, 2021

Related U.S. Application Data

(63) Continuation of application No. PCT/JP2019/046157, filed on Nov. 26, 2019.

(30) Foreign Application Priority Data

Dec. 5, 2018 (JP) ................................ 2018-228556

(51) Int. Cl.
*G03F 7/037* (2006.01)
*G03F 7/004* (2006.01)
(Continued)

(52) U.S. Cl.
CPC ............ *G03F 7/037* (2013.01); *G03F 7/0045* (2013.01); *G03F 7/033* (2013.01); *H01L 24/19* (2013.01);
(Continued)

(58) Field of Classification Search
CPC .... G03F 7/0045; G03F 7/2006; G03F 7/0387; G03F 7/037; G03F 7/033; G03F 7/029;
(Continued)

(56) References Cited

U.S. PATENT DOCUMENTS 4,258,263 A * 3/1981 Buldini .................. G03B 42/04 396/517
8,158,326 B2 * 4/2012 Kodama ............... C07C 381/12 430/326
(Continued)

FOREIGN PATENT DOCUMENTS

CN 103764708 4/2014
CN 105814488 7/2016
(Continued)

OTHER PUBLICATIONS

"Office Action of Korea Counterpart Application", issued on May 9, 2023, with English translation thereof, p. 1-p. 18.
(Continued)

*Primary Examiner* — Ratisha Mehta
(74) *Attorney, Agent, or Firm* — JCIPRNET

(57) ABSTRACT

There is provided a pattern forming method that includes an exposure step of exposing a photosensitive film to laser light; and a development step of developing the photosensitive film after the exposure to obtain a pattern, where the photosensitive film contains at least one precursor selected from the group consisting of a polyimide precursor and a polybenzoxazole precursor, and an onium salt.

24 Claims, 1 Drawing Sheet

(51) Int. Cl.
*G03F 7/033* (2006.01)
*H01L 23/00* (2006.01)
*G03F 7/20* (2006.01)

(52) U.S. Cl.
CPC ............ *H01L 24/20* (2013.01); *G03F 7/2006* (2013.01); *H01L 2224/214* (2013.01); *H01L 2224/215* (2013.01); *H01L 2924/07025* (2013.01)

(58) Field of Classification Search
CPC ...... G03F 7/027; G03F 7/0388; G03F 7/0755; H01L 2924/07025; H01L 2224/215; H01L 2224/214
See application file for complete search history.

(56) References Cited

U.S. PATENT DOCUMENTS

| | | | | |
|---|---|---|---|---|
| 8,908,293 | B2 * | 12/2014 | Maruyama | C08K 3/22 359/722 |
| 9,081,276 | B2 * | 7/2015 | Koda | C08G 59/68 |
| 9,223,211 | B2 * | 12/2015 | Sakita | C07D 417/12 |
| 9,250,519 | B2 * | 2/2016 | Kataoka | G03F 7/0046 |
| 9,315,670 | B2 * | 4/2016 | Ogihara | G03F 7/0755 |
| 9,606,436 | B2 * | 3/2017 | Tsai | G03F 7/0751 |
| 9,869,931 | B2 * | 1/2018 | Hatakeyama | G03F 7/0046 |
| 2008/0113297 | A1 * | 5/2008 | Shibasaki | G03F 7/029 430/286.1 |
| 2012/0288798 | A1 * | 11/2012 | Kotani | G03F 7/40 430/326 |
| 2013/0126860 | A1 * | 5/2013 | Fukuda | H01L 29/7869 257/43 |
| 2016/0187781 | A1 * | 6/2016 | Kang | G03F 7/325 430/325 |
| 2017/0075219 | A1 * | 3/2017 | Miyazawa | G03F 7/0382 |
| 2017/0168391 | A1 | 6/2017 | Yoshida et al. | |
| 2018/0066107 | A1 * | 3/2018 | Shoji | C08L 79/02 |
| 2018/0079864 | A1 | 3/2018 | Kawabata et al. | |
| 2018/0267406 | A1 * | 9/2018 | Nagai | C07C 303/32 |
| 2019/0369496 | A1 | 12/2019 | Kawabata et al. | |

FOREIGN PATENT DOCUMENTS

| | | | | |
|---|---|---|---|---|
| CN | 106716252 | | 5/2017 | |
| EP | 3492982 | | 6/2019 | |
| GB | 1339911 | | 12/1973 | |
| JP | 2010078820 | | 4/2010 | |
| JP | 2010132804 | | 6/2010 | |
| KR | 20160085303 | | 7/2016 | |
| TW | 201523140 | | 6/2015 | |
| TW | 201714934 | | 5/2017 | |
| WO | 2015087830 | | 6/2015 | |
| WO | 2015087831 | | 6/2015 | |
| WO | 2016035819 | | 3/2016 | |
| WO | 2017038664 | | 3/2017 | |
| WO | WO-2017131037 | A1 * | 8/2017 | C08F 2/48 |
| WO | 2017209176 | | 12/2017 | |
| WO | 2018025738 | | 2/2018 | |
| WO | 2018151195 | | 8/2018 | |

OTHER PUBLICATIONS

"Office Action of Taiwan Counterpart Application", issued on May 25, 2023, with partial English translation thereof, p. 1-p. 33.

Office Action of Japan Counterpart Application, with English translation thereof, issued on Apr. 19, 2022, pp. 1-8.

"Search Report of Europe Counterpart Application", issued on Dec. 3, 2021, p. 1-p. 9.

Office Action of Japan Counterpart Application, with English translation thereof, issued on Oct. 18, 2022, pp. 1-6.

"International Search Report (Form PCT/ISA/210) of PCT/JP2019/046157," mailed on Feb. 4, 2020, with English translation thereof, pp. 1-7.

"Written Opinion of the International Searching Authority (Form PCT/ISA/237)" of PCT/JP2019/046157, mailed on Feb. 4, 2020, with English translation thereof, pp. 1-10.

"Office Action of China Counterpart Application", issued on Nov. 27, 2023, with English translation thereof, p. 1-p. 13.

"Office Action of Europe Counterpart Application", issued on Feb. 17, 2025, pp. 1-4.

"Office Action of Europe Counterpart Application", issued on Jun. 20, 2025, p. 1-p. 4.

* cited by examiner

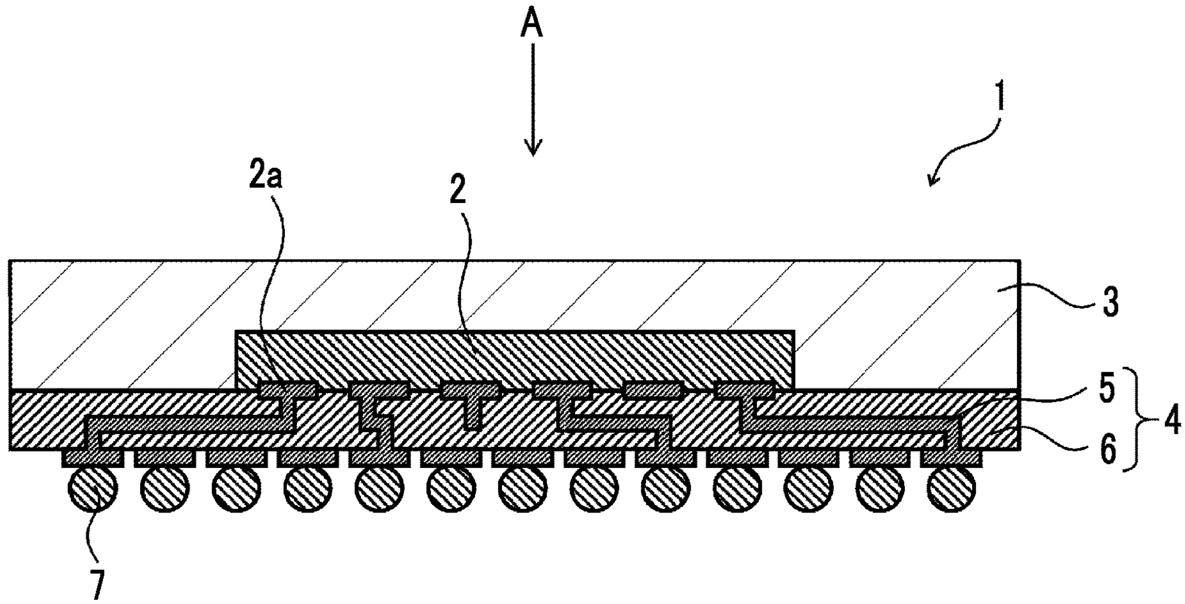
A
1
2a
2
3
5
4
6
7

PATTERN FORMING METHOD, PHOTOSENSITIVE RESIN COMPOSITION, CURED FILM, LAMINATE, AND DEVICE

CROSS-REFERENCE TO RELATED APPLICATIONS

This application is a Continuation of PCT International Application No. PCT/JP2019/046157 filed on Nov. 26, 2019, which claims priority under 35 U.S.C § 119 (a) to Japanese Patent Application No. 2018-228556 filed on Dec. 5, 2018. Each of the above application(s) is hereby expressly incorporated by reference, in its entirety, into the present application.

BACKGROUND OF THE INVENTION

1. Field of the Invention

The present invention relates to a pattern forming method, a photosensitive resin composition, a cured film, a laminate, and a device.

2. Description of the Related Art

In the related art, a polyimide resin, a polybenzoxazole resin, or the like, which has excellent heat resistance, electrical properties, mechanical properties, and the like has been used as a protective film and an interlayer insulating film of a semiconductor element. However, as the integration of semiconductor elements and the increase in the size of semiconductor elements progress in recent years, there is a demand for a thinner and smaller sealing resin package, and a method such as surface mounting using lead-on-chip (LOC) or a solder reflow method has been adopted.

In recent years, demand for a material for semiconductor packaging is increased. There are various semiconductor packaging methods in semiconductor devices. For example, a semiconductor element is covered by a sealing member (a mold resin) except for one surface to form an element sealing member, and further, a rewiring layer is formed on the one surface of the semiconductor element which is not covered by the sealing member. Among the semiconductor packaging methods, in recent years, a semiconductor packaging method called Fan-Out packaging has become used mainly.

FIG. 1 is a schematic cross-sectional view illustrating one example of a Fan-Out type semiconductor device.

In FIG. 1, a semiconductor device 1 has a semiconductor chip 2, a sealing agent 3 that covers the semiconductor chip 2, and a rewiring layer 4 that is closely attached to the semiconductor chip 2 and the sealing agent 3.

As shown in FIG. 1, the sealing agent 3 covers the surface of the semiconductor chip 2 and is formed in an area larger than the region of the semiconductor chip 2 in a case of being seen in a plan view (an arrow A).

The rewiring layer 4 has a plurality of wires 5 that are electrically connected to a plurality of terminals 2a provided on the semiconductor chip 2, and an interlayer insulating film 6 with which the space between the wires 5 is filled. The plurality of terminals 2a provided on the semiconductor chip 2 and the plurality of wires 5 in the rewiring layer 4 are electrically connected. One end of the wire 5 is connected to the terminal 2a, and the other end is connected to an external connection terminal 7. The wire 5 between the terminal 2a and the external connection terminal 7 is entirely covered by an interlayer insulating film 6.

In this manner, according to the Fan-Out type, an element sealing body can be formed by covering a semiconductor element (a semiconductor chip) with a sealing member so that the element sealing body is formed in a region larger than a size of a chip, and further, a rewiring layer that extends to the regions of the semiconductor chip and the sealing member can be formed. Since the rewiring layer is thin and even the region of the sealing member can be used as a region in which the rewiring layer is formed, the number of external connection terminals can be increased. Not only Fan-Out wafer level packaging (FOWLP) but also Fan-Out panel level packaging (FOPLP) is studied now.

In addition, it is expected that the demand for materials for such semiconductor chips and semiconductor packaging increases with the expansion of the demand in the communication field and the in-vehicle field.

In the manufacturing of such a semiconductor element, a photosensitive resin composition containing at least one precursor selected from the group consisting of a polyimide resin precursor (a polyimide precursor) and a polybenzoxazole resin precursor (a polybenzoxazole precursor) may be used. In a case where the photosensitive resin composition is used, merits such as simplification of the pattern forming step can be conceivable.

For example, WO2018/025738A discloses a photosensitive resin composition containing a heterocyclic ring-containing polymer precursor, a thermal base generator, and an organic compound containing a Group 4 element.

In addition, JP2010-039475A discloses a photosensitive resin composition for ultraviolet light laser exposure, containing (A) resin; (B) ethylenically unsaturated compound; (C) photopolymerization initiator; and (D) thiol compound.

SUMMARY OF THE INVENTION

For the intended purpose of improving a surface smoothness (reducing surface roughness) of an obtained cured film, it is conceivable to carry out the exposure of a photosensitive film containing a precursor such as a polyimide precursor by using laser light.

However, it has been found that in a case where the exposure is carried out using the laser light, damage such as decomposition of a polymer in the photosensitive film may occur due to reasons such as the illumination intensity. As a result, it has been found that the chemical resistance of the obtained cured film by curing the photosensitive film may decrease.

An object of the present invention is to a pattern forming method with which a cured film excellent in surface smoothness and chemical resistance can be manufactured, a photosensitive resin composition that is used for forming a photosensitive film in the pattern forming method, a cured film that is formed from the photosensitive resin composition, a laminate containing the cured film, and a device having the cured film or the laminate. Representative embodiments of the present invention are described below.

<1> A pattern forming method comprising an exposure step of exposing a photosensitive film to laser light; and a development step of developing the photosensitive film after the exposure to obtain a pattern, in which the photosensitive film contains at least one precursor selected from the group consisting of a polyimide precursor and a polybenzoxazole precursor, and an onium salt.

<2> The pattern forming method according to <1>, in which a wavelength of the laser light is 250 to 550 nm.

<3> The pattern forming method according to <1> or <2>, in which the photosensitive film further contains a compound having a plurality of carboxy groups and having a molecular weight of 1,000 or less.

<4> The pattern forming method according to any one of <1> to <3>, in which the photosensitive film further contains a compound having a sulfurous ester structure.

<5> The pattern forming method according to any one of <1> to <4>, further comprising a curing step of heating the pattern to obtain a cured pattern, after the development step.

<6> The pattern forming method according to any one of <1> to <5>, in which a cation in the onium salt includes at least one cation selected from the group consisting of a tetraalkylammonium cation, a sulfonium cation, and an iodonium cation.

<7> The pattern forming method according to any one of <1> to <6>, in which the onium salt contains an ammonium cation as a cation, and the onium salt contains an anion of which a conjugate acid has a pKa of 1.8 or less, as an anion.

<8> The pattern forming method according to any one of <1> to <7>, in which the photosensitive film further contains a Group 4 element-containing compound is further contained.

<9> The pattern forming method according to <8>, in which the Group 4 element-containing compound is a photoradical generator.

<10> The pattern forming method according to <8> or <9>, in which the Group 4 element-containing compound is an organic compound containing at least one selected from the group consisting of a titanium atom, a zirconium atom, and a hafnium atom.

<11> The pattern forming method according to any one of <8> to <10>, in which the Group 4 element-containing compound includes at least one selected from the group consisting of metallocene and a metallocene derivative.

<12> The pattern forming method according to any one of <1> to <11>, in which the photosensitive film is a photosensitive film formed by slit coating.

<13> The pattern forming method according to any one of <1> to <12>, in which the photosensitive film is formed on a rectangular base material.

<14> A photosensitive resin composition comprising: at least one precursor selected from the group consisting of a polyimide precursor and a polybenzoxazole precursor; and an onium salt, in which the photosensitive resin composition is used for forming the photosensitive film in the pattern forming method according to any one of <1> to <13>.

<15> A cured film formed from the photosensitive resin composition according to <14>.

<16> The cured film according to <15>, in which the cured film is used as an interlayer insulating film for a rewiring layer.

<17> A laminate comprising two or more layers of the cured films according to <15> or <16>.

<18> The laminate according to <17>, further comprising a metal layer between the cured films.

<19> A device comprising the cured film according to <15> or <16> or the laminate according to <17> or <18>.

An object of the present invention is to provide a pattern forming method with which a cured film excellent in surface smoothness and chemical resistance can be manufactured, a photosensitive resin composition that is used for forming a photosensitive film in the pattern forming method, and a cured film that is formed from the photosensitive resin composition, a laminate containing the cured film, and a device having the cured film or the laminate.

BRIEF DESCRIPTION OF THE DRAWINGS

FIG. 1 is a schematic cross-sectional view illustrating one example of a Fan-Out type semiconductor device.

DESCRIPTION OF THE PREFERRED EMBODIMENTS

Hereinafter, the contents of the present invention will be described in detail.

In the present specification, "to" is used to mean that numerical values described before and after "to" are included as a lower limit value and an upper limit value, respectively.

In describing a group (an atomic group) in the present specification, in a case where a description about substitution and non-substitution is not provided, the description means the group includes a group (an atomic group) having a substituent as well as a group (an atomic group) having no substituent. For example, the description "alkyl group" includes not only an alkyl group that does not have a substituent (an unsubstituted alkyl group) but also an alkyl group that has a substituent (a substituted alkyl group).

In the present specification, "exposure" includes not only exposure using light but also lithography using particle beams such as electron beams and ion beams, unless otherwise specified. In addition, examples of the light that is used for exposure include an emission line spectrum of a mercury lamp; active rays such as a far ultraviolet ray represented by an excimer laser, an extreme ultraviolet ray (EUV light), an X-ray, and an electron beam; and radiation.

In the present specification, "(meth)acrylate" represents both or one of "acrylate" and "methacrylate", "(meth)acryl" represents both or one of "acryl" and "methacryl", and "(meth)acryloyl" represents both or one of "acryloyl" and "methacryloyl".

In the structural formula of the present specification, Me represents a methyl group, Et represents an ethyl group, Bu represents a butyl group, and Ph represents a phenyl group.

In the present specification, the total solid content refers to the total mass of components excluding a solvent from the entire components of the composition. In addition, in the present specification, the solid content concentration is a mass percentage of other components excluding a solvent with respect to the total mass of the composition.

In the present specification, the term "step" includes not only an independent step but also a step that cannot be clearly distinguished from other steps, as long as the intended action of the step is achieved.

In the present specification, weight-average molecular weight (Mw) and number-average molecular weight (Mn) are defined as polystyrene equivalent values according to gel permeation chromatography (GPC) measurement unless otherwise specified. In the present specification, the weight-average molecular weight (Mw) and the number-average molecular weight (Mn) can be determined, for example, by using HLC-8220 GPC (manufactured by Tosoh Corporation) and using, as a column, GUARD COLUMN HZ-L, TSKgel Super HZM-M, TSK gel Super HZ4000, TSK gel Super HZ3000, and TSK gel Super HZ2000 (manufactured by Tosoh Corporation). The measurements of the above molecular weights are carried out using tetrahydrofuran (THF) as an eluent unless otherwise specified. In addition, the detection in GPC measurement is carried out using a detector with an ultraviolet ray (a UV ray) of a wavelength of 254 nm unless otherwise specified.

In the present specification, a composition may contain, as each component contained in the composition, two or more compounds corresponding to the component unless otherwise particularly specified. The content of each component in the composition means the total content of all the compounds corresponding to the component unless otherwise particularly specified.

In the present specification, the wavy line part or the asterisk (*) in the structural formula represents a bonding position to another structure unless otherwise particularly specified.

In the present invention, the atmospheric pressure at the time of measuring a boiling point is 101,325 Pa (1 atmospheric pressure) unless otherwise specified. The temperature in the present invention is 23° C. unless otherwise specified. The humidity in the present invention is a relative humidity of 50% RH unless otherwise specified.

In the present specification, a combination of preferred aspects is a more preferred aspect.

(Pattern Forming Method)

A pattern forming method according to the embodiment of the present invention includes an exposure step of exposing a photosensitive film to laser light; and a development step of developing the photosensitive film after the exposure to obtain a pattern, where the photosensitive film contains at least one precursor selected from the group consisting of a polyimide precursor and a polybenzoxazole precursor, and an onium salt.

By the pattern forming method according to the embodiment of the present invention, a cured film excellent in surface smoothness and chemical resistance can be obtained.

The reason why the above effect is obtained is not clear; however, it is presumed as follows.

In a case where laser light is used in an exposure step, a surface of a pattern is cured rapidly, and thus it is conceived that the surface smoothness of the obtained cured film is excellent.

However, in a case where the laser light is used in the exposure step, the obtained chemical resistance may be reduced due to reasons such as damage to the polymer (for example, the precursor described above) contained in the photosensitive film, as described above.

In the pattern forming method according to the embodiment of the present invention, an onium salt is contained in the photosensitive film. In a case where a photosensitive film containing the onium salt is used, since the onium salt is a low molecular-weight compound having a high hardness, it is presumed that a cured film excellent in chemical resistance can be obtained even in a case where laser light is used in the exposure step due to the reasons that the film hardness of the cured film is improved, the curing of the precursor at the time of heating is promoted since the onium salt is contained in the photosensitive film, and the like.

Further, in a case where laser light is used in the exposure step, the surface of the photosensitive film is cured rapidly since the energy of the laser light is high. However, it may take time for the inside thereof to be cured. In such a case, the curing of the inside of the photosensitive film may be insufficient, and the mechanical strength of the obtained cured film may be reduced. However, according to the present invention, it is presumed that a cured film having a high mechanical strength is easily obtained even in a case where laser light is used in the exposure step due to the reasons such as the improvement of film hardness and the promotion of curing of a precursor, caused by the onium salt described above.

WO2018/025738A discloses a pattern forming method using a polyimide precursor or the like but describes and suggests nothing about the technical idea of the present invention that in a case where laser light is used in the exposure step and a photosensitive film contains an onium salt, an obtained cured film is excellent in chemical resistance.

Further, JP2010-039475A describes that the exposure is carried out using laser light, but does not describe a pattern forming method using a photosensitive film containing a polyimide precursor or the like. Furthermore, these documents describe and suggest nothing about the aspect in which the cured film contains the above precursor or the like, and the onium salt, and that the effect that the photosensitive film obtained from the aspect is excellent in chemical resistance is exhibited.

Hereinafter, details of each of the steps in the pattern forming method according to the embodiment of the present invention will be described.

<<Exposure Step>>

The pattern forming method according to the embodiment of the present invention includes the exposure step.

In the exposure step, at least a part of the photosensitive film is exposed to laser light.

The laser is an acronym for Light Amplification by Stimulated Emission of Radiation in English. An oscillator and an amplifier that generate monochromatic light having much stronger coherence and directivity by amplifying and oscillating light waves by utilizing the phenomenon of stimulated emission that occurs in a substance with population inversion, and a laser having an oscillation wavelength in conventionally known ultraviolet light, such as a solid-state laser, a liquid laser, a gas laser, or a semiconductor laser, which is obtained from a crystal, glass, a liquid, a dye, or a gas, as an excitation medium, can be used. Among the above, a semiconductor laser, a solid-state laser, or a gas laser is preferable from the viewpoint of the laser output and the oscillation wavelength.

In a case where laser light is used for exposure, the surface roughness of the obtained cured film is reduced. In addition, it is conceived that the productivity of the pattern tends to be excellent due to the rapid progression of curing and the like.

In a case where a laser light source is used as an exposure light source, the wavelength of the laser light is preferably 250 to 550 nm and more preferably 350 to 450 nm, from the viewpoint of ease of handling of the photosensitive resin composition.

Specifically, the second harmonic (532 nm) or third harmonic (355 nm) of the Nd: YAG laser, which is a solid-state laser having a particularly large output and relatively inexpensive, the excimer laser XeCl (308 nm) or XeF (353 nm), or the semiconductor laser (405 nm) can be suitably used.

The exposure dose in the exposure step is preferably in a range of 50 mJ/cm$^2$ to 3,000 mJ/cm$^2$, more preferably in a range of 75 mJ/cm$^2$ to 2,000 mJ/cm$^2$, and particularly preferably in a range of 100 mJ/cm$^2$ to 1,000 mJ/cm$^2$. The exposure dose in the above range is preferable in terms of productivity and resolution.

Since the laser light has good parallelism, it is possible to reduce a portion (a laser spot diameter, an irradiation width, or the like) to be irradiated. As a result, it is possible to carry out pattern exposure (direct exposure) without using a photo mask at the time of exposure, by a method of using laser light and moving a photosensitive film or a laser light source, or the like. According to such an aspect, steps such as designing, manufacturing, installing, and removing a photo mask can be omitted, and thus it is conceived that the productivity is further improved.

Further, in a case where it is desired to suppress an influence of a shape or profile of the output light on the pattern shape to be obtained, a preferred aspect is to carry out pattern exposure using a photo mask even in a case where laser light is used as a light source. Further, another exposure may be carried out in addition to the pattern exposure.

As the photosensitive film that is used in the pattern forming method according to the embodiment of the present invention, for example, a photosensitive film manufactured by applying the photosensitive resin composition of the present invention to a member such as a base material and then carrying out drying may be used, or a photosensitive film purchased or the like may be used.

That is, the pattern forming method according to the embodiment of the present invention may or may not include a step of forming a photosensitive film (a photosensitive film forming step) before the exposure step. Details of the photosensitive film and the photosensitive film forming step will be described later.

Further, the photosensitive film that is used in the pattern forming method according to the embodiment of the present invention is preferably a photosensitive film formed on a base material.

The kind of base material can be appropriately determined depending on the application, and examples thereof are semiconductor manufacturing base materials such as silicon, silicon nitride, polysilicon, silicon oxide, and amorphous silicon, quartz, glass, an optical film, a ceramic material, a vapor-deposited film, a magnetic film, a reflective film, metal base materials such as Ni, Cu, Cr, and Fe, paper, spin-on-glass (SOG), a thin film transistor (TFT) array base material, and an electrode plate of a plasma display panel (PDP), and are not particularly limited thereto.

In the present invention, in particular, a semiconductor production base material is preferable, and a silicon base material is more preferable.

Further, a layer such as an adhesion layer or an oxide layer may be provided on the surface of these base materials.

The shape of the base material is not particularly limited and may be circular or rectangular; however, it is preferably rectangular.

Regarding the size of the base material, for example in a case of a circular shape, the diameter is 100 to 450 mm and preferably 200 to 450 mm. In a case where the shape is rectangular, for example, the length of the short side is 100 to 1,000 mm and preferably 200 to 700 mm.

The photosensitive film that is used in the pattern forming method according to the embodiment of the present invention is preferably a photosensitive film formed by coating.

As the means for the coating, various coating methods such as slit coating (slit application), an inkjet method, spin coating (spin application), cast coating (cast application), roll coating, screen printing method, and the like can be applied. Among them, spin coating or slit coating is preferable from the viewpoint of accuracy and speed, and slit coating is more preferable.

Further, the photosensitive film is preferably a photosensitive film formed by a method of transferring a coating film formed in advance on a temporary support by the above-described coating method onto a base material.

Regarding the transfer method, the manufacturing methods disclosed in paragraphs 0023, and 0036 to 0051 of JP2006-023696A and paragraphs 0096 to 0108 of JP2006-047592A can be suitably used for forming a photosensitive film.

Further, it is preferable for the onium salt contained in the photosensitive film not to be decomposed after the exposure step. Whether or not the onium salt is decomposed after the exposure step is confirmed by calculating the decomposition rate of the onium salt before and after the exposure, which will be described later. Specifically, in a case where the decomposition rate of the onium salt is 20% or less, it is determined that the onium salt is a compound that does not decompose after the exposure step. The decomposition rate is preferably 10% or less, more preferably 5% or less, and still more preferably 1% or less. The lower limit of the decomposition rate is not particularly limited and may be 0%.

<Development Step>

The pattern forming method according to the embodiment of the present invention includes the development step.

By carrying out development, an unexposed portion (non-exposed portion) of the photosensitive film is removed. The developing method is not particularly limited as long as a desired pattern can be formed, and examples thereof include ejecting from a nozzle, carrying out spraying, and immersing of a base material in a developer, and ejecting from a nozzle is preferably used. In the development step, a step of continuously supplying a developer to a base material, a step of keeping a developer in a substantially stationary state on a base material, a step of vibrating a developer by ultrasonic waves or the like, and a step obtained by combining these steps can be adopted.

Development is carried out using a developer. The developer can be used without particular limitation as long as it can remove the unexposed portion (the non-exposed portion). The developer preferably contains an organic solvent.

Further, the developer may contain an alkaline aqueous solution containing a basic compound.

The developer may contain a conventionally known surfactant.

In a case where the developer contains an organic solvent, the developer preferably contains an organic solvent having a ClogP of −1 to 5 and more preferably an organic solvent having a ClogP of 0 to 3. The ClogP can be determined as a calculated value by inputting a structural formula in ChemBioDraw.

In a case where the developer contains an organic solvent, examples of the organic solvents include esters such as ethyl acetate, n-butyl acetate, amyl formate, isoamyl acetate, isobutyl acetate, butyl propionate, isopropyl butyrate, ethyl butyrate, butyl butyrate, methyl lactate, ethyl lactate, γ-butyrolactone, ε-caprolactone, δ-valerolactone, an alkyl alkyloxyacetate (example: a methyl alkyloxyacetate, an ethyl alkyloxyacetate, and a butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (example: a methyl 3-alkyloxypropionate and an ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (example: a methyl 2-alkyloxypropionate, an ethyl 2-alkyloxypropionate, and a propyl 2-alkyl oxypropionate (for example, methyl 2-methoxypropionate, ethyl 2-methoxypropionate, propyl 2-methoxypropionate, methyl 2-ethoxypropionate, and ethyl 2-ethoxypropionate)), a methyl 2-alkyloxy-2-methylpropionate and an ethyl 2-alkyloxy-2-methylpropionate (for example, methyl 2-methoxy-2- methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; ketones such as methyl ethyl ketone, cyclohexanone, cyclopentanone, 2-heptanone, 3-heptanone, and N-methyl-2-pyrrolidone; aromatic hydrocarbons such as toluene, xylene, anisole, and limonene; and sulfoxides such as dimethyl sulfoxide. In addition, the suitable examples thereof also include a mixture of these organic solvents.

In a case where the developer contains an organic solvent, the organic solvent is particularly preferably cyclopentanone or γ-butyrolactone and more preferably cyclopentanone.

The content of the organic solvent in the developer is preferably 50% by mass or more, more preferably 70% by mass or more, and still more preferably 90% by mass or more, with respect to the total mass of the developer. In addition, in the developer, the content of the organic solvent may be 100% by mass.

In a case where the developer contains an alkaline aqueous solution, examples of the basic compound that the alkaline aqueous solution can contain include tetramethylammonium hydroxide (TMAH), potassium hydroxide (KOH), and sodium carbonate, and preferred examples thereof is TMAH. For, example, in a case where TMAH is used, the content of the basic compound in the developer is preferably 0.01% to 10% by mass, more preferably 0.1% to 5% by mass, and still more preferably 0.3% to 3% by mass in the total amount of the developer.

The development time is preferably 10 seconds to 5 minutes. The temperature at the time of development is not particularly specified, and the development can usually be carried out at 20° C. to 40° C.

After treating with the developer, rinsing may be further carried out. The rinsing is preferably carried out with a solvent different from the developer. Examples of the rinsing liquid for development with a developer containing an organic solvent include propylene glycol monomethyl ether acetate (PGMEA) and isopropanol (IPA), and a preferred example thereof is PGMEA. Further, water is preferable as the rinsing liquid for development with a developer containing an alkaline aqueous solution. For example, the rinsing can be carried out using a solvent contained in the photosensitive resin composition. The rinsing time is preferably 5 seconds to 1 minute.

<Photosensitive Film Forming Step>

The pattern forming step according to the present invention may further include a photosensitive film forming step.

A photosensitive film is obtained by the above-described photosensitive film forming step.

In the photosensitive film forming step, the photosensitive resin composition according to the embodiment of the present invention, which will be described later, is applied onto the base material described above and dried as necessary to form a photosensitive film.

In a case where a photosensitive film is formed on a surface of a resin layer such as a cured film or on a surface of a metal layer, the resin layer or the metal layer is the base material.

The means for applying a photosensitive resin composition to a base material is preferably coating.

As the coating means, the coating method described above can be used. Among the above, spin coating or slit coating is preferable from the viewpoint of accuracy and speed. In addition, the transfer method described above can also be used.

Further, a step of removing an unnecessary film at the edge of the base material may be carried out. Examples of such a step include edge bead rinsing (EBR) and air knifing.

[Drying]

In the photosensitive film forming step, after applying the photosensitive resin composition, drying may be carried out to remove the solvent. The preferred drying temperature is 50° C. to 150° C., more preferably 70° C. to 130° C., and still more preferably 90° C. to 110° C. Examples of the drying time include 30 seconds to 20 minutes, and the drying time is preferably 1 minute to 10 minutes and more preferably 3 minutes to 7 minutes.

<Curing Step>

The pattern forming method according to the embodiment of the present invention further includes preferably a curing step of heating the pattern to obtain a cured pattern, after the development step.

By the curing step, the cured film according to the embodiment of the present invention, which will be described later, can be obtained.

In the curing step, a cyclization reaction of a specific precursor proceeds.

In addition, in a case where the photosensitive layer contains a compound containing a radically polymerizable group, and the like, other than the specific precursor, the polymerization of the unreacted radically polymerizable group in these compounds also proceeds.

The heating temperature (the maximum heating temperature) in the curing step is preferably 50° C. to 450° C., more preferably 140° C. to 400° C., and still more preferably 160° C. to 350° C.

In the curing step, the temperature elevation rate from the temperature at the start of heating to the maximum heating temperature is preferably 1 to 12° C./min, more preferably 2 to 10° C./min, and still more preferably 3 to 10° C./min. In a case where the above temperature elevation rate is set to 1° C./min or higher, excessive volatilization of the amine can be prevented while securing productivity, and in a case where the above temperature elevation rate is to 12° C./min or lower, residual stress of the cured film can be relieved.

The temperature at the start of heating is preferably 20° C. to 150° C., more preferably 20° C. to 130° C., and still more preferably 25° C. to 120° C. The temperature at the start of heating refers to a temperature at which the step of heating to the maximum heating temperature is started. For example, in a case where the photosensitive resin composition is applied on a base material and then dried, the temperature at the start of heating is the temperature after drying, and for example, it is preferable to gradually raise the temperature from a temperature lower by 30° C. to 200° C. than the boiling point of the solvent contained in the photosensitive resin composition.

The heating time (the heating time at the maximum heating temperature) is preferably 10 to 360 minutes, more preferably 20 to 300 minutes, and particularly preferably 30 to 240 minutes.

Particularly, in the case of forming a multilayer laminate, the heating is preferably carried out at a heating temperature of 180° C. to 320° C. and more preferably 180° C. to 260° C., from the viewpoint of adhesiveness between the cured films. Although the reason is not clear, a conceivable reason is that, in a case where the temperature is set to the above range, for example, ethynyl groups of the specific precursor between layers undergo a crosslinking reaction with each other.

The heating may be carried out stepwise. For example, a pretreatment step in which the temperature is raised from 25° C. to 180° C. at 3° C./min, held at 180° C. for 60 minutes, raised from 180° C. to 200° C. at 2° C./min, and held at 200° C. for 120 minutes, may be carried out. The heating temperature as the pretreatment step is preferably 100° C. to 200° C., more preferably 110° C. to 190° C., and still more preferably 120° C. to 185° C. In the pretreatment step, it is also preferable to carry out the treatment while irradiating with ultraviolet rays as described in U.S. Pat. No. 9,159,547B. By such a pretreatment step, it is possible to improve the properties of the film. The pretreatment step may be carried out for a short time of about 10 seconds to two hours and more preferably 15 seconds to 30 minutes. The pretreatment may be carried out in two or more stages, for example, a first stage pretreatment step may be carried out in a range of 100° C. to 150° C., and then a second stage pretreatment step may be carried out in a range of 150° C. to 200° C.

Further, cooling may be carried out after heating, and the cooling rate, in this case, is preferably 1 to 5° C./min.

It is preferable that the heating step is carried out in an atmosphere of low oxygen concentration by causing an inert gas such as nitrogen, helium, argon, or the like to flow, from the viewpoint of preventing the decomposition of the polymer precursor. The oxygen concentration is preferably 50 ppm (volume ratio) or lower, and more preferably 20 ppm (volume ratio) or lower.

The heating unit that is used in the curing step is not particularly limited, and examples thereof include a hot plate, an infrared furnace, an electric heating oven, and a hot air oven.

The photosensitive resin composition according to the embodiment of the present invention preferably contains, as an onium salt, a compound that is not decomposed by heating in the curing step. For confirming whether or not the onium salt has been decomposed by heating in the curing step, the obtained cured film after the curing step is scraped and pulverized in a mortar, and then the obtained pulverized product is immersed in a solution of methanol/THF=50/50 (mass ratio) for 10 minutes while applying ultrasonic waves. An extract extracted into the above solution is analyzed by high performance liquid chromatography (HPLC), and then the decomposition rate of the onium salt is calculated according to the following expression.

Decomposition rate of onium salt (%)=amount of decomposition product (mol)/amount of onium salt (mol) contained in photosensitive film before exposure step×100

In a case where the decomposition rate of the onium salt is 20% or less, it is determined that the onium salt is a compound that is not decomposed by heating in the curing step. The decomposition rate is preferably 10% or less, more preferably 5% or less, and still more preferably 1% or less. The lower limit of the decomposition rate is not particularly limited and may be 0%.

<Metal Layer Forming Step>

It is preferable that the pattern forming method according to the embodiment of the present invention includes a metal layer forming step of forming a metal layer on the surface of the photosensitive film (the cured film) after the development treatment.

For the metal layer, existing metal kinds can be used without particular limitations. Examples thereof include copper, aluminum, nickel, vanadium, titanium, chromium, cobalt, gold, tungsten, and alloys including these metals, preferred examples thereof are copper and aluminum, and a more preferred example thereof is copper.

The method of forming the metal layer is not particularly limited, and the existing method can be applied. For example, the methods disclosed in JP2007-157879A, JP2001-521288A, JP2004-214501A, and JP2004-101850A can be used. For example, photolithography, lift-off, electrolytic plating, electroless plating, etching, printing, and a method obtained by combining these may be conceivable. More specific examples of the method of forming the metal layer include a patterning method obtained by combining sputtering, photolithography, and etching, and a patterning method combining photolithography and electrolytic plating.

The thickness of the metal layer at the thickest part is preferably 0.1 to 50 μm and more preferably 1 to 10 μm.

<Laminating Step>

The pattern forming method according to the embodiment of the present invention preferably includes a laminating step.

In a case where the pattern forming method according to the embodiment of the present invention includes a laminating step, the laminate of the present invention, which will be described later, can be obtained.

The laminating step is a series of steps, including carrying out the photosensitive film forming step, the exposure step, and the development step in order. It goes without saying that the laminating step may further include the heating step and the like.

In a case where another laminating step is further carried out after the laminating step, a surface activation treatment step may be further carried out after the exposure step or the metal layer forming step. Examples of the surface activation treatment include plasma treatment.

The laminating step is preferably carried out 2 to 5 times and more preferably 3 to 5 times.

For example, a configuration having resin layers of 3 or more and 7 or less, such as a resin layer (a cured film according to the embodiment of the present invention)/a metal layer/a resin layer/a metal layer/a resin layer/a metal layer, is preferable, and a configuration having resin layers of 3 or more and 5 or less is more preferable.

In the above layers, the compositions, shapes, film thicknesses, and the likes may be the same or may be different from each other.

That is, in the present invention, it is particularly preferable to further carry out the photosensitive film forming step, the exposure step, and the development step in order so that the metal layer is covered, after the metal layer has been provided. By alternately carrying out the laminating step of laminating a resin layer and the metal layer forming step, the resin layer and the metal layer can be laminated alternately.

(Photosensitive Resin Composition and Photosensitive Film)

The photosensitive film that is used in the pattern forming method according to the embodiment of the present invention contains at least one precursor selected from the group consisting of a polyimide precursor and a polybenzoxazole precursor, and an onium salt.

The photosensitive resin composition of the present invention contains at least one precursor selected from the group consisting of a polyimide precursor and a polybenzoxazole precursor, and an onium salt, and is used for forming the above photosensitive film in the pattern forming method according to the embodiment of the present invention.

The photosensitive film that is used in the pattern forming method according to the embodiment of the present invention is preferably formed by removing a solvent from the photosensitive resin composition of the present invention, as necessary.

Hereinafter, the details of the photosensitive resin composition according to the embodiment of the present invention will be described; however, among the components contained in the photosensitive resin composition according to the embodiment of the present invention, components excluding the solvent are also contained in the photosensitive film that is included in the present invention.

That is, the content of each of the components contained in the photosensitive film that is used in the present invention is defined by reading "the content of each component with respect to the total solid content of the photosensitive resin composition according to the embodiment of the present invention" described in the description of each component as "the content of each component with respect to the total solid content of the photosensitive film that is used in the present invention". In addition, in a case where the photosensitive film contains substantially no solvent, it can be considered that "the content of each component with respect to the total solid content of the photosensitive film that is used the present invention" is synonymous with "the content of each component with respect to the total mass of the photosensitive film that is used in the present invention". The details of the aspect that "the photosensitive film contains substantially no solvent" will be described later.

Hereinafter, components of the photosensitive resin composition according to the embodiment of the present invention will be described.

<Precursor>

The photosensitive resin composition according to the embodiment of the present invention contains at least one precursor (also referred to as a "specific precursor") selected from the group consisting of a polyimide precursor and a polybenzoxazole precursor, and preferably contains a polyimide precursor.

In addition, the specific precursor preferably contains at least one selected from the group consisting of a radically polymerizable group, a fluorine atom, a silicon atom, a phenolic hydroxyl group, and a carboxy group.

The radically polymerizable group contained in the specific precursor is preferably an ethylenically unsaturated group, more preferably a (meth)acryloyl group, a (meth)allyl group, or a vinylphenyl group, and still more preferably a (meth)acryloyl group.

The (meth)acryloyl group preferably constitutes a (meth) acrylamide group or a (meth)acryloxy group and more preferably constitutes a (meth)acryloxy group.

[Polyimide Precursor]

The kind or the like of the polyimide precursor that is used in the present invention is not particularly specified; however, it is preferable that the polyimide precursor contains a repeating unit represented by Formula (2).

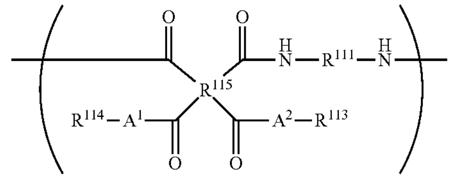

(2)

In Formula (2), $A^1$ and $A^2$ each independently represent an oxygen atom or —NH—, $R^{111}$ represents a divalent organic group, $R^{115}$ represents a tetravalent organic group, and $R^{113}$ and $R^{114}$ each independently represent a hydrogen atom or a monovalent organic group.

$A^1$ and $A^2$ in Formula (2) each independently represent an oxygen atom or —NH—, and an oxygen atom is preferable.

$R^{111}$ in Formula (2) represents a divalent organic group. Examples of the divalent organic group include a group having a linear or branched aliphatic group, a cyclic aliphatic group, and an aromatic group. Preferred examples thereof include a linear aliphatic group having 2 to 20 carbon atoms, a branched aliphatic group having 3 to 20 carbon atoms, a cyclic aliphatic group having 3 to 20 carbon atoms, an aromatic group having 6 to 20 carbon atoms, and a group consisting of a combination thereof, and more preferred examples thereof include a group consisting of an aromatic group having 6 to 20 carbon atoms.

$R^{111}$ is preferably derived from a diamine. Examples of the diamine that is used for producing the polyimide precursor include a linear aliphatic or branched aliphatic diamine, a cyclic aliphatic diamine, or an aromatic diamine. One kind of diamine may be used alone, or two or more kinds thereof may be used.

Specifically, the diamine is preferably a diamine containing a linear or branched aliphatic group having 2 to 20 carbon atoms, a cyclic aliphatic group having 3 to 20 carbon atoms, an aromatic group having 6 to 20 carbon atoms, or a group consisting of a combination thereof, and more preferably a diamine containing a group consisting of an aromatic group having 6 to 20 carbon atoms. Examples of the aromatic group include the followings. In the following formulae, *'s each independently represent a bonding position to another structure.

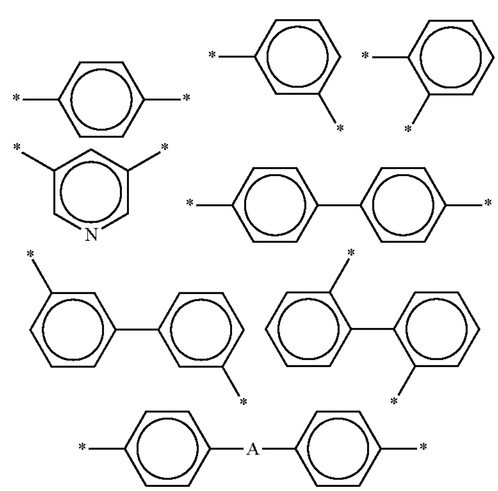

-continued

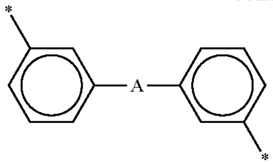

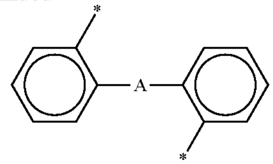

In the formulae, A is preferably a single bond or a group selected from the group consisting of an aliphatic hydrocarbon group having 1 to 10 carbon atoms, which may be substituted with a fluorine atom, —O—, —C(═O)—, —S—, —S(═O)$_2$—, —NHC(═O)—, and a group obtained by combining two or more thereof, more preferably a single bond or a group selected from the group consisting of an alkylene group having 1 to 3 carbon atoms, which may be substituted with a fluorine atom, —O—, —C(═O)—, —S—, and —S(═O)$_2$—, and still more preferably a group selected from the group consisting of —CH$_2$—, —O—, —S—, —S(═O)$_2$—, —C(CF$_3$)$_2$—, and —C(CH$_3$)$_2$—.

Specific examples of the diamine include at least one diamine selected from 1,2-diaminoethane, 1,2-diaminopropane, 1,3-diaminopropane, 1,4-diaminobutane, and 1,6-diaminohexane; 1,2- or 1,3-diaminocyclopentane, 1,2-, 1,3-, or 1,4-diaminocyclohexane, 1,2-, 1,3-, or 1,4-bis(aminomethyl)cyclohexane, bis-(4-aminocyclohexyl) methane, bis-(3-aminocyclohexyl) methane, 4,4'-diamino-3,3'-dimethylcyclohexylmethane, and isophorone diamine; meta or paraphenylene diamine, diaminotoluene, 4,4'- or 3,3'-diaminobiphenyl, 4,4'-diaminodiphenyl ether, 3,3-diaminodiphenyl ether, 4,4'- and 3,3'-diaminodiphenylmethane, 4,4'- or 3,3'-diaminodiphenyl sulfone, 4,4'- or 3,3'-diaminodiphenyl sulfide, 4,4'- or 3,3'-diaminobenzophenone, 3,3'-dimethyl-4,4'-diaminobiphenyl, 2,2'-dimethyl-4,4'-diaminobiphenyl, 3,3'-dimethoxy-4,4'-diaminobiphenyl, 2,2-bis(4-aminophenyl) propane, 2,2-bis(4-aminophenyl) hexafluoropropane, 2,2-bis(3-hydroxy-4-aminophenyl) propane, 2,2-bis(3-hydroxy-4-aminophenyl) hexafluoropropane, 2,2-bis(3-amino-4-hydroxyphenyl) propane, 2,2-bis (3-amino-4-hydroxyphenyl) hexafluoropropane, bis(3-amino-4-hydroxyphenyl) sulfone, bis(4-amino-3-hydroxyphenyl) sulfone, 4,4'-diaminoparaterphenyl, 4,4-bis (4-aminophenoxy) biphenyl, bis[4-(4-aminophenoxy) phenyl]sulfone, bis[4-(2-aminophenoxy)phenyl]sulfone, bis [4-(3-aminophenoxy)phenyl]sulfone, 1,4-bis(4-aminophenoxy)benzene, 9,10-bis(4-aminophenyl) anthracene, 3,3'-dimethyl-4,4'-diaminodiphenyl sulfone, 1,3-bis(4-aminophenoxy)benzene, 1,3-bis(4-aminophenyl)benzene, 1,3-bis(3-aminophenoxy)benzene, 3,3'-diethyl-4,4'-diaminodiphenylmethane, 3,3'-dimethyl-4,4'-diaminodiphenylmethane, 4,4'-diaminooctafluorobiphenyl, 2,2-bis[4-(4-aminophenoxy)phenyl]propane, 2,2-bis[4-(4-aminophenoxy) phenyl]hexafluoropropane, 9,9-bis(4-aminophenyl)-10-hydroanthracene, 3,3',4,4'-tetraaminobiphenyl, 3,3',4,4'-tetraaminodiphenyl ether, 1,4-diaminoanthraquinone, 1,5-diaminoanthraquinone, 3,3-dihydroxy-4,4'-diaminobiphenyl, 9,9'-bis(4-aminophenyl) fluorene, 4,4'-dimethyl-3,3'-diaminodiphenyl sulfone, 3,3',5,5'-tetramethyl-4,4'-diaminodiphenylmethane, 2,4- and, 2,5-diaminocumene, 2,5-dimethyl-paraphenylene diamine, acetoguanamine, 2,3,5,6-tetramethyl-paraphenylene diamine, 2,4,6-trimethyl-metaphenylene diamine, bis(3-aminopropyl)tetramethyl disiloxane, 2,7-diaminofluorene, 2,5-diaminopyridine, 1,2-bis(4-aminophenyl) ethane, diaminobenzanilide, esters of diaminobenzoic acid, 1,5-diaminonaphthalene, diaminobenzotrifluoride, 1,3-bis(4-aminophenyl) hexafluoropropane, 1,4-bis(4-aminophenyl) octafluorobutane, 1,5-bis(4-aminophenyl) decafluoropentane, 1,7-bis(4-aminophenyl)tetradecafluoroheptane, 2,2-bis[4-(3-aminophenoxy)phenyl] hexafluoropropane, 2,2-bis[4-(2-aminophenoxy)phenyl] hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl)phenyl]hexafluoropropane, parabis(4-amino-2-trifluoromethylphenoxy)benzene, 4,4'-bis(4-amino-2-trifluoromethylphenoxy) biphenyl, 4,4'-bis(4-amino-3-trifluoromethylphenoxy) biphenyl, 4,4'-bis (4-amino-2-trifluoromethylphenoxy)diphenyl sulfone, 4,4'-bis(3-amino-5-trifluoromethylphenoxy)diphenyl sulfone, 2,2-bis[4-(4-amino-3-trifluoromethylphenoxy)phenyl] hexafluoropropane, 3,3',5,5'-tetramethyl-4,4'-diaminobiphenyl, 4,4'-diamino-2,2'-bis(trifluoromethyl) biphenyl, 2,2',5,5',6,6'-hexafluorotolidine, or 4,4'-diaminoquaterphenyl.

In addition, diamines (DA-1) to (DA-18) shown below are also preferable.

(DA-1)

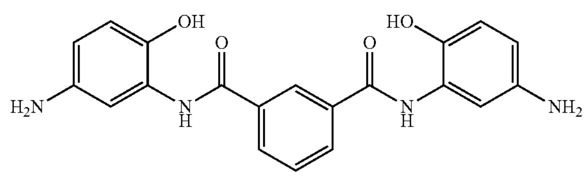

(DA-2)

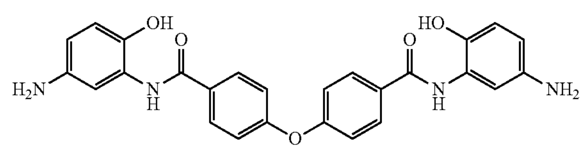

(DA-3)

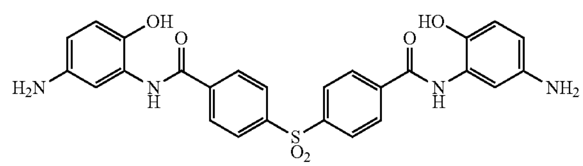

(DA-4)

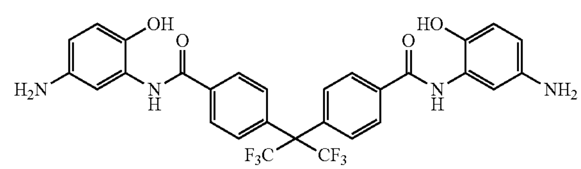

(DA-5)

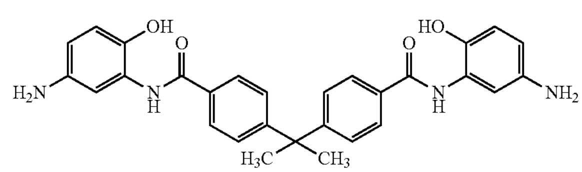

(DA-6)

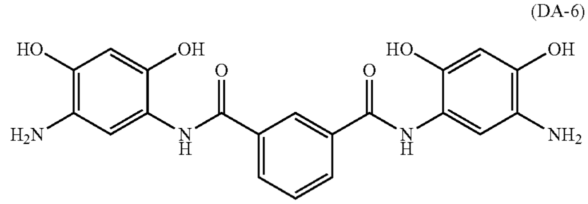

-continued (DA-7)

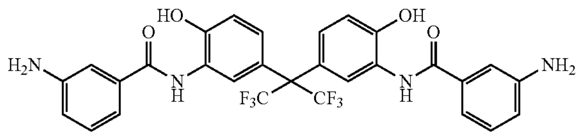

(DA-8)

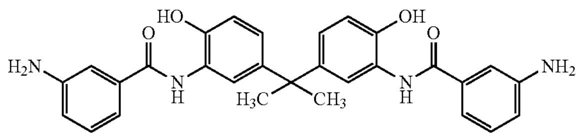

(DA-9)

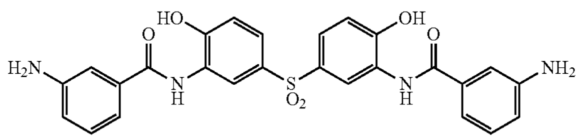

(DA-10)

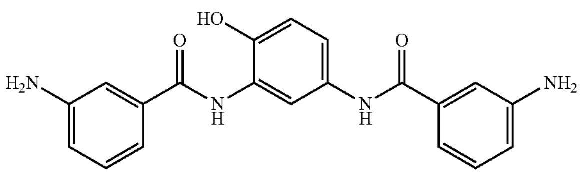

(DA-11)

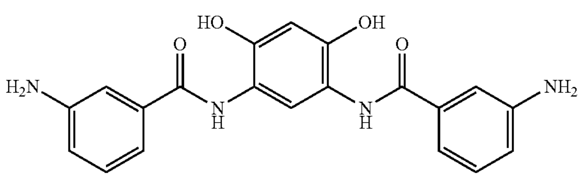

(DA-12)

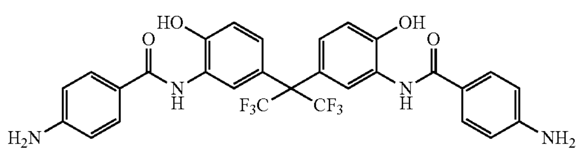

(DA-13)

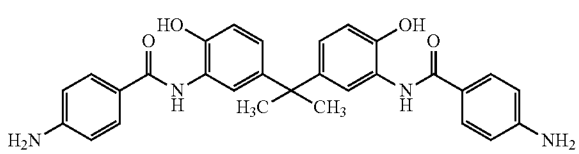

(DA-14)

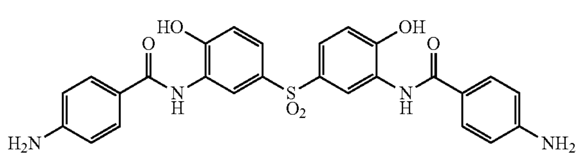

(DA-15)

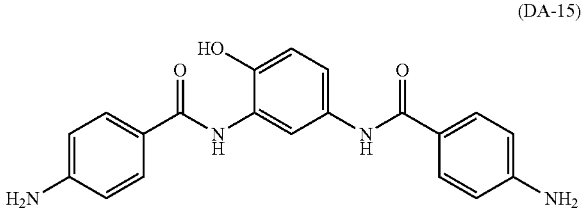

-continued (DA-16)

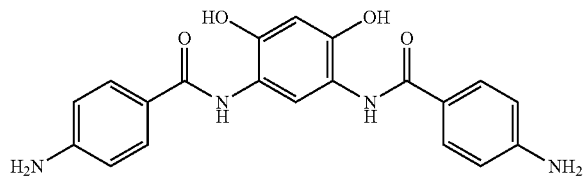

(DA-17)

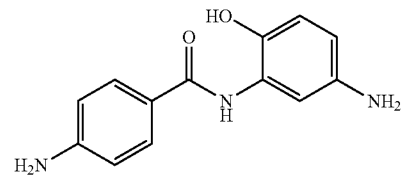

(DA-18)

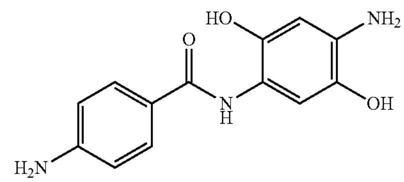

In addition, preferred examples of the diamine also include a diamine having at least two or more alkylene glycol units in the main chain. A diamine containing two or more ethylene glycol chains or/and propylene glycol chains in total in one molecule is preferable, and a diamine containing no aromatic ring is more preferable. Specific examples thereof include JEFFAMINE (registered trade mark) KH-511, JEFFAMINE (registered trade mark) ED-600, JEFFAMINE (registered trade mark) ED-900, JEFFAMINE (registered trade mark) ED-2003, JEFFAMINE (registered trade mark) EDR-148, JEFFAMINE (registered trade mark) EDR-176, D-200, D-400, D-2000, D-4000 (all trade names, manufactured by HUNTSMAN Corporation), 1-(2-(2-(2-aminopropoxy)ethoxy)propoxy)propane-2-amine, and 1-(1-(1-(2-aminopropoxy) propan-2-yl)oxy) propane-2-amine, which are not limited thereto.

Structures of JEFFAMINE (registered trade mark) KH-511, JEFFAMINE (registered trade mark) ED-600, JEFFAMINE (registered trade mark) ED-900, JEFFAMINE (registered trade mark) ED-2003, JEFFAMINE (registered trade mark) EDR-148, and JEFFAMINE (registered trade mark) EDR-176 are shown below.

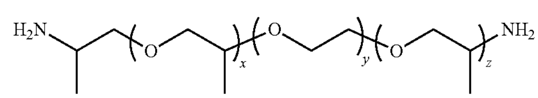

KH-511 (y=2. 0, x+z=1.2)
ED-600 (y=9. 0, x+z=3.6)
ED-900 (y=12. 5, x+z=6.0)
ED-2003 (y=39. 0, x+z=6.0)

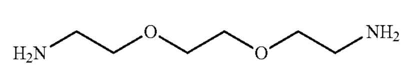

EDR-148

-continued

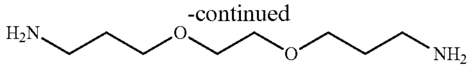

EDR-176

In the above, x, y, and z are arithmetic average values.

$R^{111}$ is preferably represented by —Ar-L-Ar— from the viewpoint of the flexibility of the obtained cured film. However, Ar's are each independently an aromatic group, and L is a group selected from the group consisting of an aliphatic hydrocarbon group having 1 to 10 carbon atoms, which may be substituted with a fluorine atom, —O—, —C(═O)—, —S—, —S(═O)$_2$— or —NHC(═O)—, and a group obtained by combining two or more thereof. Ar is preferably a phenylene group, and L is preferably an aliphatic hydrocarbon group having 1 or 2 carbon atoms, which may be substituted with a fluorine atom, —O—, —C(═O)—, —S—, or —S(═O)$_2$—. The aliphatic hydrocarbon group as L is preferably an alkylene group.

From the viewpoint of the i ray transmittance, $R^{111}$ is preferably a divalent organic group represented by Formula (51) or Formula (61) below. In particular, from the viewpoint of the i ray transmittance and ease of availability, a divalent organic group represented by Formula (61) is more preferable.

(51)

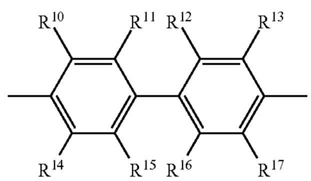

In Formula (51), $R^{10}$ to $R^{17}$ each independently represent a hydrogen atom, a fluorine atom, or a monovalent organic group, and at least one of $R^{10}$, . . . , or $R^{17}$ represents a fluorine atom, a methyl group, a fluoromethyl group, a difluoromethyl group, or a trifluoromethyl group.

Examples of the monovalent organic group as $R^{10}$ to $R^{17}$ include an unsubstituted alkyl group having 1 to 10 (preferably 1 to 6) carbon atoms and a fluorinated alkyl group having 1 to 10 (preferably 1 to 6) carbon atoms.

(61)

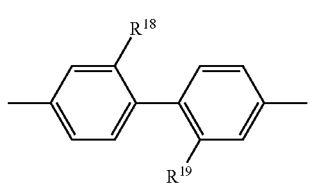

In Formula (61), $R^{18}$ and $R^{19}$ each independently represent a fluorine atom, a fluoromethyl group, a difluoromethyl group, or a trifluoromethyl group.

Examples of the diamine compound that provides a structure of Formula (51) or (61), dimethyl-4,4'-diaminobiphenyl, 2,2'-bis(trifluoromethyl)-4,4'-diaminobiphenyl, and 2,2'-bis(fluoro)-4,4'-diaminobiphenyl, 4,4'-diaminooctafluorobiphenyl. One kind among them may be used, or two or more kinds among them may be used in combination.

$R^{115}$ in Formula (2) represents a tetravalent organic group. The tetravalent organic group is preferably a tetravalent organic group containing an aromatic ring and more preferably a group represented by Formula (5) or Formula (6).

(5)

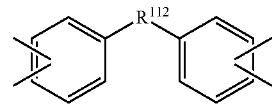

In Formula (5), $R^{112}$ is preferably a single bond or a group selected from the group consisting of an aliphatic hydrocarbon group having 1 to 10 carbon atoms, which may be substituted with a fluorine atom, —O—, —C(═O)—, —S—, —S(═O)$_2$—, —NHC(═O)—, and a group obtained by combining two or more thereof, more preferably a single bond or a group selected from the group consisting of an alkylene group having 1 to 3 carbon atoms, which may be substituted with a fluorine atom, —O—, —C(═O)—, —S—, and —S(═O)$_2$—, and still more preferably a group selected from the group consisting of —CH$_2$—, —C(CF$_3$)$_2$—, —C(CH$_3$)$_2$—, —O—, —C(═O)—, —S—, and —S(═O)$_2$—.

(6)

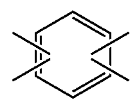

Specific examples of the tetravalent organic group represented by $R^{115}$ in Formula (2) include a tetracarboxylic acid residue that remains after removing an acid dianhydride group from tetracarboxylic acid dianhydride. One kind of tetracarboxylic acid dianhydride may be used alone, or two or more kinds thereof may be used. The tetracarboxylic acid dianhydride is preferably a compound represented by Formula (O).

(O)

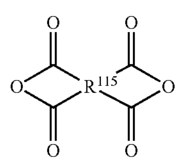

In Formula (O), $R^{115}$ represents a tetravalent organic group. $R^{115}$ is synonymous with $R^{115}$ in Formula (2).

Specific examples of the tetracarboxylic acid dianhydride include at least one selected from pyromellitic acid, pyromellitic acid dianhydride (PMDA), 3,3',4,4'-biphenyltetracarboxylic acid dianhydride, 3,3',4,4'-diphenylsulfide tetracarboxylic acid dianhydride, 3,3',4,4'-diphenylsulfone tetracarboxylic acid dianhydride, 3,3',4,4'-benzophenone tetracarboxylic acid dianhydride, 3,3',4,4'-diphenylmethane tetracarboxylic acid dianhydride, 2,2',3,3'-diphenylmethane tetracarboxylic acid dianhydride, 2,3,3',4'-biphenyltetracarboxylic acid dianhydride, 2,3,3',4'-benzophenone tetracarboxylic acid dianhydride, 4,4'-oxydiphthalic acid dianhydride, 2,3,6,7-naphthalene tetracarboxylic acid dianhydride, 1,4,5,7-naphthalene tetracarboxylic acid dianhydride, 2,2-bis(3,4-dicarboxyphenyl) propane dianhydride, 2,2-bis(2,3- dicarboxyphenyl) propane dianhydride, 2,2-bis(3,4-dicarboxyphenyl) hexafluoropropane dianhydride, 1,3-diphenylhexafluoropropane-3,3,4,4-tetracarboxylic acid dianhydride, 1,4,5,6-naphthalene tetracarboxylic acid dianhydride, 2,2',3,3'-diphenyl tetracarboxylic acid dianhydride, 3,4,9,10-perylene tetracarboxylic acid dianhydride, 1,2,4,5-naphthalene tetracarboxylic acid dianhydride, 1,4,5,8-naphthalene tetracarboxylic acid dianhydride, 1,8,9,10-phenanthrene tetracarboxylic acid dianhydride, 1,1-bis(2,3-dicarboxyphenyl) ethane dianhydride, 1,1-bis(3,4-dicarboxyphenyl) ethane dianhydride, 1,2,3,4-benzene tetracarboxylic acid dianhydride, and/or alkyl derivatives having 1 to 6 carbon atoms and alkoxy derivatives having 1 to 6 carbon atoms thereof.

In addition, preferred examples thereof include tetracarboxylic acid dianhydrides (DAA-1) to (DAA-5) shown below.

(DAA-1)

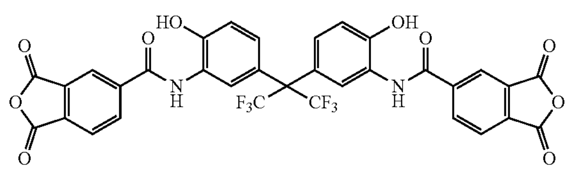

(DAA-2)

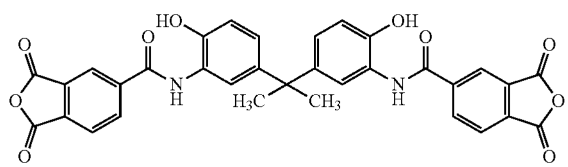

(DAA-3)

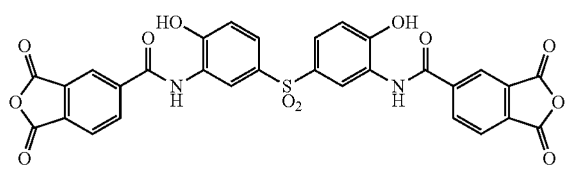

(DAA-4)

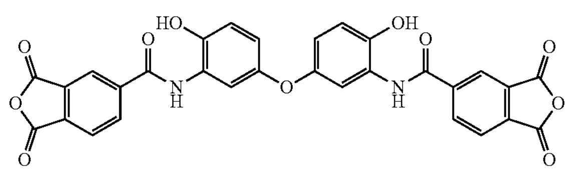

(DAA-5)

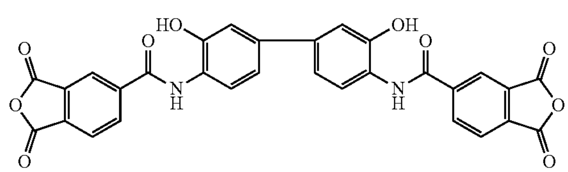

$R^{113}$ and $R^{114}$ each independently represent a hydrogen atom or a monovalent organic group, it is preferable that at least one of $R^{113}$ or $R^{114}$ contains a radically polymerizable group, and it is more preferable that both $R^{113}$ and $R^{114}$ contain a radically polymerizable group. The radically polymerizable group is a group capable of undergoing a crosslinking reaction by an action of a radical, and preferred examples thereof include a group having an ethylenically unsaturated bond.

Examples of the group having an ethylenically unsaturated bond include a vinyl group, a (meth)allyl group, and a group represented by Formula (III).

(III)

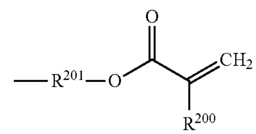

In Formula (III), $R^{200}$ represents a hydrogen atom or a methyl group and is preferably a methyl group.

In Formula (III), $R^{201}$ represents an alkylene group having 2 to 12 carbon atoms, —$CH_2CH(OH)$ $CH_2$—, or a polyoxyalkylene group having 4 to 30 carbon atoms.

Suitable examples of $R^{201}$ include an ethylene group, a propylene group, a trimethylene group, a tetramethylene group, a 1,2-butanediyl group, a 1,3-butanediyl group, a pentamethylene group, a hexamethylene group, an octamethylene group, a dodecamethylene group, and —$CH_2CH$ (OH) $CH_2$—, and preferred examples thereof include an ethylene group, a propylene group, a trimethylene group, and —$CH_2CH(OH)$ $CH_2$—.

Particularly preferably, $R^{200}$ is a methyl group, and $R^{201}$ is an ethylene group.

As the monovalent organic group represented by $R^{113}$ or $R^{114}$, a substituent that improves the solubility of a developer is preferably used.

From the viewpoint of solubility in an aqueous developer, $R^{113}$ or $R^{114}$ may be a hydrogen atom or a monovalent organic group. Examples of the monovalent organic group include an aromatic group and an aralkyl group, which have one, two, or three, preferably one acidic group bonded to a carbon constituting an aryl group. Specific examples thereof include an aromatic group having 6 to 20 carbon atoms, which has an acidic group, and an aralkyl group having 7 to 25 carbon atoms, which has an acidic group. More specific examples thereof include a phenyl group having an acidic group and a benzyl group having an acidic group. The acidic group is preferably an OH group.

$R^{113}$ or $R^{114}$ is more preferably a hydrogen atom, 2-hydroxybenzyl, 3-hydroxybenzyl, or 4-hydroxybenzyl, from the viewpoint of solubility in an aqueous developer.

From the viewpoint of solubility in an organic solvent, $R^{113}$ or $R^{114}$ is preferably a monovalent organic group. The monovalent organic group is preferably a linear or branched alkyl group, a cyclic alkyl group, or an aromatic group, and more preferably an alkyl group substituted with an aromatic group.

The alkyl group preferably has 1 to 30 carbon atoms. The alkyl group may be linear, branched, or cyclic. Examples of the linear or branched alkyl group include a methyl group, an ethyl group, a propyl group, a butyl group, a pentyl group, a hexyl group, a heptyl group, an octyl group, a nonyl group, a decyl group, a dodecyl group, a tetradecyl group, an octadecyl group, an isopropyl group, an isobutyl group, a sec-butyl group, a t-butyl group, a 1-ethylpentyl group, and a 2-ethylhexyl group. The cyclic alkyl group may be a monocyclic cyclic alkyl group or a polycyclic cyclic alkyl group. Examples of the monocyclic cyclic alkyl group include a cyclopropyl group, a cyclobutyl group, a cyclopentyl group, a cyclohexyl group, a cycloheptyl group, and a cyclooctyl group. Examples of the polycyclic cyclic alkyl group include an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group. Among them, the cyclohexyl group is most preferable from the viewpoint of compatibility with high sensitivity. In addition, the alkyl group substituted with an aromatic group is preferably a linear alkyl group substituted with an aromatic group, which will be as described later.

Specifically, the aromatic group is a substituted or unsubstituted benzene ring, a naphthalene ring, a pentalene ring, an indene ring, an azulene ring, a heptalene ring, an indacene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, or a phenazine ring. A benzene ring is most preferable.

In Formula (2), in a case where $R^{113}$ is a hydrogen atom, or in a case where $R^{114}$ is a hydrogen atom, the polyimide precursor may form a salt together with a tertiary amine compound having an ethylenically unsaturated bond. Examples of the tertiary amine compound having such an ethylenically unsaturated bond include N,N-dimethylaminopropyl methacrylate.

In addition, the polyimide precursor preferably has a fluorine atom in the structure thereof. The content of fluorine atoms in the polyimide precursor is preferably 1% by mass or more and preferably 20% by mass or lower.

Further, for the intended purpose of improving adhesiveness to a base material, a diamine having an aliphatic group having a siloxane structure may be used as a monomer for producing the polyimide precursor. Specific examples of the diamine having an aliphatic group having a siloxane structure include bis(3-aminopropyl)tetramethyl disiloxane and bis(paraaminophenyl) octamethyl pentasiloxane.

The repeating unit represented by Formula (2) is preferably a repeating unit represented by Formula (2-A). That is, at least one polyimide precursor that is used in the present invention is preferably a precursor having a repeating unit represented by Formula (2-A). In a case where such a structure is adopted, the width of the exposure latitude can be further widened.

(2-A)

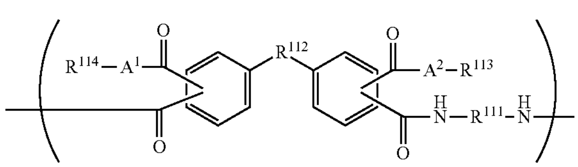

In Formula (2-A), $A^1$ and $A^2$ represent an oxygen atom, $R^{111}$ and $R^{112}$ each independently represent a divalent organic group, $R^{113}$ and $R^{114}$ each independently represent a hydrogen atom or a monovalent organic group, and at least one of $R^{113}$ or $R^{114}$ is a group containing a polymerizable group and is preferably a polymerizable group.

$A^1$, $A^2$, $R^{111}$, $R^{113}$, and $R^{114}$ are each independently synonymous with $A^1$, $A^2$, $R^{111}$, R 113, and $R^{114}$ in Formula (2), and the same applies to the preferred range.

$R^{112}$ is synonymous with $R^{112}$ in Formula (5), and the same applies to the preferred range.

The polyimide precursor may contain one kind of repeating unit represented by Formula (2) alone or may contain two or more kinds thereof. In addition, the polyimide precursor may contain structural isomers of the repeating unit represented by Formula (2). In addition, the polyimide precursor may also contain another kind of repeating unit in addition to the repeating unit represented by Formula (2) described above.

As one embodiment of the polyimide precursor in the present invention, a polyimide precursor in which the repeating unit represented by Formula (2) accounts for 50% by mole or more, further 70% by mole or more, and particularly 90% by mole or more in the entirety of the repeating units is exemplified.

In the present specification, in a case where the content of the "repeating unit" is specified in terms of % by mole, the "repeating unit" is synonymous with the "monomer unit".

The weight-average molecular weight (Mw) of the polyimide precursor is preferably 2,000 to 500,000, more preferably 5,000 to 100,000, and still more preferably 10,000 to 50,000. In addition, the number-average molecular weight (Mn) thereof is preferably 800 to 250,000, more preferably 2,000 to 50,000, and still more preferably 4,000 to 25,000.

The degree of variance of molecular weight (weight-average molecular weight/number-average molecular weight) is preferably 1.5 to 2.5.

The polyimide precursor is obtained by reacting a dicarboxylic acid or a dicarboxylic acid derivative with a diamine. Preferably, the polyimide precursor is obtained by halogenating a dicarboxylic acid or a dicarboxylic acid derivative with a halogenating agent and then causing the resultant to be reacted with a diamine.

In the method of producing the polyimide precursor, it is preferable to use an organic solvent as a reaction solvent. The organic solvent may be used alone or in a combination of two or more organic solvents.

The kind of organic solvent to be used can be appropriately selected depending on raw materials, and examples thereof include pyridine, diethylene glycol dimethyl ether (diglyme), N-methylpyrrolidone, and N-ethylpyrrolidone.

In a case of producing a polyimide precursor, a terminal of the precursor is preferably sealed with a terminal sealing agent such as an acid dianhydride, a monocarboxylic acid, a monoacid chloride compound, or a monofunctional ester compound in order to further improve storage stability. Among these, a monoamine can be preferably used, and examples of the preferred monoamine compound include aniline, 2-ethynyl aniline, 3-ethynyl aniline, 4-ethynyl aniline, 5-amino-8-hydroxyquinoline, 1-hydroxy-7-aminonaphthalene, 1-hydroxy-6-aminonaphthalene, 1-hydroxy-5-aminonaphthalene, 2-hydroxy-7-aminonaphthalene, 1-hydroxy-4-aminonaphthalene, 2-hydroxy-5-aminonaphthalene, 2-hydroxy-6-aminonaphthalene, 1-carboxy-6-aminonaphthalene, 1-carboxy-7-aminonaphthalene, 2-carboxy-7-aminonaphthalene, 1-carboxy-5-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more of these may be used, and a plurality of different terminal groups may be introduced by reacting a plurality of terminal sealing agents.

In a case of producing a polyimide precursor, a step of depositing a solid may be included. Specifically, the polyimide precursor in the reaction solution is precipitated in water and dissolved in a solvent in which the polyimide precursor such as a tetrahydrofuran or the like can be solubilized, and then the solid can be deposited.

Then, the polyimide precursor can be dried to obtain a powdery polyimide precursor.

[Polybenzoxazole Precursor]

The polybenzoxazole precursor that is used in the present invention preferably contains a repeating unit represented by Formula (3).

(3)

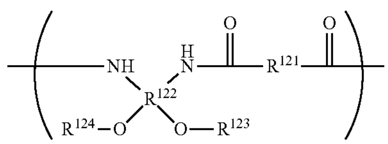

In Formula (3), $R^{121}$ represents a divalent organic group, $R^{122}$ represents a tetravalent organic group, and $R^{123}$ and $R^{124}$ each independently represent a hydrogen atom or a monovalent organic group.

In Formula (3), $R^{121}$ represents a divalent organic group. The divalent organic group is preferably a group containing at least one of an aliphatic group or aromatic group. The aliphatic group is preferably a linear aliphatic group.

In Formula (3), $R^{122}$ represents a tetravalent organic group. The tetravalent organic group is synonymous with $R^{115}$ in Formula (2) described above, and the same applies to the preferred range.

The polybenzoxazole precursor may contain another kind of repeating unit in addition to the repeating unit of Formula (3).

From the viewpoint that occurrence of warping of a cured film due to ring closure can be suppressed, the precursor preferably contains a diamine residue represented by Formula (SL) as another kind of repeating unit.

(SL)

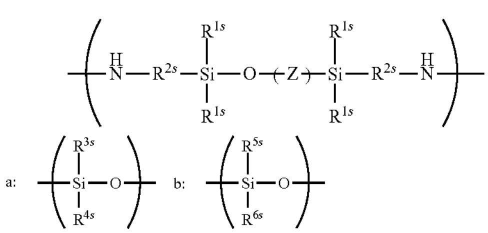

In Formula (SL), Z has an a structure and a b structure, $R^{1s}$ is a hydrogen atom or a hydrocarbon group having 1 to 10 carbon atoms, $R^{2s}$ is a hydrocarbon group having 1 to 10 carbon atoms, and at least one of $R^{3s}$, $R^{4s}$, $R^{5s}$, or $R^{6s}$ is an aromatic group, where the rest are a hydrogen atom or an organic group having 1 to 30 carbon atoms and may be the same or different from each other. The polymerization of the a structure and the b structure may be block polymerization or random polymerization. Regarding the contents of the structures in the Z portion in terms of "% by mole", the content of the a structure is 5% to 95% by mole and the content of the b structure is 95% to 5% by mole, the sum of which is 100% by mole.

In Formula (SL), examples of the preferred Z include one in which $R^{5s}$ and $R^{6s}$ in the b structure are a phenyl group. In addition, the molecular weight of the a structure represented by Formula (SL) is preferably 400 to 4,000 and more preferably 500 to 3,000. The molecular weight can be determined by gel permeation chromatography, which is generally used. In a case where the molecular weight is within the above-described range, it is possible to decrease a modulus of elasticity of a polybenzoxazole precursor after the dehydration ring closure and to achieve both effects of suppressing warping of a film and improving solubility.

In a case where a diamine residue represented by Formula (SL) is contained as another kind of repeating unit, from the viewpoint of improving alkaline solubility, it is preferable that a tetracarboxylic acid residue that remains after removing an acid dianhydride group from the tetracarboxylic acid dianhydride is further contained as a repeating unit. Examples of such a tetracarboxylic acid residue include the examples of $R^{115}$ in Formula (2).

The weight-average molecular weight (Mw) of the polybenzoxazole precursor is preferably 2,000 to 500,000, more preferably 5,000 to 100,000, and still more preferably 10,000 to 50,000. In addition, the number-average molecular weight (Mn) thereof is preferably 800 to 250,000, more preferably 2,000 to 50,000, and still more preferably 4,000 to 25,000.

The degree of variance of molecular weight (weight-average molecular weight/number-average molecular weight) is preferably 1.5 to 2.5.

In the photosensitive resin composition according to the embodiment of the present invention, the content of the specific precursor is preferably 20% to 100% by mass, more preferably 50% to 99% by mass, still more preferably 60% to 98% by mass, and particularly preferably 70% to 95% by mass, with respect to the total solid content of the photosensitive resin composition.

The photosensitive resin composition according to the embodiment of the present invention may contain only one kind of specific precursor or may contain two or more kinds thereof. In a case where two or more kinds thereof are contained, the total amount thereof is preferably within the above-described range.

<Onium Salt>

The photosensitive resin composition according to the embodiment of the present invention contains an onium salt. In a case where the photosensitive resin composition of the present invention contains an onium salt, the exposure energy consumption can be suppressed, the exposure latitude can be extended, and further, the ring closure reaction can be promoted at the time of carrying out a heating step of carrying out the ring closure reaction of the specific precursor, the ring closure rate tends to be further improved.

The photosensitive resin composition according to the embodiment of the present invention preferably contains, as the onium salt, a compound that is not decomposed by heating at 180° C., more preferably a compound that is not decomposed by heating at 190° C., and still more preferably a compound that is not decomposed by heating at 200° C.

In a case where an onium salt is heated to 250° C. at 5° C./min in a pressure-resistant capsule, a peak temperature of the exothermic peak having the lowest temperature is read, and the peak temperature is higher than a temperature A, it can be determined that the onium salt compound is not decomposed by the heating at the temperature A.

Further, the photosensitive resin composition according to the embodiment of the present invention can preferably contain, as the onium salt, a compound that is not decomposed by irradiation with light having a wavelength of 365 nm (the i ray), a wavelength of 248 nm (the KrF ray), or a wavelength of 193 nm (the ArF ray).

Whether or not the onium salt is decomposed by irradiation with light of a specific wavelength is determined by the following method.

A photosensitive resin composition is applied onto glass and dried by heating at 100° C. for 1 minute. The amount of the photosensitive resin composition applied is such that the film thickness after drying is 700 nm. Then, exposure is carried out with an exposure dose of 100 mJ/cm$^2$ using light having a specific wavelength. After the exposure, the base material heated at 100° C. for 1 minute is immersed in a solution of methanol/THF=50/50 (mass ratio) for 10 minutes while applying ultrasonic waves. An extract extracted into the above solution is analyzed by high performance liquid chromatography (HPLC), and then the decomposition rate of the onium salt is calculated according to the following expression. Decomposition rate of onium salt (%)=amount of decomposition product (mol)/amount of onium salt (mol) contained in photosensitive resin composition before exposure×100

In a case where a decomposition rate of an onium salt is 20% or less, it is determined that the onium salt is a compound that is not decomposed in a case of being irradiated with light having a specific wavelength. The decomposition rate is preferably 10% or less, more preferably 5% or less, and still more preferably 1% or less. The lower limit of the decomposition rate is not particularly limited and may be 0%.

The kind of onium salt is not particularly specified; however, preferred examples thereof include an ammonium salt, an iminium salt, a sulfonium salt, an iodonium salt, and a phosphonium salt.

Among these, an ammonium salt or an iminium salt, which is excellent in thermal stability at room temperature, is preferable from the viewpoint of the heat stability of the photosensitive resin composition, and a sulfonium salt, an iodonium salt, or a phosphonium salt is preferable from the viewpoint of compatibility with a polymer.

Further, the onium salt is a salt of a cation having an onium structure and an anion, and the cation and the anion may be or may not be bonded through a covalent bond.

That is, the onium salt may be an intramolecular salt having a cation moiety and an anion moiety in the same molecular structure or may be an intermolecular salt in which a cation molecule and an anion molecule, which are separate molecules, are ionically bonded; however, an intermolecular salt is preferred. Further, in the photosensitive resin composition according to the embodiment of the present invention, the cation moiety or the cation molecule and the anion moiety or the anion molecule may be bonded by the ionic bonding or be dissociated from each other.

The cation in the onium salt is preferably an ammonium cation, a pyridinium cation, a sulfonium cation, an iodonium cation, or a phosphonium cation, and more preferably at least one cation selected from the group consisting of a tetraalkylammonium cation, a sulfonium cation, and an iodonium cation.

[Ammonium Salt]

In the present invention, the ammonium salt means a salt of an ammonium cation and an anion.

Ammonium Cation

The ammonium cation is preferably a quaternary ammonium cation.

In addition, the ammonium cation is preferably a cation represented by Formula (101).

(101)

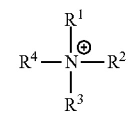

In Formula (101), R$^1$ to R$^4$ each independently represent a hydrogen atom or a hydrocarbon group, and at least two of R$^1$ to R$^4$ may be each bonded to form a ring.

In Formula (101), R$^1$ to R$^4$ are each independently preferably a hydrocarbon group, more preferably an alkyl group or an aryl group, and still more preferably an alkyl group having 1 to 10 carbon atoms or an aryl group having 6 to 12 carbon atoms. R$^1$ to R$^4$ may have a substituent, and examples of the substituent include a hydroxy group, an aryl group, an alkoxy group, an aryloxy group, an arylcarbonyl group, an alkylcarbonyl group, an alkoxycarbonyl group, an aryloxycarbonyl group, and an acyloxy group.

In a case where at least two of R$^1$ to R$^4$ are each bonded to form a ring, the ring may contain a hetero atom. Examples of the hetero atom include a nitrogen atom.

The ammonium cation is preferably represented by any one of Formula (Y1-1) or Formula (Y1-2).

(Y1-1)

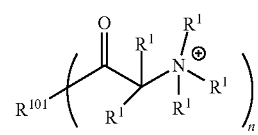

(Y1-2)

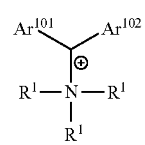

In Formulae (Y1-1) and (Y1-2), R$^{101}$ represents an n-valent organic group, R$^1$ is synonymous with R$^1$ in Formula (101), Ar$^{101}$ and Ar$^{102}$ each independently represent an aryl group, and n represents an integer of 1 or more.

In Formula (Y1-1), R$^{101}$ is preferably a group obtained by removing n pieces of hydrogen atoms from an aliphatic hydrocarbon or an aromatic hydrocarbon, or from a structure in which the aliphatic hydrocarbon is bonded to the aromatic hydrocarbon, and more preferably a group obtained by removing n pieces of hydrogen atoms from a saturated aliphatic hydrocarbon having 2 to 30 carbon atoms, benzene, or naphthalene.

In Formula (Y1-1), n is preferably 1 to 4, more preferably 1 or 2, and still more preferably 1.

In Formula (Y1-2), Ar$^{101}$ and Ar$^{102}$ are each independently preferably a phenyl group or a naphthyl group and more preferably a phenyl group.

Anion

The anion in the ammonium salt is preferably an anion selected from a carboxylate anion, a phenol anion, a phosphate anion, or a sulfate anion, and more preferably a carboxylate anion since both the stability and thermal decomposability of the salt can be achieved. That is, the ammonium salt is more preferably a salt of an ammonium cation and a carboxylate anion.

The carboxylate anion is preferably a divalent or more high-valent carboxylate anion having two or more carboxy groups and more preferably a divalent carboxylate anion. According to this aspect, it is possible to obtain a thermal base generator capable of further improving the stability, curability, and developability of the photosensitive resin composition. In particular, in a case where a divalent carboxylate anion is used, the stability, curability, and developability of the photosensitive resin composition can be further improved. The carboxylate anion is preferably represented by Formula (X1).

(X1)

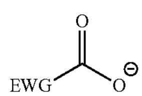

In Formula (X1), EWG represents an electron-withdrawing group.

In the present embodiment, the electron-withdrawing group means a group of which the Hammett's substituent constant σm is a positive value. The σm is described in detail in a review article by TSUNO Yuho, in Journal of Synthetic Organic Chemistry, Japan, Vol. 23, No. 8, p. 631 to 642 (1965). The electron-withdrawing group in the present embodiment is not limited to the substituents described in the above document.

Examples of the substituent of which the σm is a positive value include a $CF_3$ group (σm=0.43), a $CF_3C(=O)$ group (σm=0.63), a HC≡C group (σm=0.21), a $CH_2$=CH group (σm=0.06), a Ac group (σm=0.38), a MeOC(=O) group (σm=0.37), a MeC(=O) CH=CH group (σm=0.21), a PhC(=O) group (σm=0.34), and a $H_2NC(=O)\ CH_2$ group (σm=0.06). Here, Me represents a methyl group, Ac represents an acetyl group, and Ph represents a phenyl group (hereinafter, the same applies).

The EWG is preferably a group represented by Formulae (EWG-1) to (EWG-6).

(EWG-1)

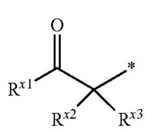

(EWG-2)

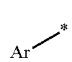

(EWG-3)

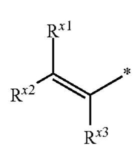

(EWG-4)

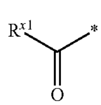

(EWG-5)

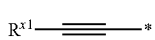

-continued (EWG-6)

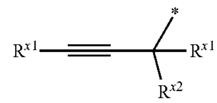

In Formulae (EWG-1) to (EWG-6), $R^{x1}$ to $R^{x3}$ each independently represent a hydrogen atom, an alkyl group, an alkenyl group, an aryl group, a hydroxy group, or a carboxy group, and Ar represents an aromatic group.

In the present invention, the carboxylate anion is preferably represented by Formula (XA).

(XA)

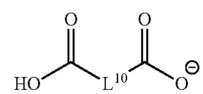

In Formula (XA), $L^{10}$ represents a single bond or a divalent linking group selected from the group consisting of an alkylene group, an alkenylene group, an aromatic group, $-NR^X-$, and a combination thereof, and $R^X$ represent a hydrogen atom, an alkyl group, an alkenyl group, or an aryl group.

Specific examples of the carboxylate anion include a maleate anion, a phthalate anion, an N-phenyliminodiacetate anion, and an oxalate anion.

From the viewpoint that the cyclization of the specific precursor is easily carried out at a low temperature and the storage stability of the photosensitive resin composition is easily improved, in the present invention, the onium salt contains an ammonium cation as a cation, and the onium salt preferably contains an anion of which the conjugate acid has a pKa of 2.5 or less and more preferably has a pKa of 1.8 or less, as an anion.

The lower limit of the pKa is not particularly limited; however, it is preferably −3 or more and more preferably −2 or more, from the viewpoint that the generated base is not easily neutralized and the cyclization efficiency of the specific precursor or the like is improved.

Regarding the pKa, values described in Determination of Organic Structures by Physical Methods (authors: Brown, H. C., McDaniel, D. H., Hafliger, O., Nachod, F. C.; editors: Braude, E. A., Nachod, F. C.; Academic Press, New York, 1955) or Data for Biochemical Research (authors: Dawson, R. M. C. et al; Oxford, Clarendon Press, 1959) can be referred to. Regarding compounds not described in these documents, values calculated from the structural formulae by using software of ACD/pKa (manufactured by ACD/Labs) are used.

Specific examples of the ammonium salt include compounds shown below; however, the present invention is not limited thereto.

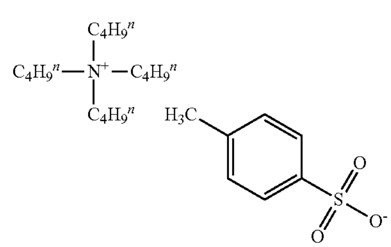

-continued

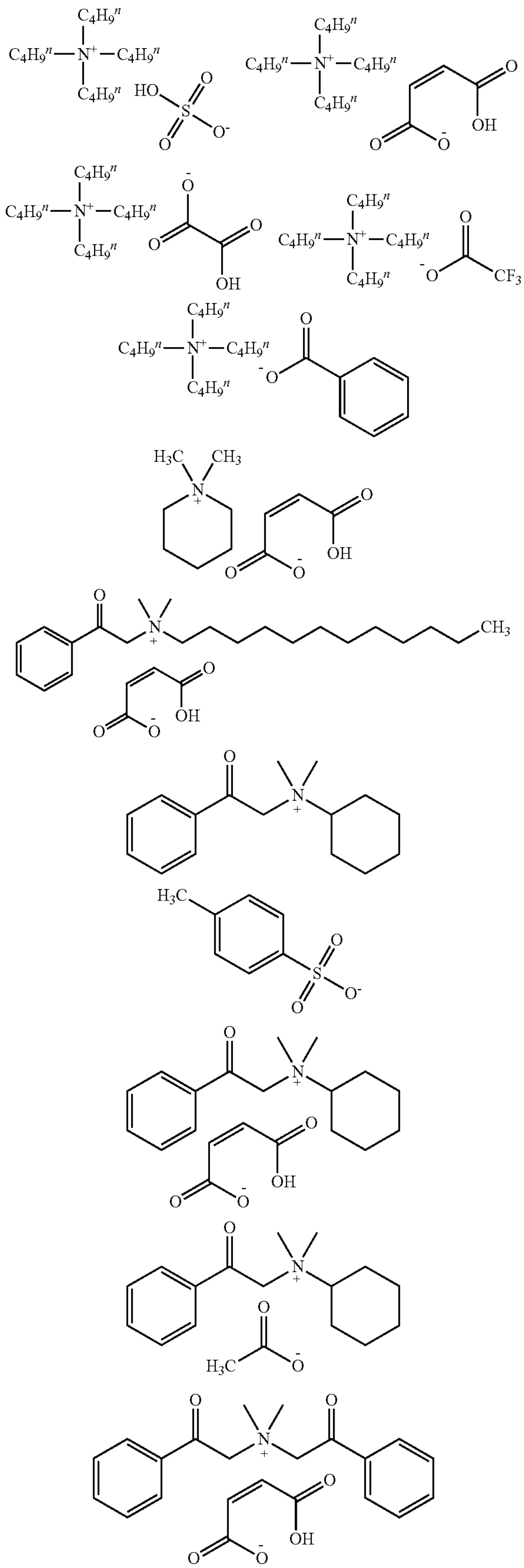

[Iminium Salt]

In the present invention, the iminium salt means a salt of an iminium cation and an anion. Examples of the anion include the same anions as those in the ammonium salt described above, and the same applies to the preferred aspect.

Iminium Cation

The iminium cation is preferably a pyridinium cation.

In addition, the iminium cation is also preferably a cation represented by Formula (102).

(102)

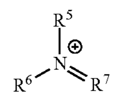

In Formula (102), $R^5$ and $R^6$ each independently represent a hydrogen atom or a hydrocarbon group, $R^7$ represents a hydrocarbon group, and at least two of $R^5$ to $R^7$ may be each bonded to form a ring.

In Formula (102), $R^5$ and $R^6$ are synonymous with $R^1$ to $R^4$ in Formula (101) described above, and the same applies to the preferred aspect.

In Formula (102), $R^7$ is preferably bonded to at least one of $R^5$ or $R^6$ to form a ring. The ring may contain a hetero atom. Examples of the hetero atom include a nitrogen atom. In addition, the ring is preferably a pyridine ring.

The iminium cation is preferably an iminium cation represented by any one of Formulae (Y1-3) to (Y1-5).

(Y1-3)

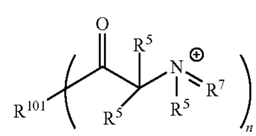

(Y1-4)

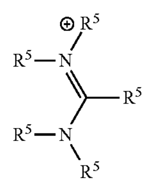

(Y1-5)

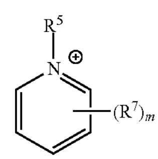

In Formulae (Y1-3) to (Y1-5), $R^{101}$ represents an n-valent organic group, $R^5$ is synonymous with $R^5$ in Formula (102), $R^7$ is synonymous with $R^7$ in Formula (102), and n and m represent integers of 1 or more.

In Formula (Y1-3), $R^{101}$ is preferably a group obtained by removing n pieces of hydrogen atoms from an aliphatic hydrocarbon, an aromatic hydrocarbon, or from a structure in which the aliphatic hydrocarbon is bonded to the aromatic hydrocarbon, and more preferably a group obtained by removing n pieces of hydrogen atoms from a saturated aliphatic hydrocarbon having 2 to 30 carbon atoms, benzene, or naphthalene.

In Formula (Y1-3), n is preferably 1 to 4, more preferably 1 or 2, and still more preferably 1.

In Formula (Y1-5), m is preferably 1 to 4, more preferably 1 or 2, and still more preferably 1.

Specific examples of the iminium salt include compounds shown below; however, the present invention is not limited thereto.

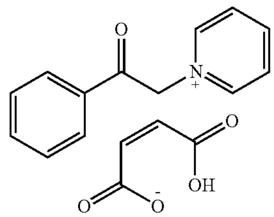

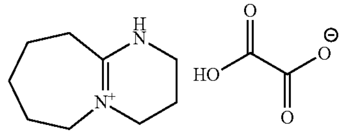

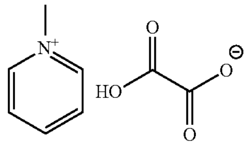

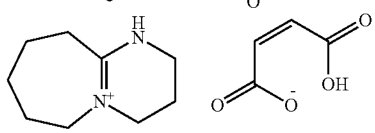

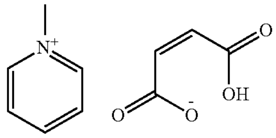

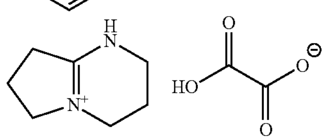

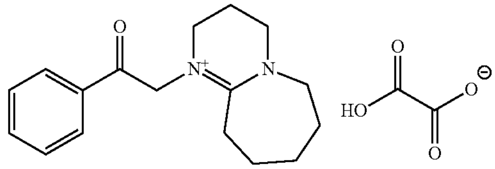

[Sulfonium Salt]

In the present invention, the sulfonium salt means a salt of a sulfonium cation and an anion. Examples of the anion include the same anions as those in the ammonium salt described above, and the same applies to the preferred aspect.

Sulfonium cation

The sulfonium cation is preferably a tertiary sulfonium cation and more preferably a triaryl sulfonium cation.

In addition, the sulfonium cation is preferably a cation represented by Formula (103).

(103)

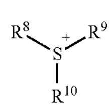

In Formula (103), $R^8$ to $R^{10}$ each independently represent a hydrocarbon group.

$R^8$ to $R^{10}$ are each independently preferably an alkyl group or an aryl group, more preferably an alkyl group having 1 to 10 carbon atoms or an aryl group having 6 to 12 carbon atoms, still more preferably an aryl group having 6 to 12 carbon atoms, and even still more preferably a phenyl group.

$R^8$ to $R^{10}$ may have a substituent, and examples of the substituent include a hydroxy group, an aryl group, an alkoxy group, an aryloxy group, an arylcarbonyl group, an alkylcarbonyl group, an alkoxycarbonyl group, an aryloxycarbonyl group, and an acyloxy group. Among these, $R^8$ to $R^{10}$ preferably have an alkyl group or an alkoxy group as the substituent, more preferably has a branched alkyl group or an alkoxy group, and still more preferably has a branched alkyl group having 3 to 10 carbon atoms or an alkyl group having 1 to 10 carbon atoms.

$R^8$ to $R^{10}$ may be the same group or different groups; however, from the viewpoint of synthesis compatibility, $R^8$ to $R^{10}$ are preferably the same group.

Specific examples of the sulfonium salt include compounds shown below; however, the present invention is not limited thereto.

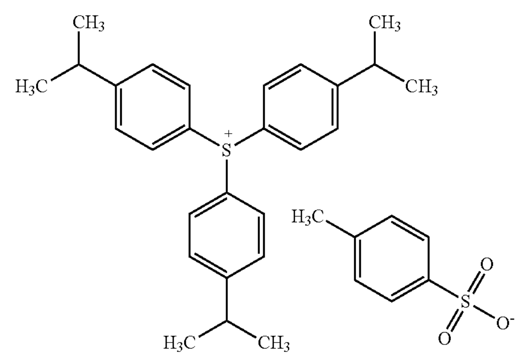

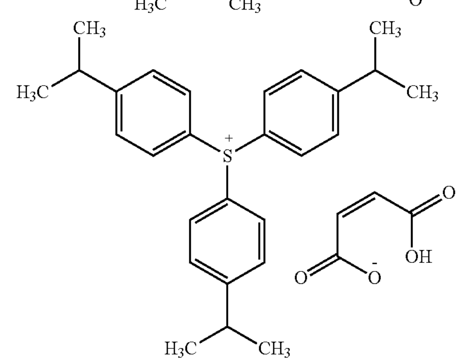

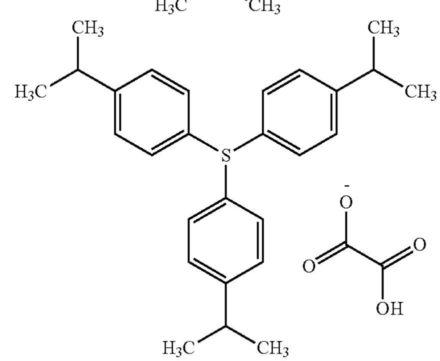

-continued

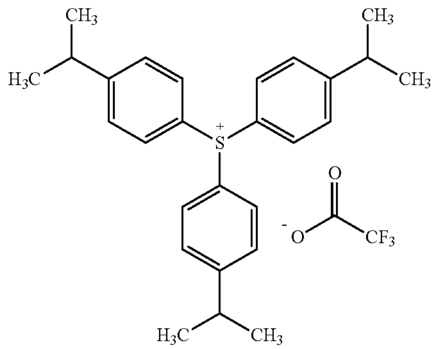

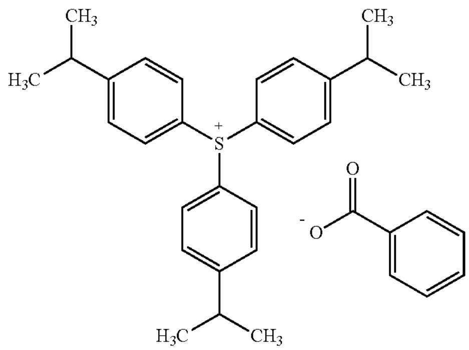

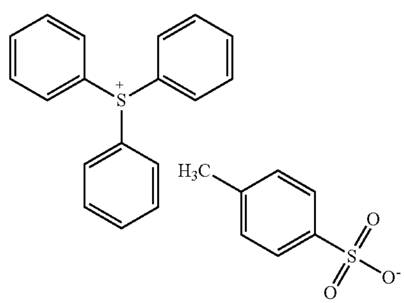

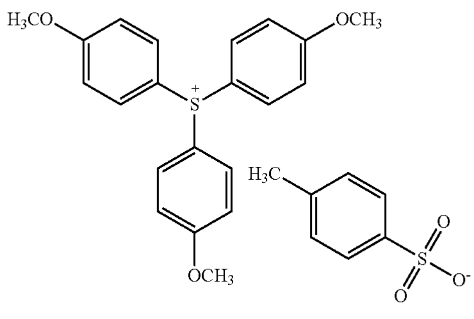

[Iodonium Salt]

In the present invention, the iodonium salt means a salt of an iodonium cation and an anion. Examples of the anion include the same anions as those in the ammonium salt described above, and the same applies to the preferred aspect.

Iodonium Cation

The iodonium cation is preferably a diaryl iodonium cation.

In addition, the iodonium cation is preferably a cation represented by Formula (104).

$$R^{11}-\overset{+}{I}-R^{12} \tag{104}$$

In Formula (104), $R^{11}$ and $R^{12}$ each independently represent a hydrocarbon group.

$R^{11}$ and $R^{12}$ are each independently preferably an alkyl group or an aryl group, more preferably an alkyl group having 1 to 10 carbon atoms or an aryl group having 6 to 12 carbon atoms, still more preferably an aryl group having 6 to 12 carbon atoms, and even still more preferably a phenyl group.

$R^{11}$ and $R^{12}$ may have a substituent, and examples of the substituent include a hydroxy group, an aryl group, an alkoxy group, an aryloxy group, an arylcarbonyl group, an alkylcarbonyl group, an alkoxycarbonyl group, an aryloxycarbonyl group, and an acyloxy group. Among these, $R^{11}$ and $R^{12}$ preferably have an alkyl group or an alkoxy group as the substituent, more preferably has a branched alkyl group or an alkoxy group, and still more preferably has a branched alkyl group having 3 to 10 carbon atoms or an alkyl group having 1 to 10 carbon atoms.

$R^{11}$ and $R^{12}$ may be the same group or different groups; however, from the viewpoint of synthesis compatibility, $R^{11}$ and $R^{12}$ are preferably the same group.

Specific examples of the iodonium salt include compounds shown below; however, the present invention is not limited thereto.

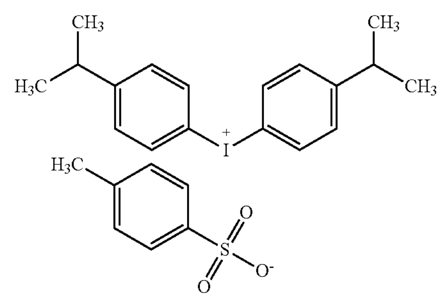

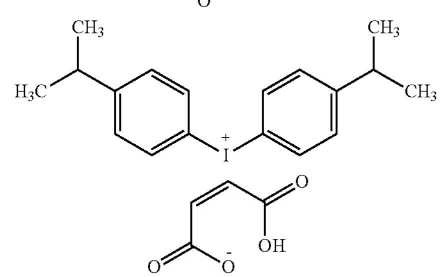

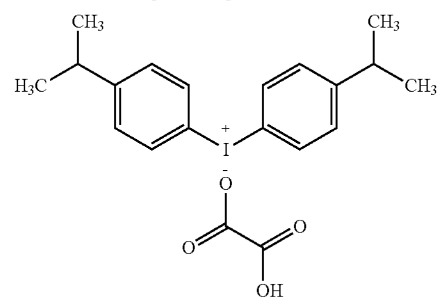

-continued

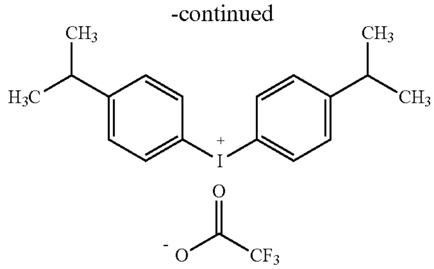

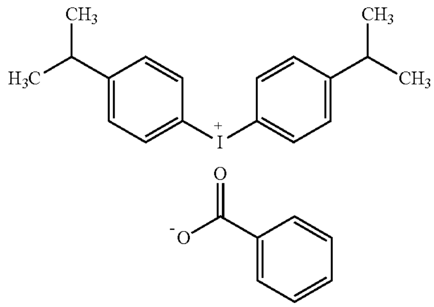

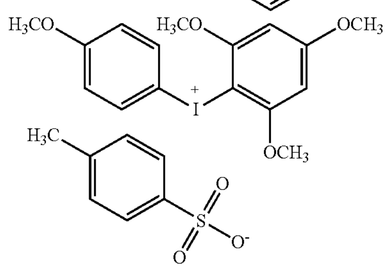

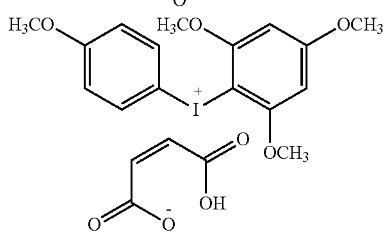

[Phosphonium Salt]

In the present invention, the phosphonium salt means a salt of a phosphonium cation and an anion. Examples of the anion include the same anions as those in the ammonium salt described above, and the same applies to the preferred aspect.

Phosphonium Cation

The phosphonium cation is preferably a quaternary phosphonium cation, and examples thereof include a tetraalkylphosphonium cation and a triarylmonoalkylphosphonium cation.

In addition, the phosphonium cation is preferably a cation represented by Formula (105).

(105)

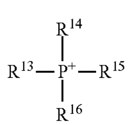

In Formula (105), $R^{13}$ to $R^{16}$ each independently represent a hydrogen atom or a hydrocarbon group.

$R^{13}$ to $R^{16}$ are each independently preferably an alkyl group or an aryl group, more preferably an alkyl group having 1 to 10 carbon atoms or an aryl group having 6 to 12 carbon atoms, still more preferably an aryl group having 6 to 12 carbon atoms, and even still more preferably a phenyl group.

$R^{13}$ to $R^{16}$ may have a substituent, and examples of the substituent include a hydroxy group, an aryl group, an alkoxy group, an aryloxy group, an arylcarbonyl group, an alkylcarbonyl group, an alkoxycarbonyl group, an aryloxycarbonyl group, and an acyloxy group. Among these, $R^{13}$ to $R^{16}$ preferably have an alkyl group or an alkoxy group as the substituent, more preferably has a branched alkyl group or an alkoxy group, and still more preferably has a branched alkyl group having 3 to 10 carbon atoms or an alkyl group having 1 to 10 carbon atoms.

$R^{13}$ to $R^{16}$ may be the same group or different groups; however, from the viewpoint of synthesis compatibility, $R^{13}$ to $R^{16}$ are preferably the same group.

Specific examples of the phosphonium salt include compounds shown below; however, the present invention is not limited thereto.

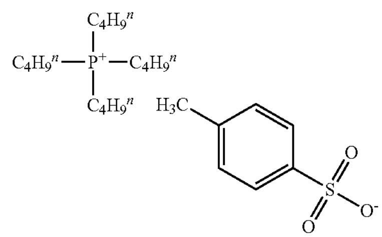

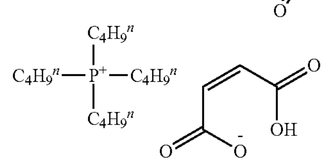

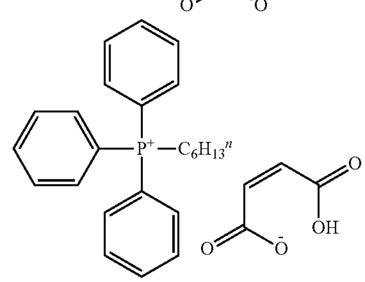

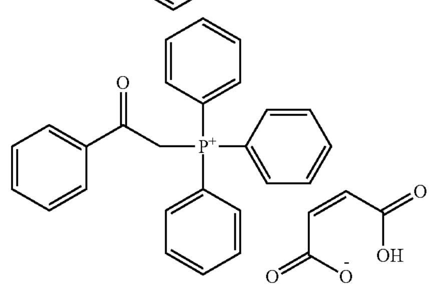

The content of the onium salt is preferably 0.1% to 50% by mass with respect to the total solid content of the photosensitive resin composition according to the embodiment of the present invention. The lower limit thereof is more preferably 0.5% by mass or more, still more preferably 0.85% by mass or more, and even still more preferably 1% by mass or more. The upper limit thereof is more preferably 30% by mass or less, still more preferably 20% by mass or less, and even still more preferably 10% by mass or less, and may be 5% by mass or less or may be 4% by mass or less.

One kind or two or more kinds of onium salts can be used. In a case where two or more kinds thereof are used, the total amount is preferably within the above-described range.

<Carboxy Group-Containing Compound>

The photosensitive resin composition according to the embodiment of the present invention preferably further contains a compound having a plurality of carboxy groups and having a molecular weight of 1,000 or less (also referred to as a "carboxy group-containing compound") from the viewpoint of further improving the surface smoothness of the obtained cured film.

The number of carboxy groups in the carboxy group-containing compound may be 2 or more, preferably 2 to 6, and more preferably 2 to 4.

The molecular weight of the carboxy group-containing compound may be 1,000 or less, preferably 800 or less, and more preferably 600 or less. The lower limit thereof is not particularly limited; however, it is preferably 100 or more.

The carboxy group-containing compound is preferably an unsaturated polyvalent carboxylic acid compound and more preferably an unsaturated dicarboxylic acid compound.

The unsaturated dicarboxylic acid compound is preferably a compound containing an ethylenically unsaturated group or an aromatic ring in the molecule, and more preferably a compound containing an unsaturated bond, which is conjugated with a carboxylic acid.

Further, the carboxy group-containing compound is preferably composed of only carbon atoms, oxygen atoms, and hydrogen atoms.

The carboxy group-containing compound may be any one of an aliphatic polyvalent carboxylic acid or polyvalent aromatic carboxylic acid. Examples thereof include linear or branched aliphatic polyvalent carboxylic acids such as oxalic acid, malonic acid, succinic acid, maleic acid, glutaric acid, adipic acid, pimelic acid, suberic acid, azelaic acid, sebacic acid, dodecanedioic acid, 2-ethylhexyl succinic acid, oleyl succinic acid, 2-dodecenyl succinic acid, as tetrapropenyl succinic acid;

alicyclic polyvalent carboxylic acids such as cyclohexenedicarboxylic acids such as 1,2-cyclohexanedicarboxylic acid, 1,3-cyclohexanedicarboxylic acid, 3-methyl-1,2-cyclohexanedicarboxylic acid, 4-methyl-1,2-cyclohexanedicarboxylic acid, 3-ethyl-1,2-cyclohexanedicarboxylic acid, 3-propyl-1,2-cyclohexanedicarboxylic acid, 3-butyl-1,2-cyclohexanedicarboxylic acid, and 3-cyclohexene-1,2-dicarboxylic acid; and polyvalent aromatic carboxylic acids such as phthalic acid, trimellitic acid, 3-methylphthalic acid, 4-methylphthalic acid, 3,4,5,6-tetramethylphthalic acid, 3-methylbenzene-1,2,4-tricarboxylic acid, 5-methylbenzene-1,2,4-tricarboxylic acid, 6-methylbenzene-1,2,4-tricarboxylic acid, biphenyl-3,3',4,4'-tetracarboxylic acid, diphenyl ether-3,3',4,4'-tetracarboxylic acid, benzophenone-3,3',4,4'-tetracarboxylic acid, diphenylmethane-3,3',4,4'-tetracarboxylic acid, ethylidene-4,4'-bis(1,2-benzenedicarboxylic acid), propylidene-4,4'-bis(1,2-benzenedicarboxylic acid), benzene-1,2,3,4-tetracarboxylic acid, pyromellitic acid, 3-methylbenzene-1,2,4,5-tetracarboxylic acid, 3,6-dimethylbenzene-1,2,4,5-tetracarboxylic acid, benzenepentacarboxylic acid, and benzenehexacarboxylic acid.

In a case where the photosensitive resin composition according to the embodiment of the present invention contains a carboxy group-containing compound, the content of the carboxy group-containing compound is preferably 0.01% to 20% by mass with respect to the total solid content of the photosensitive resin composition according to the embodiment of the present invention. The lower limit thereof is more preferably 0.02% by mass or more and still more preferably 0.05% by mass or more. The upper limit thereof is more preferably 10% by mass or less and still more preferably 5% by mass or less.

One kind or two or more kinds of carboxy group-containing compounds can be used. In a case where two or more kinds thereof are used, the total amount is preferably within the above-described range.

<Compound Having Sulfurous Ester Structure>

The photosensitive resin composition according to the embodiment of the present invention preferably contains a compound having a sulfurous ester structure (hereinafter, also simply referred to as "sulfurous acid ester compound").

The sulfurous ester structure may be a sulfurous monoester structure or a sulfurous diester structure; however, a sulfurous diester structure is preferable from the viewpoint of further improving chemical resistance.

Further, the compound having a sulfurous ester structure preferably contains a radically polymerizable group and more preferably contains two or more radically polymerizable groups from the viewpoint of further improving chemical resistance. The upper limit of the number of radically polymerizable groups is not particularly limited; however, it is preferably 6 or less.

The radically polymerizable group contained in the compound having a sulfurous ester structure is preferably an ethylenically unsaturated group, more preferably a (meth)acryloyl group, a (meth)allyl group, or a vinylphenyl group, and still more preferably a (meth)acryloxy group.

Further, the sulfurous ester structure is preferably a structure represented by Formula (S1).

(S1)

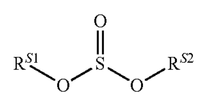

In Formula (S1), $R^{S1}$ and $R^{S2}$ each independently represent a hydrogen atom or a monovalent organic group, and both $R^{S1}$ and $R^{S2}$ are not a hydrogen atom at the same time. In Formula (S1), it is preferable that both $R^{S1}$ and $R^{S2}$ are a monovalent organic group.

In Formula (S1), $R^{S1}$ and $R^{S2}$ may be the same group or different groups; however, from the viewpoint of synthesis compatibility, $R^{S1}$ and $R^{S2}$ are preferably the same group.

In Formula (S1), the monovalent organic group as $R^{S1}$ and $R^{S2}$ is preferably a group represented by Formula (S2) or a group represented by Formula (S3). From the viewpoint of storage stability of the photosensitive resin composition, a group represented by Formula (S2) is more preferable.

(S2)

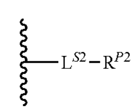

(S3)

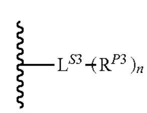

In Formula (S2), $L^{S2}$ represents a single bond or a divalent linking group, $R^{P2}$ represents a monovalent organic group, and a wavy line part represents a bonding position to an oxygen atom in Formula (S1).

In Formula (S3), $L^{S3}$ represents an (n+1) valent linking group, $R^{P3}$ represents a monovalent organic group, n represents an integer of 2 or more, and a wavy line part represents a bonding position to an oxygen atom in Formula (S1).

In Formula (S2), $L^{S2}$ represents a single bond or a divalent linking group, is preferably a single bond, a linear or branched alkylene group (preferably having 1 to 24 carbon atoms, more preferably 1 to 12 carbon atoms, and particularly preferably having 1 to 6 carbon atoms), a divalent aromatic group (preferably having 6 to 22 carbon atoms, more preferably 6 to 14 carbon atoms, and particularly preferably 6 to 10 carbon atoms, and preferably an aromatic hydrocarbon group), —O—, —S—, —C(═O)—, —$NR^{S3}$—, —$NR^{S3}$C(═O)—, or a group obtained by combining two or more thereof, and more preferably, a single bond, the above alkylene group, the above aromatic group, —O—, —C(═O)—, or a group obtained by combining two or more thereof.

$R^{S3}$ represents a hydrogen atom or an alkyl group, preferably a hydrogen atom or an alkyl group having 1 to 4 carbon atoms, more preferably a hydrogen atom or a methyl group, and still more preferably a hydrogen atom.

Further, $L^{S2}$ is preferably the above alkylene group, the above aromatic group, or a (poly)alkyleneoxy group. The number of repetitions of the (poly)alkyleneoxy group is preferably 1 to 50 and more preferably 1 to 30. In the present specification, in a case where a (poly)alkyleneoxy group is described, the (poly)alkyleneoxy group includes both an alkyleneoxy group and a structure in which a plurality of alkyleneoxy groups are bonded.

In Formula (S3), $L^{S3}$ represents an (n+1) valent linking group, is preferably a group (preferably having 1 to 24 carbon atoms, more preferably 1 to 12 carbon atoms, and still more preferably 1 to 12 carbon atoms) obtained by removing (n+1) pieces of hydrogen atoms from a linear or branched saturated hydrocarbon, a group (preferably having 6 to 22 carbon atoms, more preferably 6 to 14 carbon atoms, and particularly preferably 6 to 10 carbon atoms or preferably a group obtained by removing (n+1) pieces of hydrogen atoms from an aromatic hydrocarbon compound) obtained by removing (n+1) pieces of hydrogen atoms from an aromatic compound, or a group obtained by combining at least one of these and at least one group selected from the group consisting of a linear or branched alkylene group (preferably having 1 to 24 carbon atoms, more preferably 1 to 12 carbon atoms, and particularly preferably having 1 to 6 carbon atoms), a divalent aromatic group (preferably having 6 to 22 carbon atoms, more preferably 6 to 14 carbon atoms, and particularly preferably 6 to 10 carbon atoms, and preferably an aromatic hydrocarbon group), —O—, —S—, —C(═O)—, —$NR^{S4}$—, and —$NR^{S4}$C(═O)—, and more preferably a group obtained by removing (n+1) pieces of hydrogen atoms from the above saturated hydrocarbon.

$R^{S4}$ represents a hydrogen atom or an alkyl group, preferably a hydrogen atom or an alkyl group having 1 to 4 carbon atoms, more preferably a hydrogen atom or a methyl group, and still more preferably a hydrogen atom.

In Formula (S2), $R^{P2}$ represents a monovalent organic group, and preferred examples thereof include a monovalent organic group containing a radically polymerizable group.

Examples of the radically polymerizable group contained in the monovalent organic group containing a radically polymerizable group in $R^{P2}$ include an ethylenically unsaturated group, preferred examples thereof include a vinyl group, a (meth)allyl group, or a group containing a (meth)acryloyl group, and more preferred examples thereof include a group containing a (meth)acryloyl group.

In a case where $R^{P2}$ is a monovalent organic group containing a radically polymerizable group, $R^{P2}$ is preferably a (meth)acryloyl group, a (meth)acryloyloxy group, a (meth)acryloylamino group, a vinyl group, a vinylphenyl group, a vinylphenyloxy group, or a vinylphenylmethyl group, more preferably a (meth)acryloyl group, a (meth)acryloyloxy group, or a (meth)acryloylamino group, and still more preferably an acryloyloxy group or a methacryloyloxy group.

The monovalent organic group containing a radically polymerizable group may be a group having only one radically polymerizable group or a group having two or more radically polymerizable groups. In a case where the monovalent organic group containing a radically polymerizable group has two or more radically polymerizable groups, the plurality of radically polymerizable groups may be the same as or different from each other. In addition, the monovalent organic group containing a radically polymerizable group may further have a substituent, which will be described later, as long as the effects of the present invention are not impaired. Examples of the substituent include a substituent T, which will be described later. The number of radically polymerizable groups contained in one monovalent organic group is preferably 3 or less and more preferably 2 or less. In the present invention, examples of the preferred aspect include an aspect in which the monovalent organic group containing a radically polymerizable group does not have a substituent.

$R^{P2}$ may be a monovalent organic group containing no radically polymerizable group. The monovalent organic group containing no radically polymerizable group is preferably an alkyl group or an aryl group, more preferably an alkyl group having 1 to 20 carbon atoms or an aryl group having 6 to 20 carbon atoms, and still more preferably an alkyl group having 1 to 4 carbon atoms or a phenyl group.

In Formula (S3), $R^{P3}$ is synonymous with $R^{P2}$, and the same applies to the preferred aspect.

The compound having a sulfurous ester structure in the present invention may be a low molecular-weight compound or a high molecular-weight compound; however, it is preferably a low molecular-weight compound.

Specifically, the molecular weight of the compound having a sulfurous ester structure is preferably less than 2,000 and more preferably less than 1,000. The lower limit of the molecular weight is not particularly limited; however, it is preferably 100 or more.

Examples of the compound having a sulfurous ester structure include compounds exemplified below; however, the present invention is not limited thereto.

(B-1)

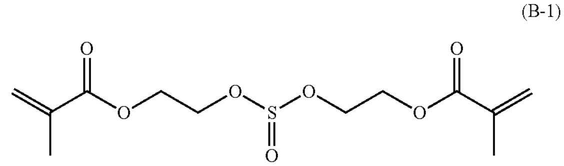

(B-2)

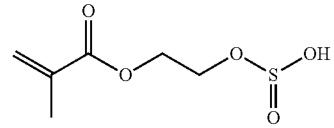

-continued (B-3)

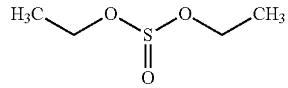

(B-4)

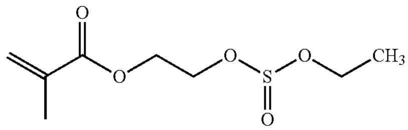

(B-5)

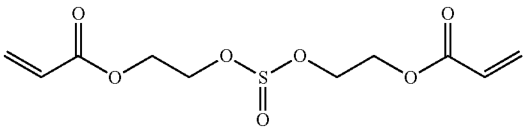

(B-6)

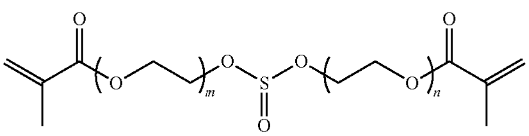

(B-7)

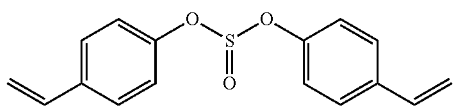

(B-8)

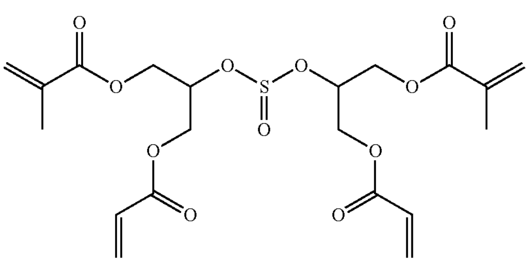

In the above-exemplified compounds, m is 1 to 30, and n is 1 to 30.

The content of the compound having a sulfurous ester structure in the photosensitive resin composition according to the embodiment of the present invention is preferably 0.001% by mass or more, more preferably 0.005% by mass or more, still more preferably 0.01% by mass or more, even still more preferably 0.05% by mass or more, even still more preferably 0.1% by mass or more, and even further still more preferably 0.3% by mass or more, with respect to the total solid content of the photosensitive resin composition. The above content is preferably 20% by mass or less, more preferably 15% by mass or less, still more preferably 10% by mass or less, and further, the content may be 7% by mass or less, 5% by mass or less, 2% by mass or less, or 1% by mass or less.

In a case where the compound having a sulfurous ester structure has a radically polymerizable group, the total content of the compound having a sulfurous ester structure and the radically polymerizable compound which will be described later is preferably 70 parts by mass or less, more preferably 60 parts by mass or less, still more preferably 55 parts by mass or less, even still more preferably 50 parts by mass or less, and particularly preferably 45 parts by mass or less, with respect to 100 parts by mass of the specific precursor. The above total content is preferably 0.1 part by mass or more and may be 1 part by mass or more, 3 parts by mass or more, 5 parts by mass or more, and 10 parts by mass or more.

In a case where the photosensitive resin composition contains a compound having a sulfurous ester structure and a radically polymerizable compound which will be described later, the content ratio (the mass ratio, the compound having a sulfurous ester structure: the radically polymerizable compound which will be described later) of the compound having a sulfurous ester structure to the radically polymerizable compound which will be described later is preferably 3:97 to 30:70 and more preferably 5:95 to 20:80.

From the viewpoint of further improving the storage stability and exposure sensitivity of the photosensitive resin composition, the proportion of the compound having a sulfurous ester structure to the total polymerizable compounds including a radically polymerizable compound which will be described later is preferable as the lower limit, 0.01% by mass or more, more preferably 0.02% by mass or more, still more preferably 0.1% by mass or more, even still more preferably 0.3% by mass or more, and even still further more preferably 0.5% by mass or more. The upper limit thereof is preferably 100% by mass or less and may be 50% by mass or less, 30% by mass or less, 20% by mass or less, 10% by mass or less, 7% by mass or less, 5% by mass or less, 2% by mass or less, or 1% by mass or less.

The photosensitive resin composition may contain only one kind of compound having a sulfurous ester structure or may contain two or more kinds thereof. In a case where two or more kinds thereof are contained, the total amount thereof is preferably within the above-described range.

<Photopolymerization Initiator>

The photosensitive resin composition according to the embodiment of the present invention preferably contains a photopolymerization initiator. The photopolymerization initiator is more preferably a photoradical polymerization initiator.

The photosensitive resin composition according to the embodiment of the present invention preferably contains a Group 4 element-containing compound, which will be described later, as a photoradical polymerization initiator. That is, in the present invention, among the Group 4 element-containing compounds which will be described later, a compound having a radical polymerization initiation ability can be used as a photoradical polymerization initiator.

In addition, in a case where the photosensitive resin composition according to the embodiment of the present invention contains a Group 4 element-containing compound or the like having a radical polymerization initiation ability, it is also preferable that the photosensitive resin composition according to the embodiment of the present invention is substantially free of a radical polymerization initiator other than the Group 4 element-containing compound. Regarding the photosensitive resin composition according the embodiment of the present invention, the description of "substantially free of a radical polymerization initiator other than the Group 4 element-containing compound" means that the content of the radical polymerization initiator other than the Group 4 element-containing compound is 5% by mass or less with respect to the total mass of the Group 4 element-containing compound, and the content thereof is preferably 3% by mass or less, more preferably 1% by mass or less, and still more preferably 0.1% by mass.

In a case where the photosensitive resin composition according to the embodiment of the present invention contains a Group 4 element-containing compound having no radical polymerization initiation ability, it is preferable to use the Group 4 element-containing compound and the radical polymerization initiator in combination.

Here, having a radical polymerization initiation ability means having the ability to generate free radicals capable of initiating radical polymerization. For example, the presence or absence of the polymerization initiation ability can be confirmed by irradiating a photosensitive resin composition containing a radically polymerizable monomer, a binder polymer, and a Group 4 element-containing compound with light having a wavelength range, in which the Group 4 element-containing compound absorbs the light but the radically polymerizable monomer does not absorb the light, and checking whether or not the radically polymerizable monomer disappeared. In order to confirm whether or not disappeared, an appropriate method can be selected depending on the kind of radically polymerizable monomer or binder polymer, and for example, the confirmation may be carried out by an IR measurement (infrared spectroscopy) or an HPLC measurement (high performance liquid chromatography).

The photoradical polymerization initiator that can be used in the present invention is not particularly limited and can be appropriately selected from conventionally known photoradical polymerization initiators. For example, a photoradical polymerization initiator having photosensitivity to rays ranging from an ultraviolet light range to a visible light range is preferable. In addition, the photoradical polymerization initiator may be an activator that produces an active radical by any action with a photo-excited sensitizer.

The photoradical polymerization initiator preferably contains at least one compound having a molar light absorption coefficient of at least about 50 L/(mol·cm) within the wavelength range of about 300 to 800 nm (preferably 330 to 500 nm). A molar light absorption coefficient of a compound can be measured using a conventionally known method. For example, it is preferable to carry out a measurement at a concentration of 0.01 g/L using an ethyl acetate solvent with an ultraviolet-visible spectrophotometer (Cary-5 spectrophotometer manufactured by Varian Medical Systems, Inc.).

In a case where the photosensitive resin composition according to the embodiment of the present invention contains a photoradical polymerization initiator, the photosensitive resin composition according to the embodiment of the present invention is applied to a base material such as a semiconductor wafer to form a photosensitive film (a photosensitive resin composition layer) and then irradiated with light, and curing due to the generated radicals occurs, whereby the solubility in the light-applied portion can be reduced. Therefore, for example, in a case where a photosensitive film is exposed through a photo mask having a pattern that masks only the electrode portion, there is an advantage that regions having different solubility can be easily prepared according to the electrode pattern.

[Another Photopolymerization Initiator]

In the photosensitive resin composition according to the embodiment of the present invention, any conventionally known compound other than the Group 4 element-containing compound, which will be described later, can be randomly used as another photopolymerization initiator. The photopolymerization initiator is more preferably a photoradical polymerization initiator.

Examples thereof include a halogenated hydrocarbon derivative (for example, a compound having a triazine skeleton, a compound having an oxadiazole skeleton, or a compound having a trihalomethyl group), an acylphosphine compound such as an acylphosphine oxide, hexaarylbiimidazole, an oxime compound such as an oxime derivative, an organic peroxide, a thio compound, a ketone compound, an aromatic onium salt, a keto oxime ether, an aminoacetophenone compound, hydroxyacetophenone, an azo-based compound, an azide compound, a metallocene compound, an organic boron compound, and an iron arene complex. Regarding the details of these compounds, reference can be made to the description in paragraphs 0165 to 0182 of JP2016-027357A, the content of which is incorporated in the present specification.

Examples of the ketone compound include compounds described in paragraph 0087 of JP2015-087611A, the content of which is incorporated in the present specification. As a commercially available product thereof, KAYACURE DETX (manufactured by Nippon Kayaku Co., Ltd.) is also suitably used.

As another photoradical polymerization initiator, a hydroxyacetophenone compound, an aminoacetophenone compound, and an acylphosphine compound can also be suitably used. More specifically, for example, the aminoacetophenone-based initiator described in JP1998-291969A (JP-H10-291969A) and the acylphosphine oxide-based initiator described in JP4225898B can also be used.

As the hydroxyacetophenone-based initiator, IRGACURE 184 (IRGACURE is a registered trade mark), DAROCUR 1173, IRGACURE 500, IRGACURE-2959, and IRGACURE 127 (trade names: all manufactured by BASF SE) can be used.

As the aminoacetophenone-based initiator, IRGACURE 907, IRGACURE 369, and IRGACURE 379 (trade names: all manufactured by BASF SE) which are commercially available products can be used.

As the aminoacetophenone-based initiator, the compound described in JP2009-191179A, an absorption maximum wavelength of which is matched to a light source having a wavelength such as 365 nm or 405 nm, can also be used.

Examples of acylphosphine-based initiator include the 2,4,6-trimethylbenzoyl-diphenyl-phosphine oxide. In addition, IRGACURE-819 or IRGACURE-TPO (trade names: all manufactured by BASF SE) which are commercially available products can be used.

Examples of the metallocene compound include IRGACURE-784 (manufactured by BASF SE).

More preferred examples of the photoradical polymerization initiator include an oxime compound. In a case where an oxime compound is used, exposure latitude can be more effectively improved. The oxime compound is particularly preferable since the oxime compound has wide exposure latitude (exposure margin) and also works as a photobase generator.

As specific examples of the oxime compound, the compound described in JP2001-233842A, the compound described in JP2000-080068A, and the compound described in JP2006-342166A can be used.

Examples of the preferred oxime compound include compounds having the following structures, 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

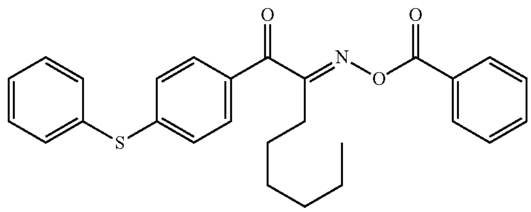

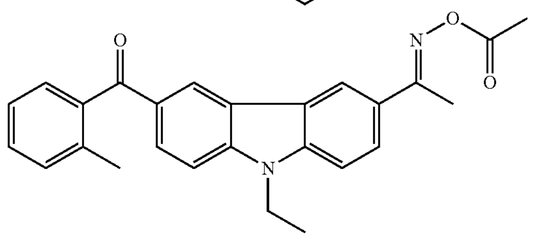

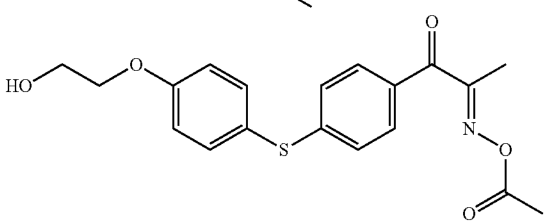

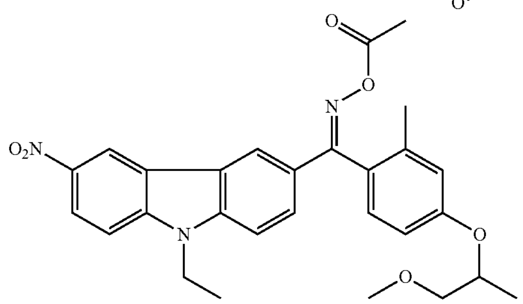

As commercially available products, IRGACURE OXE 01, IRGACURE OXE 02, IRGACURE OXE 03, IRGACURE OXE 04 (all manufactured by BASF SE), ADEKA OPTOMER N-1919 (manufactured by ADEKA Corporation, photoradical polymerization initiator 2 described in JP2012-014052A) are also suitably used. In addition, TR-PBG-304 (manufactured by Changzhou Tronly New Electronic Materials Co., Ltd.), ADEKA ARKLS NCI-831, and ADEKA ARKLS NCI-930 (manufactured by ADEKA Corporation) can also be used. In addition, DFI-091 (manufactured by DAITO CHEMIX Co., Ltd.) can be used.

Further, it is also possible to use an oxime compound having a fluorine atom. Specific examples of such oxime compounds include compounds described in JP2010-262028A, compounds 24, and 36 to 40 described in paragraph 0345 of JP2014-500852A, and a compound (C-3) described in paragraph 0101 of JP2013-164471A, the contents of which are incorporated in the present specification.

Examples of the most preferred oxime compound include the oxime compound having a specific substituent described in JP2007-269779A and the oxime compound having a thioaryl group described in JP2009-191061A, the contents of which are incorporated in the present specification.

From the viewpoint of exposure sensitivity, the other photoradical polymerization initiator is preferably a compound selected from the group consisting of a trihalomethyltriazine compound, a benzyl dimethyl ketal compound, an α-hydroxy ketone compound, an α-aminoketone compound, an acylphosphine compound, a phosphine oxide compound, a metallocene compound, an oxime compound, a triaryl imidazole dimer, an onium salt compound, a benzothiazole compound, a benzophenone compound, an acetophenone compound and a derivative thereof, a cyclopentadiene-benzene-iron complex and a salt thereof, a halomethyl oxadiazole compound, and a 3-aryl substituted coumarin compound.

The other photoradical polymerization initiator is more preferably a trihalomethyltriazine compound, an α-aminoketone compound, an acylphosphine compound, a phosphine oxide compound, a metallocene compound, an oxime compound, a triaryl imidazole dimer, an onium salt compound, a benzophenone compound, or an acetophenone compound, and still more preferably at least one compound selected from the group consisting of a trihalomethyltriazine compound, an α-aminoketone compound, an oxime compound, a triaryl imidazole dimer, and a benzophenone compound. A metallocene compound or an oxime compound is even still more preferably used, and an oxime compound is even still further more preferred.

In addition, as the other photoradical polymerization initiator, it is possible to use benzophenone, an N,N'-tetraalkyl-4,4'-diaminobenzophenone such as N,N'-tetramethyl-4,4'-diaminobenzophenone (Michler's ketone), an aromatic ketone such as 2-benzyl-2-dimethylamino-1-(4-morpholinophenyl)-butanone-1,2-methyl-1-[4-(methylthio) ph enyl]-2-morpholino-propanone-1, quinones fused with an aromatic ring such as an alkylanthraquinone, a benzoin ether compound such as a benzoin alkyl ether, a benzoin compound such as benzoin or an alkyl benzoin, a benzyl derivative such as benzyl dimethyl ketal, or the like. In addition, a compound represented by Formula (I) may also be used.

(I)

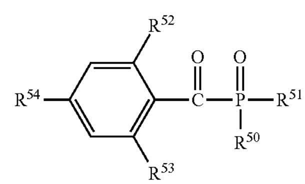

In Formula (I), $R^{50}$ represents an alkyl group having 1 to 20 carbon atoms, an alkyl group having 2 to 20 carbon atoms, which is interrupted by one or more oxygen atoms, an alkoxy group having 1 to 12 carbon atoms, a phenyl group, an alkyl group having 1 to 20 carbon atoms, an alkoxy group having 1 to 12 carbon atoms, a halogen atom, a cyclopentyl group, a cyclohexyl group, an alkenyl group having 2 to 12 carbon atoms, a phenyl group substituted with at least one of an alkyl group having 2 to 18 carbon atoms, which is interrupted by one or more oxygen atoms or an alkyl group having 1 to 4 carbon atoms, or a biphenylyl group, $R^{51}$ is a group represented by Formula (II) or a group which is the same as $R^{50}$, and $R^{52}$ to $R^{54}$ each independently represent an alkyl group having 1 to 12 carbon atoms, an alkoxy group having 1 to 12 carbon atoms, or a halogen atom.

(II)

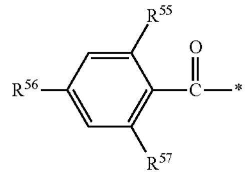

In the formula, $R^{55}$ to $R^{57}$ are respectively the same as $R^{52}$ to $R^{54}$ in Formula (I).

Further, as another photoradical polymerization initiator, the compounds described in paragraphs 0048 to 0055 of WO2015/125469A can also be used.

The content of the photoradical polymerization initiator is preferably 0.1% to 30% by mass, more preferably 0.1% to 20% by mass, and still more preferably 5% to 15% by mass, with respect to the total solid content of the photosensitive resin composition according to the embodiment of the present invention. One kind of photoradical polymerization initiator may be contained alone, or two or more kinds thereof may be contained. In a case where two or more kinds of photoradical polymerization initiators are contained, the total thereof is preferably within the above-described range.

<Thermal Polymerization Initiator>

The photosensitive resin composition according to the embodiment of the present invention may further contain a thermal polymerization initiator. The thermal polymerization initiator is more preferably a thermal radical polymerization initiator.

The thermal radical polymerization initiator is a compound that generates radicals by heat energy and initiates or promotes a polymerization reaction of a compound having polymerization properties. In a case where a thermal radical polymerization initiator is added, a polymerization reaction of a specific precursor can be advanced together with the cyclization of the specific precursor, whereby a higher degree of heat resistance of an obtained cured film can be achieved.

Specific examples of thermal radical polymerization initiator include compounds described in paragraphs 0074 to 0118 of JP2008-063554A, the content of which is incorporated in the present specification.

The content of thermal radical polymerization initiator is preferably 0.1% to 30% by mass, more preferably 0.1% to 20% by mass, and still more preferably 5% to 15% by mass, with respect to the total solid content of the photosensitive resin composition according to the embodiment of the present invention. One kind of thermal radical polymerization initiator may be contained alone, or two or more kinds thereof may be contained. In a case where two or more kinds of thermal radical polymerization initiators are contained, the total thereof is preferably within the above-described range.

<Group 4 Element-Containing Compound>

The photosensitive resin composition according to the embodiment of the present invention preferably further contains a Group 4 element-containing compound.

The Group 4 element-containing compound in the present invention is preferably the photoradical polymerization initiator described above, from the viewpoint of further improving chemical resistance.

The Group 4 element-containing compound is preferably an organic compound containing at least one selected from the group consisting of a titanium atom, a zirconium atom, and a hafnium atom, and more preferably an organic compound containing at least one selected from the group consisting of a titanium atom and a zirconium atom. The organic compound containing at least one selected from a titanium atom or a zirconium atom is preferably an organic compound containing an organic group and, a titanium atom or a zirconium atom, and the total number of titanium atoms and zirconium atoms contained in one molecule of the organic compound is preferably one. The organic group is not particularly specified; however, it is preferably a group consisting of a hydrocarbon group or a combination of a hydrocarbon group and a hetero atom. The hetero atom is preferably an oxygen atom, a sulfur atom, or a nitrogen atom.

In the present invention, it is preferable that at least one of the organic groups is a cyclic group, and it is more preferable that at least two thereof are a cyclic group. The cyclic group is preferably selected from a 5-membered cyclic group and a 6-membered cyclic group, and more preferably selected from a 5-membered cyclic group. The 5-membered cyclic group is preferably a cyclopentadienyl group. Further, an organic titanium compound or the like used in the present invention preferably contains 2 to 4 cyclic groups in one molecule.

The Group 4 element-containing compound in the present invention is preferably a compound represented by Formula (P).

(P)

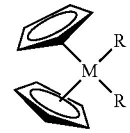

In Formula (P), M is a Group 4 element, and R's are each independently a substituent.

The above R's are each independently preferably selected from an aromatic group, an alkyl group, a halogen atom, and an alkylsulfonyloxy group.

The Group 4 element represented by M is preferably a titanium atom, a zirconium atom, or a hafnium atom, and more preferably a titanium atom or a zirconium atom.

Examples of the aromatic group as R include an aromatic group having 6 to 20 carbon atoms and preferred examples thereof include an aromatic hydrocarbon group having 6 to 20 carbon atoms, which include a phenyl group, a 1-naphthyl group, and a 2-naphthyl group.

The alkyl group as R is preferably an alkyl group having 1 to 20 carbon atoms, more preferably an alkyl group having 1 to 10 carbon atoms, and examples thereof include a methyl group, an ethyl group, a propyl group, an octyl group, an isopropyl group, a t-butyl group, an isopentyl group, a 2-ethylhexyl group, a 2-methylhexyl group, and a cyclopentyl group.

Examples of the halogen atom as R include F, Cl, Br, and I.

The alkyl chain constituting the alkylsulfonyloxy group as R is preferably an alkyl group having 1 to 20 carbon atoms and more preferably an alkyl group having 1 to 10 carbon atoms, and examples thereof include a methyl chain, an ethyl chain, a propyl chain, an octyl chain, an isopropyl chain, a t-butyl chain, an isopentyl chain, a 2-ethylhexyl chain, a 2-methylhexyl chain, and a cyclopentyl chain.

The above R may further have a substituent. Examples of the substituent include a halogen atom (F, Cl, Br, or I), a hydroxy group, a carboxy group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group, and a diarylamino group.

The Group 4 element-containing compound that is used in the present invention preferably contains at least one selected from the group consisting of metallocene and a metallocene derivative.

In the present invention, the metallocene derivative represents an organometallic compound having two cyclopentadienyl anion derivatives having a substituent, as η5-ligands, and includes a titanocene derivative, a zirconocene derivative, and a hafnocene derivative.

In addition, the Group 4 element-containing compound that is used in the present invention is preferably selected from a titanocene compound, a tetraalkoxytitanium compound, a titanium acylate compound, a titanium chelate compound, a zirconocene compound, and a hafnocene compound, more preferably selected from a titanocene compound, a zirconocene compound, and a hafnocene compound, and still more preferably selected from a titanocene compounds and zirconocene compound.

The Group 4 element-containing compound is preferably at least one selected from the group consisting of titanocene, a titanocene derivative, zirconocene, and a zirconocene derivative, and more preferably at least one selected from the group consisting of titanocene and a titanocene derivative.

The molecular weight of the Group 4 element-containing compound is preferably 50 to 2,000 and more preferably 100 to 1,000.

Specific examples of the Group 4 element-containing compound include tetraisopropoxytitanium, tetrakis(2-ethylhexyloxy)titanium, diisopropoxybis(ethyl acetoacetato) titanium, diisopropoxybis(acetyl acetonato)titanium, and the following compounds exemplified below.

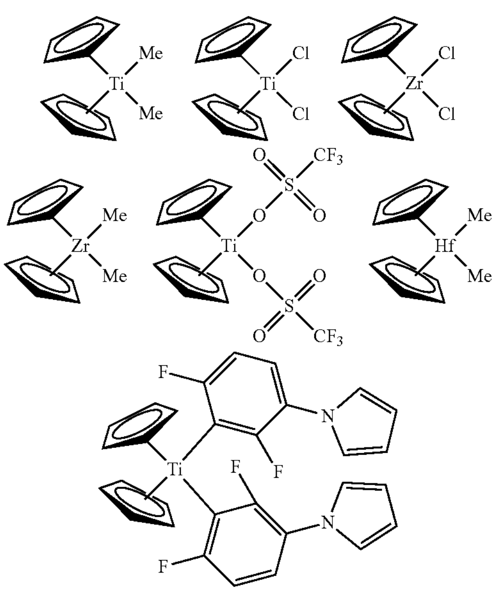

Among the Group 4 element-containing compounds, the following organic compound containing a titanium atom can be used; di-cyclopentadienyl-Ti-di-chloride, di-cyclopentadienyl-Ti-bis-phenyl, di-cyclopentadienyl-Ti-bis-2,3,4,5,6-pentafluorophenyl-1-yl, di-cyclopentadienyl-Ti-bis-2,3,5,6-tetrafluorophenyl-1-yl, di-cyclopentadienyl-Ti-bis-2,4,6-trifluorophenyl-1-yl, di-cyclopentadienyl-Ti-2,6-difluorophenyl-1-yl, di-cyclopentadienyl-Ti-bis-2,4-difluorophenyl-1-yl, di-methylcyclopentadienyl-Ti-bis-2,3,4,5,6-pentafluorophenyl-1-yl, di-methylcyclopentadienyl-Ti-bis-2,3,5,6-tetrafluorophenyl-1-yl, di-methylcyclopentadienyl-Ti-bis-2,4-difluorophenyl-1-yl, bis(cyclopentadienyl)-bis(2,6-difluoro-3-(pyr-1-yl)phenyl)titanium, bis(cyclopentadienyl) bis[2,6-difluoro-3-(methylsulfonamide)phenyl]titanium, bis (cyclopentadienyl)bis[2,6-difluoro-3-(N-butylbiaroylamino)phenyl]titanium, bis(cyclopentadienyl)bis[2,6-difluoro-3-(N-ethylacetylamino)phenyl]titanium, bis (cyclopentadienyl)bis[2,6-difluoro-3-(N-methylacetylamino)phenyl]titanium, bis(cyclopentadienyl)bis[2,6-difluoro-3-(N-ethylpropionylamino)phenyl]titanium, bis(cyclopentadienyl)bis[2,6-difluoro-3-(N-ethyl-(2,2-dimethylbutanoyl)amino)phenyl]titaniu m, bis(cyclopentadienyl) bis[2,6-difluoro-3-(N-butyl-(2,2-dimethylbutanoyl)amino) phenyl]titaniu m, bis(cyclopentadienyl)bis[2,6-difluoro-3-(N-pentyl-(2,2-dimethylbutanoyl)amino)phenyl]titani um, bis(cyclopentadienyl)bis[2,6-difluoro-3-(N-hexyl-(2,2-dimethylbutanoyl)phenyl]titanium, bis(cyclopentadienyl)bis[2,6-difluoro-3-(N-methylbutylamino)phenyl]titanium, bis(cyclopentadienyl)bis[2,6-difluoro-3-(N-methylpentanoylamino)phenyl]titanium, bis(cyclopentadienyl)bis[2,6-difluoro-3-(N-ethylcyclohexylcarbonylamino)phenyl]titanium, bis(cyclopentadienyl)bis[2,6-difluoro-3-(N-ethylisobutylamino)phenyl]titanium, bis(cyclopentadienyl)bis[2,6-difluoro-3-(2,2,5,5-tetramethyl-1,2,5-azadichloridinyl-1-yl) pheny 1]titanium, bis(cyclopentadienyl)bis[2,6-difluoro-3-(octylsulfonamide)phenyl]titanium, bis(cyclopentadienyl) bis[2,6-difluoro-3-(4-tolylsulfonamide)phenyl]titanium, bis (cyclopentadienyl)bis[2,6-difluoro-3-(4-dodecylphenylsulfonylamide)phenyl]titanium, bis(cyclopentadienyl)bis [2,6-difluoro-3-(4-(1-pentylheptyl)phenylsulfonylamide) phenyl]titani um, bis(cyclopentadienyl)bis[2,6-difluoro-3-(ethylsulfonylamide)phenyl]titanium, bis(cyclopentadienyl) bis[2,6-difluoro-3-((4-bromophenyl)-sulfonylamide) phenyl]titanium, bis(cyclopentadienyl)bis[2,6-difluoro-3-(2-naphthyl-sulfonylamide)phenyl]titanium, bis(cyclopentadienyl)bis[2,6-difluoro-3-(hexadecylsulfonylamide)phenyl]titanium, bis(cyclopentadienyl)bis[2,6-difluoro-3-(N-methyl-(4-dodecylphenyl) sulfonylamide)phenyl]tit anium, bis(cyclopentadienyl)bis[2,6-difluoro-3-(N-methyl-4-(1-pentylheptyl)phenyl) sulfonylamide)]ti tanium, bis(cyclopentadienyl)bis[2,6-difluoro-3-(N-hexyl-(4-tolyl)-sulfonylamide)phenyl]titanium, bis(cyclopentadienyl)bis[2,6-difluoro-3-(pyrrolidin-2,5-dion-1-yl)phenyl]titanium, bis (cyclopentadienyl)bis[2,6-difluoro-3-(3,4-dimethyl-3-pyrrolidin-2,5-dion-1-yl)phenyl]titani um, bis(cyclopentadienyl)bis[2,6-difluoro-3-(phthalimide)phenyl]titanium, bis(cyclopentadienyl)bis[2,6-difluoro-3-(isobutoxycarbonylamino)phenyl]titanium, bis(cyclopentadienyl)bis[2,6-difluoro-3-(ethoxycarbonylamino)phenyl]titanium, bis(cyclopentadienyl)bis[2,6-difluoro-3-((2-chloroethoxy)-carbonylamino)phenyl]titanium, bis(cyclopentadienyl)bis[2,6-difluoro-3-(phenoxycarbonylamino)phenyl]titanium, bis(cyclopentadienyl)bis[2,6-difluoro-3-(3-phenylthioureide)phenyl]titanium, bis(cyclopentadienyl)bis[2,6-difluoro-3-(3-butylthioureide)phenyl]titanium, bis(cyclopentadienyl)bis [2,6-difluoro-3-(3-phenylureide)phenyl]titanium, bis (cyclopentadienyl)bis[2,6-difluoro-3-(3-butylureide) phenyl]titanium, bis(cyclopentadienyl)bis[2,6-difluoro-3-(N,N-diacetylamino)phenyl]titanium, bis(cyclopentadienyl) bis[2,6-difluoro-3-(3,3-dimethylureide)phenyl]titanium, bis (cyclopentadienyl)bis[2,6-difluoro-3-(acetylamino)phenyl] titanium, bis(cyclopentadienyl)bis[2,6-difluoro-3-(butylamino)phenyl]titanium, bis(cyclopentadienyl)bis[2,6-difluoro-3-(decanoylamino)phenyl]titanium, bis(cyclopentadienyl)bis[2,6-difluoro-3-(octadecanoylamino)phenyl]titanium, bis(cyclopentadienyl)bis[2,6-difluoro-3-(isobutylamino)phenyl]titanium, bis(cyclopentadienyl)bis[2,6-difluoro-3-(2-ethylhexanoylamino)phenyl]titanium, bis(cyclopentadienyl)bis[2,6-difluoro-3-(2-methylbutanoylamino) phenyl]titanium, bis(cyclopentadienyl)bis[2,6-difluoro-3-(pivaloylamino)phenyl]titanium, bis(cyclopentadienyl)bis [2,6-difluoro-3-(2,2-dimethylbutanoylamino)phenyl] titanium, bis(cyclopentadienyl)bis[2,6-difluoro-3-(2-ethyl-2-methylheptanoylamino)phenyl]titanium, bis(cyclopentadienyl)bis[2,6-difluoro-3-(cyclohexylcarbonylamino) phenyl]titanium, bis(cyclopentadienyl)bis[2,6-difluoro-3-(2,2-dimethyl-3-chloropropanoylamino)phenyl]titanium m, bis(cyclopentadienyl)bis[2,6-difluoro-3-(3-phenylpropanoylamino)phenyl]titanium, bis(cyclopentadienyl)bis[2,6-difluoro-3-(2-chloromethyl-2-methyl-3-chloropropanoylamino) p henyl]titanium, bis(cyclopentadienyl)bis[2,6-difluoro-3-(3,4-xyloylamino)phenyl]titanium, bis(cyclopentadienyl)bis[2,6-difluoro-3-(4-ethybenzoylamino)phenyl]titanium, bis(cyclopentadienyl)bis[2,6-difluoro-3-(2,4,6-mesitylcarbonylamino)phenyl]titanium, bis(cyclopentadienyl)bis[2,6-difluoro-3-(benzoylamino)phenyl]titanium, bis (cyclopentadienyl)bis[2,6-difluoro-3-(N-(3-phenylpropyl) benzoylamino)phenyl]titanium, bis(cyclopentadienyl)bis[2,6-difluoro-3-(N-(3-ethylheptyl)-2,2-dimethylpentanoylamino)phenyl]titanium, bis(cyclopentadienyl)bis[2,6-difluoro-3-(N-isobutyl-(4-toluyl)amino)phenyl]titanium, bis (cyclopentadienyl)bis[2,6-difluoro-3-(N-isobutylbenzoylamino)phenyl]titanium, bis(cyclopentadienyl)bis[2,6-difluoro-3-(N-cyclohexylmethylpivalyolamino)phenyl] titanium, bis(cyclopentadienyl)bis[2,6-difluoro-3-(N-(oxoran-2-ylmethyl)benzoylamino)phenyl]titaniu m, bis (cyclopentadienyl)bis[2,6-difluoro-3-(N-(3-ethylheptyl)-2,2-dimethylbutanoylamino) pheny 1]titanium, bis (cyclopentadienyl)bis[2,6-difluoro-3-(N-(3-phenylpropyl-(4-toluyl)amino)phenyl]titanium, bis(cyclopentadienyl)bis [2,6-difluoro-3-(N-(oxoran-2-ylmethyl)-(4-toluyl)amino) phenyl]titani um, bis(cyclopentadienyl)bis[2,6-difluoro-3-(N-(4-touylmethyl)benzyolamino)phenyl]titanium, bis (cyclopentadienyl)bis[2,6-difluoro-3-(N-(4-touylmethyl)-(4-toluyl)amino)phenyl]titanium, bis(cyclopentadienyl)bis [2,6-difluoro-3-(N-butylbenzoylamino)phenyl]titanium, bis (cyclopentadienyl)bis[2,6-difluoro-3-(N-butyl-(4-toluyl) amino)phenyl]titanium, bis(cyclopentadienyl)bis[2,6-difluoro-3-(N-hexyl-(4-toluyl)amino)phenyl]titanium, bis (cyclopentadienyl)bis[2,6-difluoro-3-(N-(2,4-dimethylpentyl)-2,2-dimethylbutanoylamino)phenyl]titanium, bis (cyclopentadienyl)bis[2,6-difluoro-3-(2,4-dimethylpentyl)-2,2-dimethylpentanoylamino) ph enyl]titanium, bis(cyclopentadienyl)bis[2,6-difluoro-3-((4-toluyl)amino)phenyl] titanium, bis(cyclopentadienyl)bis[2,6-difluoro-3-(2,2-dimethylpentanoylamino)phenyl]titanium, bis(cyclopentadienyl)bis[2,6-difluoro-3-(2,2-dimethyl-3-ethoxypropanoylamino)phenyl]titaniu m, bis(cyclopentadienyl)bis[2,6-difluoro-3-(2,2-dimethyl-3-allyloxypropanoylamino)phenyl]titan ium, bis(cyclopentadienyl)bis[2,6-difluoro-3-(N-allylacetylamino)phenyl]titanium, bis(cyclopentadienyl)bis [2,6-difluoro-3-(2-ethylbutanoylamino)phenyl]titanium, bis (cyclopentadienyl)bis[2,6-difluoro-3-(N-cyclohexylmethylbenzoylamino)phenyl]titanium, bis(cyclopentadienyl) bis[2,6-difluoro-3-(N-cyclohexylmethyl-(4-toluyl)amino) phenyl]titaniu m, bis(cyclopentadienyl)bis[2,6-difluoro-3-(N-(2-ethylhexyl)benzyolamino)phenyl]titanium, bis (cyclopentadienyl)bis[2,6-difluoro-3-(N-isopropylbenzoylamino)phenyl]titanium, bis(cyclopentadienyl)bis[2,6-difluoro-3-(N-(3-phenylpropyl-(2,2-dimethylpentanoyl) amino) ph enyl]titanium, bis(cyclopentadienyl)bis[2,6-difluoro-3-(N-hexylbenzoylamino)phenyl]titanium, bis (cyclopentadienyl)bis[2,6-difluoro-3-(N-cyclohexylmethyl-2,2-dimethylpentanoyl)amino) p henyl]titanium, bis (cyclopentadienyl)bis[2,6-difluoro-3-(N-(2-ethylhexyl)-2,2-dimethylpetanoyl)amino) pheny 1]titanium, bis (cyclopentadienyl)bis[2,6-difluoro-3-(N-hexyl-2,2-dimethylpetanoylamino)phenyl]titanium, bis(cyclopentadienyl) bis[2,6-difluoro-3-(N-isopropyl-2,2-dimethylpetanoylamino)phenyl]titan ium, bis(cyclopentadienyl)bis[2,6-difluoro-3-(N-(3-phenylpropyl) pivaloylamino)phenyl] titanium, bis(cyclopentadienyl)bis[2,6-difluoro-3-(N-butyl-2,2-dimethylpetanoylamino)phenyl]titanium, bis(cyclopentadienyl)bis[2,6-difluoro-3-(N-(2-methoxyethyl)benzyolamino)phenyl]titanium, bis(cyclopentadienyl)bis[2,6-difluoro-3-(N-benzylbenzoylamino)phenyl]titanium, bis(cyclopentadienyl)bis[2,6-difluoro-3-(N-benzyl-(4-toluyl) amino)phenyl]titanium, bis(cyclopentadienyl)bis[2,6-difluoro-3-(N-(2-methoxyethyl)-(4-toluyl)amino)phenyl] titanium, bis(cyclopentadienyl)bis[2,6-difluoro-3-(N-(4-methylphenylmethyl)-(2,2-dimethylpentanoyla mino) phenyl]titanium, bis(cyclopentadienyl)bis[2,6-difluoro-3-(N-(2-methoxyethyl)-2,2-dimethylpetanoylamino) phe nyl] titanium, bis(cyclopentadienyl)bis[2,6-difluoro-3-(N-cyclohexylmethyl-(2-ethyl-2-methylpentanoyl) ami no)phenyl]titanium, bis(cyclopentadienyl)bis[2,6-difluoro-3-(N-butyl-(4-chlorobenzoyl)amino)phenyl]titanium, bis (cyclopentadienyl)bis[2,6-difluoro-3-(N-hexyl-(2-ethyl-2-methylbutanoyl)amino)phenyl]tit anium, bis (cyclopentadienyl)bis[2,6-difluoro-3-(N-cyclohexyl-2,2-dimethylpentanoyl)amino)phenyl]t itanium, bis (cyclopentadienyl)bis[2,6-difluoro-3-(N-(oxoran-2-ylmethyl)-2,2-dimethylpentanoyl)amino)phenyl]titanium, bis(cyclopentadienyl)bis[2,6-difluoro-3-(N-cyclohexyl-(4-chlorobenzoyl)amino)phenyl]titaniu m, bis(cyclopentadienyl)bis[2,6-difluoro-3-(N-cyclohexyl-(2-chlorobenzoyl) amino)phenyl]titaniu m, bis(cyclopentadienyl)bis[2,6-difluoro-3-(3,3-dimethyl-2-azetidinon-1-yl)phenyl] titanium, bis(cyclopentadienyl)bis[2,6-difluoro-3-(isocyanatophenylphenyl]titanium, bis(cyclopentadienyl)bis [2,6-difluoro-3-(N-ethyl-(4-tolylsulfonyl)amino)phenyl] titanium, bis(cyclopentadienyl)bis[2,6-difluoro-3-(N-hexyl-(4-tolylsulfonyl)amino)phenyl]titanium, bis(cyclopentadienyl)bis[2,6-difluoro-3-(N-butyl-(4-tolylsulfonyl)amino) phenyl]titanium, bis(cyclopentadienyl)bis[2,6-difluoro-3-(N-isobutyl-(4-tolylsulfonyl)amino)phenyl]titanium, bis(cyclopentadienyl)bis[2,6-difluoro-3-(N-butyl-(2,2-dimethyl-3-chloropropanoyl)amino) phe nyl]titanium, bis (cyclopentadienyl)bis[2,6-difluoro-3-(N-(3-phenylpropanoyl)-2,2-dimethyl-3-chloropropan oyl)amino)phenyl]titanium, bis(cyclopentadienyl)bis[2,6-difluoro-3-(N-cyclohexylmethyl-(2,2-dimethyl-3-chloropropanoy 1)amino)phenyl]titanium, bis(cyclopentadienyl)bis[2,6-difluoro-3-(N-isobutyl-(2,2-dimethyl-3-chloropropanoyl)phenyl]t itanium, bis(cyclopentadienyl)bis[2,6-difluoro-3-(N-butyl-(2-chloromethyl-2-methyl-3-chloropropanoy 1)amino)phenyl]titanium, bis(cyclopentadienyl)bis[2,6-difluoro-3-(butylthiocarbonylamino)phenyl]titanium, bis(cyclopentadienyl)bis [2,6-difluoro-3-(phenylthiocarbonylamino)phenyl]titanium, bis(cyclopentadienyl)bis[2,6-difluoro-3-(isocyanatophenylphenyl]titanium, bis(methylcyclopentadienyl)bis[2,6-difluoro-3-(N-hexyl-2,2-dimethylbutanoyl)amino)phenyl]t itanium, bis(methylcyclopentadienyl)bis[2,6-difluoro-3-(N-hexyl-2,2-dimethylpentanoylamino)phenyl]titanium, bis (methylcyclopentadienyl)bis[2,6-difluoro-3-(N-ethylacetylamino)phenyl]titanium, bis(methylcyclopentadienyl)bis[2,6-difluoro-3-(N-ethylpropionylamino)phenyl]titanium, bis(trimethylsilylpentadienyl)bis[2,6-difluoro-3-(N-butyl-2,2-dimethylpropanoylamino)phenyl]titanium, bis(cyclopentadienyl)bis[2,6-difluoro-3-(N-(2-methoxyethyl)-trimethylsilylamino)phenyl]titan ium, bis(cyclopentadienyl)bis[2,6-difluoro-3-(N-butylhexyldimethylsilylamino)phenyl]titanium, bis(cyclopentadienyl)bis[2,6-difluoro-3-(N-ethyl-(1,1,2-trimethylpropyl)dimethylamino) pheny 1]titanium, bis(cyclopentadienyl)bis[2,6-difluoro-3-(3-ethoxymethyl-3-methyl-2-azetidinon-1-yl)phenyl]ti tanium, bis(cyclopentadienyl)bis[2,6-difluoro-3-(3-allyloxymethyl-3-methyl-2-azetidinon-1-yl)phenyl]titanium, bis(cyclopentadienyl)bis[2,6-difluoro-3-(3-chloromethyl-3-methyl-2-azetidinon-1-yl)phenyl]ti tanium, bis(cyclopentadienyl)bis[2,6-difluoro-3-(N-benzyl-2,2-dimethylpropanoylamino)phenyl]titani um, bis(cyclopentadienyl)bis[2,6-difluoro-3-(5,5-dimethyl-2-pyrrolidin-1-yl)phenyl]titanium, bis(cyclopentadienyl)bis[2,6-difluoro-3-(6,6-diphenyl-2-piperidin-1-yl)phenyl]titanium, bis(cyclopentadienyl)bis[2,6-difluoro-3-(N-(2,3-dihydro-1,2-benzothiazolo-3-on (1,1-dioxide)-2-yl)phenyl]titanium, bis(cyclopentadienyl)bis[2,6-difluoro-3-(N-hexyl-(4-chlorobenzoyl)amino)phenyl]titanium, bis(cyclopentadienyl)bis[2,6-difluoro-3-(N-hexyl-(2-chlorobenzoyl)amino)phenyl]titanium, bis(cyclopentadienyl)bis[2,6-difluoro-3-(N-isopropyl-(4-chlorobenzoyl)amino)phenyl]titaniu m, bis(cyclopentadienyl)bis[2,6-difluoro-3-(N-(4-methylphenylmethyl)-(4-chlorobenzoyl)amino)phenyl]titanium, bis(cyclopentadienyl)bis[2,6-difluoro-3-(N-(4-methylphenylmethyl)-(2-chlorobenzoyl)amino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-benzyl-2,2-dimethylpentanoylamino)phenyl]titani um, bis(cyclopentadienyl)bis[2,6-difluoro-3-(N-(2-ethylhexyl-4-tolyl-sulfonyl)amino)phenyl]titani um, bis(cyclopentadienyl)bis[2,6-difluoro-3-(N-(3-oxyheptyl)benzyolamino)phenyl]titanium, bis(cyclopentadienyl)bis[2,6-difluoro-3-(N-(3,6-dioxadecylamino)phenyl]titanium, bis(cyclopentadienyl)bis[2,6-difluoro-3-(trifluoromethylsulfonyl)amino)phenyl]titanium, bis(cyclopentadienyl)bis[2,6-difluoro-3-(trifluoroacetylamino)phenyl]titanium, bis(cyclopentadienyl)bis[2,6-difluoro-3-(2-chlorobenzoyl)amino)phenyl]titanium, bis(cyclopentadienyl)bis[2,6-difluoro-3-(4-chlorobenzoyl)amino)phenyl]titanium, bis(cyclopentadienyl)bis[2,6-difluoro-3-(N-(3,6-dioxadecyl)-2,2-dimethylpentanoylamino) phe nyl]titanium, bis(cyclopentadienyl)bis[2,6-difluoro-3-(N-(3,7-dimethyl-7-methoxyoctyl)benzoylamino) phen yl]titanium, bis(cyclopentadienyl)bis[2,6-difluoro-3-(N-cyclohexylbenzoylamino)phenyl]titanium, or the like.

In addition, among the Group 4 element-containing compounds, as the organic compound containing a zirconium atom or the compound containing a hafnium atom, following compounds and compounds obtained by substituting a zirconium of the following compounds with hafnium atom can be also used; (cyclopentadienyl)trimethylzirconium, (cyclopentadienyl)triphenylzirconium, (cyclopentadienyl)tribenzylzirconium, (cyclopentadienyl)trichlorozirconium, (cyclopentadienyl)trimethoxyzirconium, (cyclopentadienyl)dimethyl(methoxy) zirconium, (cyclopentadienyl)methyldichlorozirconium, (methylcyclopentadienyl)trimethylzirconium, (methylcyclopentadienyl)triphenylzirconium, (methylcyclopentadienyl)tribenzylzirconium, (methylcyclopentadienyl)trichlorozirconium, (methylcyclopentadienyl)dimethyl(methoxy) zirconium, (dimethylcyclopentadienyl)trimethylzirconium, (trimethylcyclopentadienyl)trimethylzirconium, (trimethylsilylcyclopentadienyl)trimethylzirconium, (tetramethylcyclopentadienyl)trimethylzirconium, (pentamethylcyclopentadienyl)trimethylzirconium, (pentamethylcyclopentadienyl)triphenylzirconium, (pentamethylcyclopentadienyl)tribenzylzirconium, (pentamethylcyclopentadienyl)trichlorozirconium, (pentamethylcyclopentadienyl)trimethoxyzirconium, (pentamethylcyclopentadienyl)dimethyl(methoxy) zirconium, (cyclopentadienyl)triethylzirconium, (cyclopentadienyl)tripropylzirconium, (cyclopentadienyl)trineopentylzirconium, (cyclopentadienyl)tri(diphenylmethyl) zirconium, (cyclopentadienyl)dimethylhydridozirconium, (cyclopentadienyl)triethoxyzirconium, (cyclopentadienyl)trisoproxyzirconium, (cyclopentadienyl)triphenoxyzirconium, (cyclopentadienyl)dimethylisoproxyzirconium, (cyclopentadienyl)diphenylisoproxyzirconium, (cyclopentadienyl)dimethoxychlorozirconium, (cyclopentadienyl) methoxydichlorozirconium, (cyclopentadienyl)diphenoxychlorozirconium, (cyclopentadienyl)diphenoxydichlorozirconium, (cyclopentadienyl)tri (phenyldimethylsilyl) zirconium, (n-butylcyclopentadienyl)-n-boboxyzirconium, (benzylcyclopentadienyl)-di-m-tolylmethylzirconium, (trifluoromethylcyclopentadienyl)tribenzylzirconium, (diphenylcyclopentadienyl)dinorbornylmethylzirconium, (tetramethylcyclopentadienyl)tribenzylzirconium, (pentatrimethylsilylcyclopentadienyl)tribenzyl zirconium, (pentamethylcyclopentadienyl)trineopentyl zirconium, (pentamethylcyclopentadienyl)methyldichloro zirconium, (pentamethylcyclopentadienyl)triethoxy zirconium, (pentamethylcyclopentadienyl)triphenoxy zirconium, (pentamethylcyclopentadienyl)methoxydichloro zirconium, (pentamethylcyclopentadienyl)diphenoxychloro zirconium, (pentamethylcyclopentadienyl)phenoxydichloro zirconium, (indenyl)methyl zirconium, (indenyl)tribenzyl zirconium, (indenyl)trichloro zirconium, (indenyl)trimethoxy zirconium, (indenyl)triethoxyzirconium, bis(cyclopentadienyl)dimethylzirconium, bis(cyclopentadienyl) diethylzirconium, bis(cyclopentadienyl)diphenylzirconium, bis(cyclopentadienyl)dimethoxyzirconium, bis(cyclopentadienyl)dibenzylzirconium, bis(cyclopentadienyl)dihydridezirconium, bis(cyclopentadienyl)dichlorozirconium, bis(cyclopentadienyl) chlorohydridezirconium, bis(methylcyclopentadienyl)dimethylzirconium, bis(methylcyclopentadienyl)dibenzylzirconium, bis(methylcyclopentadienyl)dichlorozirconium, bis(pentamethylcyclopentadienyl)dimethylzirconium, bis(pentamethylcyclopentadienyl)dibenzylzirconium, bis(pentamethylcyclopentadienyl)dichlorozirconium, bis(pentamethylcyclopentadienyl)chloromethylzirconium, bis(pentamethylcyclopentadienyl)hydridemethylzirconium, (cyclopentadienyl) (pentametylcyclopentadienyl)dimethylzirconium, bis(cyclopentadienyl)dineopentylzirconium, bis(cyclopentadienyl)di-m-tolylzirconium, bis(cyclopentadienyl)di-p-tolylzirconium, bis(cyclopentadienyl)bis(diphenylmethyl) zirconium, bis(cyclopentadienyl)dibromozirconium, bis(cyclopentadienyl)methylchlorozirconium, bis(cyclopentadienyl)ethylchlorozirconium, bis(cyclopentadienyl)cyclohexylchlorozirconium, bis(cyclopentadienyl)phenylchlorozirconium, bis(cyclopentadienyl)benzylchlorozirconium, bis(cyclopentadienyl) hydridemethylzirconium, bis(cyclopentadienyl)methoxychlorozirconium, bis(cyclopentadienyl) ethoxychlorozirconium, bis(cyclopentadienyl) (trimethylsilyl)methylzirconium, bis(cyclopentadienyl)bis(trimethylsilyl)zirconium, bis(cyclopentadienyl) (triphenylsilyl)methylzirconium, bis(cyclopentadienyl) (tris(dimethylsilyl) silyl)methylzirconium, bis(cyclopentadienyl) (trimethylsilyl) (trimethysilylmethyl) zirconium, bis(methylcyclopentadienyl)

diphenylzirconium, bis(ethylcyclopentadienyl)dimethylzirconium, bis(ethylcyclopentadienyl)dichlorozirconium, bis(propylcyclopentadienyl)dimethylzirconium, bis (propylcyclopentadienyl)dichlorozirconium, bis(n-butylcyclopentadienyl)dichlorozirconium, bis(t-butylcyclopentadienyl)bis(trimethylsilyl) zirconium, bis(hexylcyclopentadienyl)dichlorozirconium, bis(cyclohexylcyclopentadienyl)dimethylzirconium, bis(dimethylcyclopentadienyl) dimethylzirconium, bis(dimethylcyclopentadienyl) dichlorozirconium, bis(dimethylcyclopentadienyl) ethoxychlorozirconium, bis(ethylmethylcyclopentadienyl) dichlorozirconium, bis(propylmethylcyclopentadienyl)dichlorozirconium, bis(butylmethylcyclopentadienyl)dichlorozirconium, bis(trimethylcyclopentadienyl) dichlorozirconium, bis(tetramethylcyclopentadienyl) dichlorozirconium, bis(cyclohexylmethylcyclopentadienyl) dibenzylzirconium, bis(trimethylsilylcyclopentadienyl) dimethylzirconium, bis(trimethylsilylcyclopentadienyl) dichlorozirconium, bis(trimethylgermylcyclopentadienyl) dimethylzirconium, bis(trimethylgermylcyclopentadienyl) diphenylzirconium, bis(trimethylstannylcyclopentadienyl) dimethylzirconium, bis(trimethylstannylcyclopentadienyl) dibenzylzirconium, bis(trifluoromethylcyclopentadienyl) dimethylzirconium, bis(trifluoromethylcyclopentadienyl) dinorbornylzirconium, bis(indenyl)dichlorozirconium, bis (indenyl)dibenzylzirconium, bis(indenyl)dibromozirconium, bis(fluorenyl)dichlorozirconium, bis(tetrahydroindenyl)dichlorozirconium, (propylcyclopentadienyl) (cyclopentadienyl)dimethylzirconium, (cyclohexylmethylcyclopentadienyl) (cyclopentadienyl)dibenzylzirconium, (pentatrimethylsilylcyclopentadienyl) (cyclopentadienyl)dimethylzirconium, (t trifluoromethylcyclopentadienyl) (cyclopentadienyl)dimethylzirconium, ethylenebis(indenyl)dimethylzirconium, ethylenebis(indenyl)dichlorozirconium, ethylenebis(tetrahydroindenyl)dimethylzirconium, ethylenebis(tetrahydroindenyl)dichlorozirconium, dimethylsilylenebis(cyclopentadienyl)dimethylzirconium, dimethylsilylenebis(cyclopentadienyl)dichlorozirconium, isopropyridene (cyclopentadienyl) (9-fluorenyl)dimethylzirconium, isopropyridene (cyclopentadienyl) (9-fluorenyl)dichlorozirconium, [phenyl(methyl)methylene) (9-fluorenyl) (cyclopentadienyl)dimethylzirconium, diphenylmethylene (cyclopentadienyl) (9-fluorenyl)dimethylzirconium, ethylene (9-fluorenyl) (cyclopentadienyl)dimethylzirconium, cyclohexylidene (9-fluorenyl) (cyclopentadienyl)dimethylzirconium, cyclopentylidene (9-fluorenyl) (cyclopentadienyl)dimethylzirconium, cyclobutylidene (9-fluorenyl) (cyclopentadienyl)dimethylzirconium, dimethylsilylene (9-fluorenyl) (cyclopentadienyl)dimethylzirconium, dimethylsilylenebis(2,3,5-trimethylcyclopentadienyl)dimethylzirconium, dimethylsilylenebis(2,3,5-trimethylcyclopentadienyl)dichlorozirconium, dimethylsilylenebis(indenyl) dichlorozirconium, methylenebis(cyclopentadienyl) dimethylzirconium, methylenebis(cyclopentadienyl)di (trimethylsilyl) zirconium, methylene (cyclopentadienyl) (tetramethylcyclopentadienyl)dimethylzirconium, methylene (cyclopentadienyl) (fluorenyl)dimethylzirconium, ethylenebis(cyclopentadienyl)dimethylzirconium, ethylenebis(cyclopentadienyl) dibenzylzirconium, ethylenebis(cyclopentadienyl)dihydridezirconium, ethylenebis(indenyl)diphenylzirconium, ethylenebis(indenyl)methylchlorozirconium, ethylenebis (tetrahydroindenyl)dibenzylzirconium, isopropyridene (cyclopentadienyl)(methylcyclopentadienyl)dichlorozirconium, isopropyridene (cyclopentadienyl) (octahydrofluorenyl)dihydridezirconium, dimethylsilylenebis(cyclopentadienyl)dineopentylzirconium, dimethylsilylenebis(cyclopentadienyl)dihydridezirconium, dimethylsilylenebis(methylcyclopentadienyl)dichlorozirconium, dimethylsilylenebis (dimethylcyclopentadienyl)dichlorozirconium, dimethylsilylenebis(tetrahydroindenyl)dichlorozirconium, dimethylsilylene (cyclopentadienyl) (fluorenyl)dichlorozirconium, dimethylsilylene (cyclopentadienyl) (fluorenyl)dihydridezirconium, dimethylsilylene(methylcyclopentadienyl) (fluorenyl)dihydridezirconium, dimethylsilylenebis(3-trimethylsilylcyclopentadienyl)dihydridezirconium, dimethylsilylenebis(indenyl)dimethylzirconium, diphenylsilylenebis (indenyl)dichlorozirconium, phenylmethylsilylenebis (indenyl)dichlorozirconium, or the like.

The content of the Group 4 element-containing compound is preferably 0.1% to 30% by mass with respect to the total solid content of the photosensitive resin composition according to the embodiment of the present invention. The lower limit thereof is more preferably 1.0% by mass or more, still more preferably 1.5% by mass or more, and particularly preferably 3.0% by mass or more. The upper limit thereof is more preferably 25% by mass or less.

One kind or two or more kinds of Group 4 element-containing compounds can be used. In a case where two or more kinds thereof are used, the total amount is preferably within the above-described range.

Further, in the photosensitive resin composition according to the embodiment of the present invention, the mass ratio (the Group 4 element-containing compound: the onium salt) of the content of the Group 4 element-containing compound to the content of the onium salt which will be described later is preferably 99:1 to 1:99, more preferably 90:10 to 10:90, and still more preferably 40:60 to 20:80. In a case where such a mass ratio range is adopted, a higher ring closure rate at a low temperature and a higher glass transition temperature of the specific precursor can be achieved.

<Solvent>

The photosensitive resin composition according to the embodiment of the present invention preferably contains a solvent. As the solvent, any conventionally known solvent can be used. The solvent is preferably an organic solvent. Examples of the organic solvent include compounds such as esters, ethers, ketones, aromatic hydrocarbons, sulfoxides, and amides.

Suitable examples of the esters include ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, γ-butyrolactone, ¿-caprolactone, 8-valerolactone, alkyl alkyloxyacetate (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (for example, methyl 3-alkyloxypropionate, and ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methylpropionate and ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate.

Suitable examples of the ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate.

Suitable examples of the ketones include methyl ethyl ketone, cyclohexanone, cyclopentanone, 2-heptanone, and 3-heptanone.

Suitable examples of the aromatic hydrocarbons include toluene, xylene, anisole, and limonene.

Suitable examples of the sulfoxides include dimethyl sulfoxide.

Suitable examples of the amides include N-methyl-2-pyrrolidone, N-ethyl-2-pyrrolidone, N,N-dimethylacetamide, and N,N-dimethylformamide.

From the viewpoint of improving the properties of a coated surface or the like, it is also preferable to mix two or more kinds of solvents. Among the above, the solvent is preferably a mixed solution composed of two or more solvents selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethyl carbitol acetate, butyl carbitol acetate, propylene glycol methyl ether, and propylene glycol methyl ether acetate. A combination of dimethyl sulfoxide and γ-butyrolactone is particularly preferable.

From the viewpoint of coatability, the content of the solvent is preferably such that the total solid content concentration of the photosensitive resin composition according to the embodiment of the present invention is 5% to 80% by mass, more preferably 5% to 70% by mass, and particularly preferably 10% to 60% by mass. The solvent content may be determined according to the desired thickness and the coating method. For example, in a case where the coating method is the spin coating or the slit coating, the content of the solvent is preferably such that the solid content concentration is in the above range. In a case of spray coating, the total solid content concentration is preferably 0.1% by mass to 50% by mass and more preferably 1.0% by mass to 25% by mass. By adjusting the amount of solvent according to the coating method, a photosensitive film having a desired thickness can be uniformly formed.

One kind of solvent may be contained, or two or more kinds thereof may be contained.

In a case where two or more kinds of solvents are contained, the total thereof is preferably within the above-described range.

<Polymerizable Compound>

The photosensitive resin composition according to the embodiment of the present invention preferably contains a polymerizable compound (hereinafter, also referred to as "polymerizable monomer"). The polymerizable compound is more preferably a radically polymerizable compound.

In the present invention, the radically polymerizable compound refers to a compound containing a radically polymerizable group, other than the above-described precursor and the above-described compound having a sulfurous ester structure.

In a case where the photosensitive resin composition according to the embodiment of the present invention contains a radically polymerizable compound, a cured film excellent in heat resistance can be formed.

Examples of the radically polymerizable group in the polymerizable monomer include groups having an ethylenically unsaturated bond, such as a vinylphenyl group, a vinyl group, a (meth)acryloyl group, and an allyl group, and preferred examples thereof include a (meth)acryloyl group.

The number of radically polymerizable groups in the polymerizable monomer may be one or may be two or more; however, it is preferably two or more, and more preferably three or more. The upper limit thereof is preferably 15 or lower, more preferably 10 or lower, and still more preferably 8 or lower.

The molecular weight of the polymerizable monomer is preferably 2,000 or lower, more preferably 1,500 or lower, and still more preferably 900 or lower. The lower limit of the molecular weight of the polymerizable monomer is preferably 100 or more.

From the viewpoint of developability, the photosensitive resin composition according to the embodiment of the present invention preferably contains at least one kind of difunctional or higher-functional polymerizable monomer, and more preferably contains at least one kind of trifunctional or higher-functional polymerizable monomer. Further, a mixture of a difunctional polymerizable monomer and a trifunctional or higher-functional polymerizable monomer may be used. Regarding the number of functional groups, in a case where a polymerizable monomer is bifunctional or higher-functional, the number of radically polymerizable groups in one molecule of the polymerizable monomer is two or more. Specific examples of the polymerizable monomer include unsaturated carboxylic acids (for example, acrylic acid, methacrylic acid, itaconic acid, crotonic acid, isocrotonic acid, and maleic acid), and esters or amides thereof, and preferred examples thereof are esters formed from unsaturated carboxylic acids and polyhydric alcohol compounds, and amides formed from unsaturated carboxylic acids and polyvalent amine compounds. In addition, addition reaction products produced by reacting unsaturated carboxylic acid esters or amides, having a nucleophilic substituent such as a hydroxy group, an amino group, or a mercapto group, with monofunctional or polyfunctional isocyanates or epoxies, dehydration condensation reaction products produced by reacting the above esters or amides with a monofunctional or polyfunctional carboxylic acid, or the like are also suitably used. In addition, addition reaction products produced by reacting unsaturated carboxylic acid esters or amides, having an electrophilic substituent such as an isocyanate group or an epoxy group, with monofunctional or polyfunctional alcohols, amines, or thiols, and further, substitution reaction products produced by reacting unsaturated carboxylic acid esters or amides, having an eliminable substituent such as a halogen group or a tosyloxy group, with monofunctional or polyfunctional alcohols, amines, or thiols are also suitable. In addition, as other examples, it is also possible to use a group of compounds that are obtained by using an unsaturated phosphonic acid, a vinylbenzene derivative such as styrene, a vinyl ether, an allyl ether, or the like, instead of the unsaturated carboxylic acid described above, can be used. Regarding the specific examples thereof, reference can be made to the description of paragraphs 0113 to 0122 of JP2016-027357A, the content of which is incorporated in the present specification.

In addition, the polymerizable monomer is also preferably a compound having a boiling point of 100° C. or higher under ordinary atmospheric pressure. Examples thereof include a compound obtained by adding ethylene oxide or propylene oxide to a polyfunctional alcohol such as polyethylene glycol di(meth)acrylate, trimethylolethane tri (meth)acrylate, neopentyl glycol di(meth)acrylate, pentaerythritol tri(meth)acrylate, pentaerythritol tetra(meth) acrylate, dipentaerythritol penta(meth)acrylate, dipentaerythritol hexa(meth)acrylate, hexanediol(meth) acrylate, trimethylolpropane tri (acryloyloxypropyl) ether, tri (acryloyloxyethyl) isocyanurate, glycerin, and trimethylolethane, and then being subjected to(meth)acrylation, urethane (meth)acrylates respectively described in JP1973-041708B (JP-S48-041708B), JP1975-006034B (JP-S50-006034B), and JP1976-037193A (JP-S51-037193A), polyester acrylates respectively described in JP1973-064183A (JP-S48-064183A), JP1974-043191B (JP-S49-043191B), and JP1977-030490B (JP-S52-030490B), polyfunctional acrylates or methacrylates such as epoxy acrylates which are reaction products of epoxy resins and (meth)acrylic acid, and mixtures thereof. In addition, the compounds described in paragraphs 0254 to 0257 of JP2008-292970A are also suitable. In addition, the polyfunctional (meth)acrylate or the like obtained by reacting a compound having a cyclic ether group and an ethylenically unsaturated group, such as glycidyl (meth)acrylate, with a polyfunctional carboxylic acid can also be mentioned, the content of which is incorporated in the present specification.

In addition, as other preferred polymerizable monomer other than those described above, compounds having a fluorene ring and having two or more groups containing an ethylenically unsaturated bond, which are described in JP2010-160418A, JP2010-129825A, JP4364216B, or the like, or a cardo resin can also be used.

Further, other examples thereof include the specific unsaturated compounds described in JP1971-043946B (JP-S46-043946B), JP1989-040337B (JP-H1-040337B), and JP1989-040336B (JP-H1-040336B), and the vinylphosphonic acid-based compound described in JP1990-025493A (JP-H2-025493A). In addition, the compounds containing a perfluoroalkyl group described in JP1986-022048A (JP-S61-022048A) can also be used. Further, the photopolymerizable monomer and the oligomer which are described in Journal of the Adhesion Society of Japan, Vol. 20, No. 7, pages 300 to 308 (1984) can also be used, the content of which is incorporated in the present specification.

In addition to the above, the compounds described in paragraphs 0048 to 0051 of JP2015-034964A can also be preferably used, the content of which is incorporated in the present specification.

In addition, the compounds which are represented as Formula (1) and Formula (2) in JP1998-062986A (JP-H10-062986A), described together with the specific examples thereof, which are obtained by adding ethylene oxide or propylene oxide to a polyfunctional alcohol and then being subjected to(meth)acrylation can be used as a polymerizable monomer.

Further, the compounds described in paragraphs 0104 to 0131 of JP2015-187211A can also be used as a polymerizable monomer, the content of which is incorporated in the present specification.

As the polymerizable monomer, dipentaerythritol triacrylate (as a commercially available product, KAYARAD D-330; manufactured by Nippon Kayaku Co., Ltd.), dipentaerythritol tetraacrylate (as a commercially available product, KAYARAD D-320; Nippon Kayaku Co., Ltd., A-TMMT: manufactured by Shin-Nakamura Chemical Co., Ltd.), dipentaerythritol penta(meth)acrylate (as a commercially available product, KAYARAD D-310; manufactured by Nippon Kayaku Co., Ltd.), dipentaerythritol hexa(meth) acrylate (as a commercially available product, KAYARAD DPHA; by Nippon Kayaku Co., Ltd., A-DPH; manufactured by Shin-Nakamura Chemical Co., Ltd.), or a structure in which a (meth)acryloyl group thereof is bonded through an ethylene glycol or a propylene glycol residue is preferable. Oligomer types thereof can also be used.

Examples of the commercially available product of the polymerizable monomer include SR-494 which is a tetrafunctional acrylate having four ethyleneoxy chains, manufactured by Sartomer Co., Ltd., SR-209 which is a difunctional methacrylate having four ethyleneoxy chains, manufactured by Sartomer Co., Ltd., DPCA-60 which is a hexafunctional acrylate having six pentyleneoxy chains, manufactured by Nippon Kayaku Co., Ltd., TPA-330 which is a trifunctional acrylate having three isobutylene oxy chains, NK Ester M-40G, NK Ester 4G, NK Ester M-9300, NK Ester A-9300, UA-7200 (manufactured by Shin-Nakamura Chemical Co., Ltd.), DPHA-40H (manufactured by Nippon Kayaku Co., Ltd.), UA-306H, UA-306T, UA-306I, AH-600, T-600, AI-600 (manufactured by Kyoeisha Chemical Co., Ltd.), and Brenmer PME400 (manufactured by NOF Corporation).

As the polymerizable monomer, the urethane acrylates as described in JP1973-041708B (JP-S48-041708B), JP1976-037193A (JP-S51-037193A), JP1990-032293B (JP-H2-032293B), and JP1990-016765B (JP-H2-016765B), and the urethane compounds having an ethylene oxide-based skeleton described in JP1983-049860B (JP-S58-049860B), JP1981-017654B (JP-S56-017654B), (JP-S62-039417B), and JP1987-039417B JP1987-039418B (JP-S62-039418B) are also suitable. Further, as the polymerizable monomer, the compounds having an amino structure or a sulfide structure in a molecule as described in JP1988-277653A (JP-S63-277653A), JP1988-260909A (JP-S63-260909A), and JP1989-105238A (JP-H1-105238A) can also be used.

The polymerizable monomer may be a polymerizable monomer having an acid group such as a carboxy group, a sulfo group, or a phosphoric acid group. The polymerizable monomer having an acid group is preferably an ester of an aliphatic polyhydroxy compound and an unsaturated carboxylic acid and more preferably a polymerizable monomer obtained by reacting an unreacted hydroxy group of an aliphatic polyhydroxy compound with a non-aromatic carboxylic acid anhydride to have an acid group. The polymerizable monomer is particularly preferably a compound in which an aliphatic polyhydroxy compound is pentaerythritol and/or dipentaerythritol in a polymerizable monomer having an acid group obtained by reacting an unreacted hydroxy group of the aliphatic polyhydroxy compound with a non-aromatic carboxylic acid anhydride. Examples of the commercially available product thereof include M-510 and M-520 as polybasic acid-modified acrylic oligomers which are manufactured by Toagosei Co., Ltd.

One kind of polymerizable monomer having an acid group may be used alone, or two or more kinds thereof may be mixed and used. Further, as necessary, a polymerizable monomer having no acid group and a polymerizable monomer having an acid group may be used in combination.

The acid value of the polymerizable monomer having an acid group is preferably 0.1 to 40 mg KOH/g, and particularly preferably 5 to 30 mg KOH/g. In a case where an acid value of a polymerizable monomer is within the above range, the polymerizable monomer is excellent in manufacturing and handling, and further, excellent in developability. In addition, good polymerization properties are exhibited. The acid value is measured according to the description of JIS K 0070:1992.

From the viewpoint of good polymerizable property and heat resistance, the content of the polymerizable monomer is preferably 1% to 50% by mass with respect to the total solid content of the photosensitive resin composition according to the embodiment of the present invention. The lower limit thereof is more preferably 5% by mass or higher. The upper limit thereof is more preferably 30% by mass or less. One kind of polymerizable monomer may be used alone, or two or more kinds thereof may be mixed and used.

The mass ratio of the specific precursor to the polymerizable monomer (the specific precursor/the polymerizable monomer) is preferably 98/2 to 10/90, more preferably 95/5 to 30/70, and most preferably 90/10 to 50/50. In a case where the mass ratio of the specific precursor to the polymerizable monomer is within the above range, a cured film more excellent in polymerization properties and heat resistance can be formed.

In the photosensitive resin composition according to the embodiment of the present invention, a monofunctional polymerizable monomer can be preferably used from the viewpoint of suppressing warping associated with controlling the elastic modulus of the cured film. As the monofunctional polymerizable monomer, (meth)acrylic acid derivatives such as n-butyl (meth)acrylate, 2-ethylhexyl (meth)acrylate, 2-hydroxyethyl (meth)acrylate, butoxyethyl (meth)acrylate, carbitol(meth)acrylate, cyclohexyl (meth) acrylate, benzyl (meth)acrylate, phenoxyethyl (meth)acrylate, N-methylol (meth)acrylamide, glycidyl (meth)acrylate, polyethylene glycol mono(meth)acrylate, and polypropylene glycol mono(meth)acrylate, N-vinyl compounds such as N-vinylpyrrolidone and N-vinylcaprolactam, allyl compounds such as allyl glycidyl ether, diallyl phthalate, and triallyl trimellitate, and the like are preferably used. The monofunctional polymerizable monomer is preferably a compound having a boiling point of 100° C. or higher under ordinary atmospheric pressure in order to suppress volatilization before exposure.

<Another Polymerizable Compound>

The photosensitive resin composition according to the embodiment of the present invention may further contain another polymerizable compound other than the above-described specific precursor and radically polymerizable compound. Examples of the other polymerizable compound include a compound having a hydroxymethyl group, an alkoxymethyl group, or an acyloxymethyl group; an epoxy compound; an oxetane compound; and a benzoxazine compound.

[Compound Having Hydroxymethyl Group, Alkoxymethyl Group, or Acyloxymethyl Group]

The compound having a hydroxymethyl group, an alkoxymethyl group, or an acyloxymethyl group is preferably a compound represented by Formula (AM1).

$$R^4\left(CH_2-R^5\right)_t \tag{AM1}$$

In Formula (AM1), t represents an integer of 1 to 20, $R^4$ represents a t-valent organic group having 1 to 200 carbon atoms, $R^5$ represents a group represented by —$OR^6$ or —OC(═O)—$R^7$, $R^6$ represents a hydrogen atom or an organic group having 1 to 10 carbon atoms, and $R^7$ represents an organic group having 1 to 10 carbon atoms.

The content of the compound represented by Formula (AM1) is preferably 5 to 40 parts by mass with respect to 100 parts by mass of the specific precursor. The content thereof is preferably 10 to 35 parts by mass.

Further, it is also preferable that the content of the compound represented by Formula (AM4) is 10% to 90% by mass and the content of the compound represented by Formula (AM5) is 10% to 90% by mass, with respect to the total mass of the other polymerizable compound.

$$R^4\left(CH_2-R^5\right)_2 \tag{AM4}$$

In Formula (AM4), $R^4$ represents a divalent organic group having 1 to 200 carbon atoms, $R^5$ represents a group represented by —OR6 or —OC(═O)—$R^7$, $R^6$ represents a hydrogen atom or an organic group having 1 to 10 carbon atoms, and $R^7$ represents an organic group having 1 to 10 carbon atoms.

$$R^4\left(CH_2-R^5\right)_u \tag{AM5}$$

In Formula (AM5), u represents an integer of 3 to 8, $R^4$ represents a u-valent organic group having 1 to 200 carbon atoms, $R^5$ represents a group represented by —OR6 or —OC(═O)—$R^7$, $R^6$ represents a hydrogen atom or an organic group having 1 to 10 carbon atoms, and $R^7$ represents an organic group having 1 to 10 carbon atoms.

In a case where the above-described compound having a hydroxymethyl group or the like is used, the occurrence of cracking can be more effectively suppressed in a case where the photosensitive resin composition according to the embodiment of the present invention is applied on an uneven base material. Further, it is possible to form a cured film excellent in pattern processability and high heat resistance having a 5% mass reduction temperature of 350° C. or higher, more preferably 380° C. or higher. Specific examples of the compound represented by Formula (AM4) include 46DMOC, 46DMOEP (all trade names, manufactured by Asahi Organic Chemicals Industry Co., Ltd.), DML-MBPC, DML-MBOC, DML-OCHP, DML-PCHP, DML-PC, DML-PTBP, DML-34X, DML-EP, DML-POP, dimethylol BisOC-P, DML-PFP, DML-PSBP, DML-MTris PC (all trade names, manufactured by Honshu Chemical Industry Co., Ltd.), NIKALAC MX-290 (trade name, manufactured by Sanwa Chemical Co., Ltd.), 2,6-dimethoxymethyl-4-t-butylphenol, 2,6-dimethoxymethyl-p-cresol, and 2,6-diacetoxymethyl-p-cresol.

In addition, specific examples of the compound represented by Formula (AM5) include TriML-P, TriML-35XL, TML-HQ, TML-BP, TML-pp-BPF, TML-BPA, TMOM-BP, HML-TPPHBA, HML-TPHAP, HMOM-TPPHBA, HMOM-TPHAP (all trade name, manufactured by Honshu Chemical Industry Co., Ltd.), TM-BIP-A (trade name, manufactured by Asahi Organic Materials Industry Co., Ltd.), NIKALAC MX-280, NIKALAC MX-270, and NIKALAC MW-100 LM (all trade names, manufactured by Sanwa Chemical Co., Ltd.).

[Epoxy Compound (Compound Having Epoxy Group)]

The epoxy compound is preferably a compound having two or more epoxy groups in one molecule. Since the epoxy group undergoes a crosslinking reaction at 200° C. or lower and a dehydration reaction derived from crosslinking does not occur, film shrinkage hardly occurs. Therefore, containing an epoxy compound is effective for low-temperature curing of the photosensitive resin composition and suppression of warping of the cured film.

The epoxy compound preferably contains a polyethylene oxide group. As a result, it is possible to further decrease a modulus of elasticity and suppress warping. In addition, the flexibility of the film can be increased to obtain a cured film excellent in elongation and the like. The polyethylene oxide group means a group in which the number of repeating units of ethylene oxide is 2 or higher, and the number of repeating units is preferably 2 to 15.

Examples of the epoxy compound include a bisphenol A type epoxy resin; a bisphenol F type epoxy resin; an alkylene glycol type epoxy resin such as propylene glycol diglycidyl ether; a polyalkylene glycol type epoxy resin such as polypropylene glycol diglycidyl ether; and an epoxy group-containing silicone such as polymethyl(glycidyloxypropyl) siloxane. However, the examples thereof are not limited thereto. Specifically, EPICLON (registered trade mark) 850-S, EPICLON (registered trade mark) HP-4032, EPICLON (registered trade mark) HP-7200, EPICLON (registered trade mark) HP-820, EPICLON (registered trade mark) HP-4700, EPICLON (registered trade mark) EXA-4710, EPICLON (registered trade mark) HP-4770, EPICLON (registered trade mark) EXA-859CRP, EPICLON (registered trade mark) EXA-1514, EPICLON (registered trade mark) EXA-4880, EPICLON (registered trade mark) EXA-4850-150, EPICLON (registered trade mark) EXA-4850-1000, EPICLON (registered trade mark) EXA-4816, EPICLON (registered trade mark) EXA-4822 (all trade names, manufactured by DIC Corporation), RIKARESIN (registered trade mark) BEO-60E (trade name, manufactured by New Japan Chemical Co., Ltd.), EP-4003S, EP-4000S (all trade names, manufactured by ADEKA Corporation), and the like are mentioned. Among these, an epoxy resin containing a polyethylene oxide group is preferable from the viewpoint of suppression of warping and excellent heat resistance. For example, EPICLON (registered trade mark) EXA-4880, EPICLON (registered trade mark) EXA-4822, and RIKARESIN (registered trade mark) BEO-60E are preferable due to containing a polyethylene oxide group.

The content of the epoxy compound is preferably 5 to 50 parts by mass, more preferably 10 to 50 parts by mass, and still more preferably 10 to 40 parts by mass, with respect to 100 parts by mass of the specific precursor. In a case where the content of the epoxy compound is 5 parts by mass or more, the warping of the obtained cured film can be further suppressed, and in a case where the content thereof is 50 parts by mass or less, the pattern filling caused by the reflow at the time of curing can be further suppressed.

[Oxetane Compound (Compound Having Oxetanyl Group)]

Examples of the oxetane compound include a compound having two or more oxetane rings in one molecule, 3-ethyl-3-hydroxymethyloxetane, 1,4-bis {[(3-ethyl-3-oxetanyl) methoxy]methyl}benzene, 3-ethyl-3-(2-ethylhexylmethyl) oxetane, and 1,4-benzenedicarboxylic acid-bis[(3-ethyl-3-oxetanyl)methyl]ester. As specific examples thereof, ARON OXETANE series (for example, OXT-121, OXT-221, OXT-191, OXT-223) manufactured by Toagosei Co., Ltd., can be suitably used, and these can be used alone or two or more thereof may be mixed and used.

The content of the oxetane compound is preferably 5 to 50 parts by mass, more preferably 10 to 50 parts by mass, and still more preferably 10 to 40 parts by mass, with respect to 100 parts by mass of the specific precursor.

[Benzoxazine Compound (Compound Having Benzoxazolyl Group)]

Due to a crosslinking reaction derived from a ring-opening addition reaction, the benzoxazine compound does not result in degassing during curing and results in decreased thermal contraction, and thus the occurrence of warping is suppressed, which is preferable.

Preferred examples of the benzoxazine compound include B-a type benzoxazine, B-m type benzoxazine (all trade names, manufactured by Shikoku Chemicals Corporation), a benzoxazine adduct of polyhydroxystyrene resin, and a phenol novolak type dihydrobenzo oxazine compound. These may be used alone or two or more thereof may be mixed and used.

The content of the benzoxazine compound is preferably 5 to 50 parts by mass, more preferably 10 to 50 parts by mass, and still more preferably 10 to 40 parts by mass, with respect to 100 parts by mass of the specific precursor.

<Migration Suppressing Agent>

The photosensitive resin composition preferably further contains a migration suppressing agent. In a case where a migration suppressing agent is contained, for example, it is possible to effectively suppress the migration of a compound from the outside to the inside of the photosensitive resin composition, for example, the migration of metal ions derived from a metal layer (a metal wire) from the outside to the inside of the photosensitive film.

The migration suppressing agent is no particularly limited; however, examples thereof include a compound having a heterocyclic ring (a pyrrole ring, a furan ring, a thiophene ring, an imidazole ring, an oxazole ring, a thiazole ring, a pyrazole ring, an isoxazole ring, an isothiazole ring, a tetrazole ring, a pyridine ring, a pyridazine ring, a pyrimidine ring, a pyrazine ring, a piperidine ring, a piperazine ring, a morpholine ring, a 2H-pyran ring and a 6H-pyran ring, or a triazine ring), a compound having thioureas and a mercapto group, a hindered phenol-based compound, a salicylic acid derivative-based compound, and a hydrazide derivative-based compound. In particular, triazole-based compounds such as triazole and benzotriazole, and tetrazole-based compounds such as tetrazole and benzotetrazole can be preferably used.

In addition, an ion trapping agent that captures an anion such as a halogen ion can also be used.

As other migration suppressing agents, the rust inhibitors described in paragraph 0094 of JP2013-015701A, the compounds described in paragraphs 0073 to 0076 of JP2009-283711A, the compounds described in paragraph 0052 of JP2011-059656A, the compounds described in paragraphs 0114, 0116, and 0118 of JP2012-194520A, or the like can be used.

Specific examples of the migration suppressing agent include 1H-1,2,3-triazole and 1H-tetrazole.

In a case where the photosensitive resin composition contains the migration suppressing agent, the content of the migration suppressing agent is preferably 0.01% to 5.0% by mass, more preferably 0.05% to 2.0% by mass, and still more preferably 0.1% to 1.0% by mass, with respect to the total solid content of the photosensitive resin composition.

One kind of migration suppressing agent may be used alone, or two or more kinds thereof may be used. In a case where two or more kinds of migration suppressing agents are used, the total thereof is preferably within the above-described range.

<Polymerization Inhibitor>

The photosensitive resin composition according to the embodiment of the present invention preferably contains a polymerization inhibitor.

As the polymerization inhibitor, for example, hydroquinone, p-methoxyphenol, di-tert-butyl-p-cresol, pyrogallol, p-tert-butylcatechol, p-benzoquinone, diphenyl-p-benzoquinone, 4,4'-thiobis(3-methyl-6-tert-butylphenol), 2,2'-methylenebis(4-methyl-6-tert-butylphenol), N-nitroso-N-phenylhydroxyamine aluminum salt, phenothiazine, N-nitrosodiphenylamine, N-phenyl naphthylamine, ethylenediamine tetraacetic acid, 1,2-cyclohexanediamine tetraacetic acid, glycol ether diamine tetraacetic acid, 2,6-di-tert-butyl-4-methyl phenol, 5-nitroso-8-hydroxyquinoline, 1-nitroso-2-naphtoyl, 2-nitroso-1-naphtoyl, 2-nitroso-5-(N-ethyl-N-sulfopropylamino) phenol, N-nitroso-N-(1-naphthyl) hydroxyamine ammonium salt, bis(4-hydroxy-3,5-tert-butyl)phenylmethane, and the like are suitably used. In addition, the polymerization inhibitors described in paragraph 0060 of JP2015-127817A and the compounds described in paragraphs 0031 to 0046 of WO2015/125469A can also be used.

In addition, the following compounds can be used (Me is a methyl group).

F-1

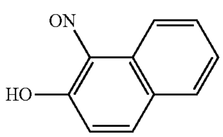

F-2

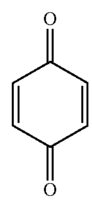

F-3

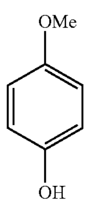

In a case where the photosensitive resin composition according to the embodiment of the present invention contains a polymerization inhibitor, the content of the polymerization inhibitor is preferably 0.01% to 5% by mass with respect to the total solid content of the photosensitive resin composition according to the embodiment of the present invention.

One kind of polymerization inhibitor may be used, or two or more kinds thereof may be used. In a case where two or more kinds of polymerization inhibitors are used, the total thereof is preferably within the above-described range.

<Metal Adhesiveness Improving Agent>

The photosensitive resin composition according to the embodiment of the present invention preferably contains a metal adhesiveness improving agent for improving adhesiveness to another member, for example, a metal material that is used for an electrode, a wire, and the like. Examples of the metal adhesiveness improving agent include a silane coupling agent.

Examples of the silane coupling agent include the compounds described in paragraphs 0062 to 0073 of JP2014-191002A, the compounds described in paragraphs 0063 to 0071 of WO2011/080992A, the compounds described in paragraphs 0060 and 0061 of JP2014-191252A, the compounds described in paragraphs 0045 to 0052 of JP2014-041264A, and the compounds described in paragraph 0055 of WO2014/097594A. In addition, it is also preferable to use two or more kinds of different silane coupling agents as described in paragraphs 0050 to 0058 of JP2011-128358A. In addition, as the silane coupling agent, the following compounds are also preferably used. In the following formulae, Et represents an ethyl group.

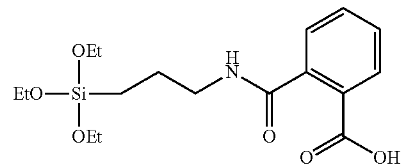

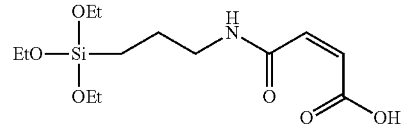

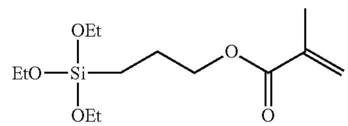

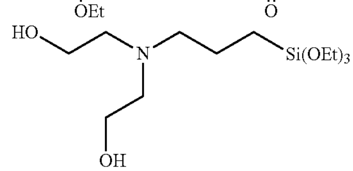

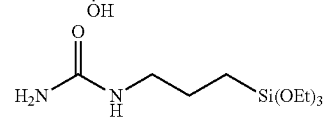

In addition, as the metal adhesiveness improving agent, the compounds described in paragraphs 0046 to 0049 of JP2014-186186A, and the sulfide-based compounds described in paragraphs 0032 to 0043 of JP2013-072935A can also be used.

The content of the metal adhesiveness improving agent is preferably 0.1 to 30 parts by mass and more preferably 0.5 to 15 parts by mass, with respect to 100 parts by mass of the specific precursor. In a case where the content thereof is 0.1 parts by mass or more, good adhesiveness between a cured film and, for example, a metal layer after a curing step is exhibited, and in a case where the content is 30 parts by mass or less, heat resistance of the cured film after the curing step and mechanical properties are exhibited. One kind of metal adhesiveness improving agent may be used, or two or more kinds thereof may be used. In a case where two or more kinds thereof are used, the total content thereof is preferably within the above-described range.

<Other Additives>

Various additives, for example, a thermal acid generator, a photoacid generator, a sensitizing dye, a chain transfer agent, a surfactant, a higher fatty acid derivative, an inorganic particle, a curing agent, a curing catalyst, a filler, an antioxidant, an ultraviolet absorbent, and an aggregation inhibitor can be blended, as necessary, with the photosensitive resin composition according to the embodiment of the present invention to the extent that an effect of the present invention is not impaired. In a case where these additives are blended, the total blending amount thereof is preferably 3% by mass or lower of the solid content of the photosensitive resin composition.

[Thermal Acid Generator]

The photosensitive resin composition according to the embodiment of the present invention may contain a thermal acid generator. The thermal acid generator generates an acid upon being heated, promotes cyclization of a specific precursor, and further improves the mechanical properties of the cured film. Examples of thermal acid generator include the compounds described in paragraph 0059 of JP2013-167742A, the content of which is incorporated in the present specification.

The content of thermal acid generator is preferably 0.01 parts by mass or more and more preferably 0.1 part by mass or more, with respect to 100 parts by mass of the specific precursor. In a case where 0.01 part by mass or more of thermal acid generator is contained, the crosslinking reaction and the cyclization of the specific precursor are promoted, and thus the mechanical properties and chemical resistance of the cured film can be further improved. From the viewpoint of the electrical insulation properties of the cured film, the content of thermal acid generator is preferably 20 parts by mass or less, more preferably 15 parts by mass or less, and particularly preferably 10 parts by mass or less.

One kind of thermal acid generator may be used, or two or more kinds may be used. In a case where two or more kinds thereof are used, the total amount is preferably within the above-described range.

[Sensitizing Dye]

The photosensitive resin composition according to the embodiment of the present invention may contain a sensitizing dye. The sensitizing dye absorbs specific actinic radiation to be an electronically excited state. The sensitizing dye in the electronically excited state is brought into contact with a photoradical polymerization initiator or the like and exhibits actions such as electron transfer, energy transfer, and heat generation. As a result, for example, a photoradical polymerization initiator undergoes a chemical change and is decomposed to generate radicals. In addition, an onium salt is activated by energy transfer and improves the ring closure efficiency of the specific precursor. For details of the sensitizing dye, reference can be made to the description in paragraphs 0161 to 0163 of JP2016-027357A, the content of which is incorporated in the present specification.

15% by mass, and still more preferably 0.5% to 10% by mass, with respect to the total solid content of the photosensitive resin composition according to the embodiment of the present invention. One kind of sensitizing dye may be used alone, or two or more kinds thereof may be used in combination.

[Chain Transfer Agent]

The photosensitive resin composition according to the embodiment of the present invention may contain a chain transfer agent. The chain transfer agent is defined, for example, in Polymer Dictionary, 3rd Edition, pp. 683 to 684 (edited by The Society of Polymer Science, 2005). As the chain transfer agent, for example, a group of compounds having SH, PH, SiH, or GeH in the molecule is used. These can donate hydrogen to a low active radical to generate a radical or can be oxidized and then deprotonated to generate a radical. In particular, thiol compounds (for example, 2-mercaptobenzimidazoles, 2-mercaptobenzthiazoles, 2-mercaptobenzoxazoles, 3-mercaptotriazoles, and 5-mercaptotetrazol) can be preferably used.

In a case where the photosensitive resin composition according to the embodiment of the present invention contains a chain transfer agent, the content of the chain transfer agent is preferably 0.01 to 20 parts by mass, more preferably 1 to 10 parts by mass, and still more preferably 1 to 5 parts by mass, with respect to 100 parts by mass of the total solid content of the photosensitive resin composition according to the embodiment of the present invention. One kind of chain transfer agent may be used, or two or more kinds thereof may be used. In a case where two or more kinds of chain transfer agents are used, the total thereof is preferably within the above-described range.

(Surfactant)

From the viewpoint of further improving the coating property, each kind of surfactant may be added to the photosensitive resin composition according to the embodiment of the present invention. As the surfactant, each kind of surfactant such as a fluorine-based surfactant, a nonionic surfactant, a cationic surfactant, an anionic surfactant, or a silicone-based surfactant can be used. In addition, the following surfactants are preferably used. In the following formula, the number indicated together with the parenthesis in the main chain means the content (% by mole) of each of the constitutional units of the main chain, and the number indicated together with the parenthesis in the side chain means the number of repetitions of each constitutional units of the side chain.

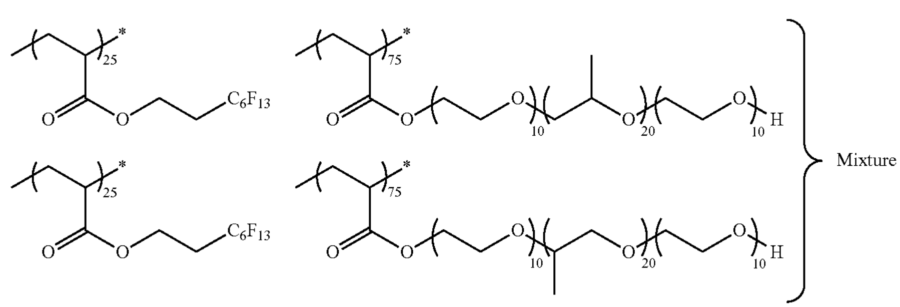

In a case where the photosensitive resin composition according to the embodiment of the present invention contains a sensitizing dye, the content of the sensitizing dye is preferably 0.01% to 20% by mass, more preferably 0.1% to In a case where the photosensitive resin composition according to the embodiment of the present invention contains a surfactant, the content of the surfactant is preferably 0.001% to 2.0% by mass, with respect to the total solid content of the photosensitive resin composition according to the embodiment of the present invention, and more preferably 0.005% to 1.0% by mass. One kind of surfactant may be used, or two or more kinds thereof may be used. In a case where two or more kinds of surfactants are used, the total thereof is preferably within the above-described range.

[Higher Fatty Acid Derivative]

In the photosensitive resin composition according to the embodiment of the present invention, in order to prevent polymerization inhibition due to oxygen, a higher fatty acid derivative such as behenic acid or behenic acid amide may be added and be caused to be localized on a surface of the photosensitive resin composition in the process of drying after coating.

In a case where the photosensitive resin composition according to the embodiment of the present invention contains a higher fatty acid derivative, the content of the higher fatty acid derivative is preferably 0.1% to 10% by mass with respect to the total solid content of the photosensitive resin composition according to the embodiment of the present invention. One kind of higher fatty acid derivative may be used, or two or more kinds thereof may be used. In a case where two or more higher fatty acid derivatives are used, the total thereof is preferably within the above-described range.

<Restriction on Other Substances to be Contained>

The water content of the photosensitive resin composition according to the embodiment of the present invention is preferably less than 5% by mass, more preferably less than 1% by mass, and particularly preferably less than 0.6% by mass, from the viewpoint of properties of a coated surface.

Examples of the method of maintaining the water content include adjusting the humidity under storage conditions and reducing the void volume of the storage container.

From the viewpoint of insulating properties, the metal content of the photosensitive resin composition according to the embodiment of the present invention is preferably less than 5 parts per million (ppm) by mass, more preferably less than 1 ppm by mass, and particularly preferably less than 0.5 ppm by mass. Examples of the metal include sodium, potassium, magnesium, calcium, iron, chromium, nickel, and. In a case where a plurality of metals are contained, the total of these metals is preferably within the above-described range.

In addition, as a method of reducing metal impurities which are unintentionally contained in the photosensitive resin composition according to the embodiment of the present invention, a method of selecting a raw material which contains a low metal content as the raw material constituting the photosensitive resin composition according to the embodiment of the present invention, a method of filtering the raw material constituting the photosensitive resin composition according to the embodiment of the present invention, a method of distilling under the condition in which the inside of the device is lined with polytetrafluoroethylene or the like to suppress the contamination as little as possible, and the like can be mentioned.

In the photosensitive resin composition according to the embodiment of the present invention, the content of halogen atoms is preferably less than 500 ppm by mass, more preferably less than 300 ppm by mass, and particularly preferably less than 200 ppm by mass, from the viewpoint of wire corrosiveness. Among these, in a case of being present in a halogen ion state, the content is preferably less than 5 ppm by mass, more preferably less than 1 ppm by mass, and particularly preferably less than 0.5 ppm by mass. Examples of the halogen atom include a chlorine atom and a bromine atom. It is preferable that the total content of the chlorine atom and the bromine atom, or the total content of the chlorine ion and the bromine ion is within the above-described range.

As a method of adjusting the content of halogen atoms, ion exchange treatment and the like are preferably mentioned.

As a storage container of the photosensitive resin composition according to the embodiment of the present invention, a conventionally known storage container can be used. In addition, as the storage container, for the intended purpose of suppressing incorporation of impurities into the raw materials and the photosensitive resin composition, a multilayer bottle in which an inner wall of a container is composed of six kinds of six layers of resin, and a bottle with six kinds of resin being made as a seven-layer structure are preferably used. Examples of such a storage container include the container described in JP2015-123351A, the content of which is incorporated in the present specification.

<Preparation of Photosensitive Resin Composition>

The photosensitive resin composition according to the embodiment of the present invention can be prepared by mixing the above-described components. The mixing method is not particularly limited, and mixing can be carried out by methods conventionally known in the related art.

In addition, for the intended purpose of removing foreign substances such as dust and fine particles in the photosensitive resin composition, it is preferable to carry out filtration using a filter. A filter pore size is preferably 1 μm or lower, more preferably 0.5 μm or lower, and still more preferably 0.1 μm or lower. A material of the filter is preferably polytetrafluoroethylene, polyethylene, or nylon. As the filter, a filter which has been previously washed with an organic solvent may be used. In the filtration step using the filter, a plurality of kinds of filters may be connected in series or in parallel and used. In a case where a plurality of kinds of filters are used, filters having different pore sizes and/or different materials may be used in combination. In addition, various materials may be filtered a plurality of times. In a case of being filtered a plurality of times, circulation filtration may be used. In addition, filtration may be carried out under pressure. In a case where filtration is carried out under pressure, the pressure is preferably 0.05 MPa to 0.3 MPa.

In addition to filtration using a filter, impurity removal treatment using an adsorption material may be carried out. The filtration using a filter and the impurity removal treatment using an adsorption material may be combined. As the adsorption material, a conventionally known adsorption material can be used. Examples thereof include an inorganic adsorption material such as silica gel and zeolite and an organic adsorption material such as activated carbon.

(Cured Film)

The cured film according to the embodiment of the present invention is formed from the photosensitive resin composition according to the embodiment of the present invention.

The method of manufacturing a cured film is not particularly limited; however, for example, the cured film of the present invention is obtained by carrying out the photosensitive film forming step, the exposure step, the development step, and the heating step in the pattern forming method according to the embodiment of the present invention described above. In addition, the cured film according to the embodiment of the present invention is obtained by the laminating step described above.

The film thickness of the cured film according to the embodiment of the present invention can be, for example, 0.5 μm or higher, and 1 μm or higher. In addition, the upper limit value thereof can be set to 100 μm or lower or can be set to 30 μm or lower.

As a field to which the cured film according to the embodiment of the present invention can be applied, an insulating film of a semiconductor device, an interlayer insulating film for a rewiring layer, and the like are mentioned. In particular, due to the good resolution, the cured film according to the embodiment of the present invention is preferably used as an interlayer insulating film for a rewiring layer, and more preferably used as an interlayer insulating film for a rewiring layer in a three-dimensional mounting device. The above-described cured film is also suitably used as an interlayer insulating film in the Fan-Out type semiconductor device described above.

In addition, the cured film according to the embodiment of the present invention can also be used for the production of board surfaces such as an offset board surface or a screen board surface, for etching of molded parts, for the production of protective lacquers and dielectric layers in electronics, in particular, microelectronics, and the like.

(Laminate)

The laminate of the present invention may contain only one layer of the cured film according to the embodiment of the present invention; however, it preferably contains two or more layers thereof.

The laminate according to the embodiment of the present invention preferably further contains a metal layer between the cured films. Such a metal layer is preferably used as the metal wire of the rewiring layer or the like.

The laminate of the present invention can be obtained, for example, by repeating the laminating step in the pattern forming method according to the embodiment of the present invention a plurality of times.

Further, the metal layer can be obtained, for example, by repeating the metal layer forming step in the pattern forming method according to the embodiment of the present invention a plurality of times.

The device of the present invention includes the cured film according to the embodiment of the present invention or the laminate of the present invention. The device according to the embodiment of the present invention is suitably used as, for example, a semiconductor device. For example, as the specific example of the semiconductor device using the photosensitive resin composition according to the embodiment of the present invention for forming an interlayer insulating film for a rewiring layer, the description in paragraphs 0213 to 0218 and the description of FIG. 1 of JP2016-027357A can be referred to, the content of which is incorporated in the present specification.

EXAMPLES

Hereinafter, the present invention will be described more specifically with reference to Examples. Materials, amounts used, proportions, treatment details, treatment procedures, and the like shown in the following examples can be appropriately changed without departing from the gist of the present invention. Unless otherwise specified, "%" and "parts" are based on mass.

Examples, Comparative Examples

Preparation of Photosensitive Resin Composition

In each Example or Comparative Example, a photosensitive resin composition was prepared a solution by mixing each of the components shown in any one of Table 1 to Table 6 below according to the amount shown in any one of Table 1 to Table 6 below.

The description in the column of "Kind" in Table 1 to Table 6 indicates the kind of the compound used, the numerical value in the column of "Content" indicates the content (part by mass) of each of the components, and "-" indicates that the corresponding component was not used. In the tables, the description of "A-1/A-2" in the row of "Kind" together with "16.7/20" in the row of "Content", or the like, indicates that 16.7 parts by mass of A-1 and 20 parts by mass of A-2 are contained.

TABLE 1

| | | Example | | | | | | | |
|---|---|---|---|---|---|---|---|---|---|
| | | 1 | 2 | 3 | 4 | 5 | 6 | 7 | 8 |
| Specific precursor | Kind | A-3 | A-3 | A-3 | A-3 | A-1/A-2 | A-5 | A-3/A-5 | A-3 |
| | Content | 36.7 | 36.7 | 36.7 | 36.7 | 16.7/20 | 36.7 | 20/16.7 | 36.8 |
| Onium salt | Kind | D-1 | D-1 | D-1 | D-1 | D-1 | D-1 | D-1 | D-1 |
| | Content | 0.9 | 0.9 | 0.9 | 0.9 | 0.9 | 0.9 | 0.9 | 0.25 |
| Sulfurous ester structure | Kind | B-1 | B-1 | — | — | B-1 | B-1 | B-1 | B-1 |
| | Content | 1 | 1 | — | — | 1 | 1 | 1 | 1 |
| Group 4 element-containing compound | Kind | C-3 | C-3 | — | — | C-3 | C-3 | C-3 | — |
| | Content | 1.3 | 1.3 | — | — | 1.3 | 1.3 | 1.3 | — |
| Radically polymerizable compound | Kind | E-1 | E-1 | E-1 | E-1 | E-1 | E-1 | E-1 | E-1 |
| | Content | 4.5 | 4.5 | 5.5 | 5.5 | 4.5 | 4.5 | 4.5 | 4.5 |
| Photoradical polymerization initiator | Kind | — | — | F-1 | F-1 | — | — | — | F-1 |
| | Content | — | — | 1.3 | 1.3 | — | — | — | 1.3 |
| Polymerization inhibitor | Kind | G-2 | G-2 | G-2 | G-2 | G-2 | G-2 | G-2 | G-2 |
| | Content | 0.1 | 0.1 | 0.1 | 0.1 | 0.1 | 0.1 | 0.1 | 0.1 |
| Migration suppressing agent | Kind | H-2 | H-2 | H-2 | H-2 | H-2 | H-2 | H-2 | H-2 |
| | Content | 0.1 | 0.1 | 0.1 | 0.1 | 0.1 | 0.1 | 0.1 | 0.1 |
| Metal adhesiveness improving agent | Kind | I-2 | I-2 | I-2 | I-2 | I-2 | I-2 | I-2 | I-2 |
| | Content | 0.7 | 0.7 | 0.7 | 0.7 | 0.7 | 0.7 | 0.7 | 0.7 |
| Carboxylic group-containing compound | Kind | K-1 | K-1 | K-1 | K-1 | K-1 | K-1 | K-1 | K-1 |
| | Content | 0.1 | 0.1 | 0.1 | 0.1 | 0.1 | 0.1 | 0.1 | 0.05 |

TABLE 1-continued

| | | Example 1 | 2 | 3 | 4 | 5 | 6 | 7 | 8 |
|---|---|---|---|---|---|---|---|---|---|
| Other component | Kind | — | — | — | — | — | — | — | — |
| | Content | — | — | — | — | — | — | — | — |
| Solvent | Kind | J-1/J-2 | J-1/J-2 | J-1/J-2 | J-1/J-2 | J-1/J-2 | J-1/J-2 | J-1/J-2 | J-1/J-2 |
| | Content | 43.7/10.9 | 43.7/10.9 | 43.7/10.9 | 43.7/10.9 | 43.7/10.9 | 43.7/10.9 | 43.7/10.9 | 44.2/11 |
| Laser exposure wavelength (nm) | | 405 | 355 | 405 | 355 | 405 | 405 | 405 | 355 |
| Chemical resistance | | A | A | B | B | A | A | A | A |
| Surface roughness | | A | A | B | B | A | A | A | B |

TABLE 2

| | | Example 9 | 10 | 11 | 12 | 13 | 14 | 15 | 16 |
|---|---|---|---|---|---|---|---|---|---|
| Specific precursor | Kind | A-3 | A-3 | A-3 | A-3 | A-3 | A-3 | A-3 | A-3 |
| | Content | 36.8 | 36.8 | 36.7 | 36.7 | 36.7 | 35.6 | 35.7 | 36.8 |
| Onium salt | Kind | D-1 | D-1 | D-2 | D-3 | D-4 | D-1 | D-1 | D-1 |
| | Content | 0.25 | 0.25 | 0.9 | 0.9 | 0.9 | 0.9 | 0.9 | 0.25 |
| Sulfurous ester structure | Kind | B-2 | B-3 | B-1 | B-1 | B-1 | B-1 | B-1 | B-1 |
| | Content | 1 | 1 | 1 | 1 | 1 | 1 | 1 | 1 |
| Group 4 element-containing compound | Kind | — | — | C-3 | C-3 | C-3 | C-3 | C-3 | — |
| | Content | — | — | 1.3 | 1.3 | 1.3 | 1.3 | 1.3 | — |
| Radically polymerizable compound | Kind | E-1 | E-1 | E-1 | E-1 | E-1 | E-1 | E-2 | E-1 |
| | Content | 4.5 | 4.5 | 4.5 | 4.5 | 4.5 | 4.5 | 4.5 | 4.5 |
| Photoradical polymerization initiator | Kind | F-1 | F-1 | — | — | — | F-1 | F-2 | F-1 |
| | Content | 1.3 | 1.3 | — | — | — | 1 | 1 | 1.3 |
| Polymerization inhibitor | Kind | G-2 | G-2 | G-2 | G-2 | G-2 | G-2 | G-1 | G-2 |
| | Content | 0.1 | 0.1 | 0.1 | 0.1 | 0.1 | 0.1 | 0.1 | 0.1 |
| Migration suppressing agent | Kind | H-2 | H-2 | H-2 | H-2 | H-2 | H-1/H-2 | H-2 | H-2 |
| | Content | 0.1 | 0.1 | 0.1 | 0.1 | 0.1 | 0.1/0.1 | 0.1 | 0.1 |
| Metal adhesiveness improving agent | Kind | I-2 | I-2 | I-2 | I-2 | I-2 | I-2 | I-1 | I-2 |
| | Content | 0.7 | 0.7 | 0.7 | 0.7 | 0.7 | 0.7 | 0.7 | 0.7 |
| Carboxylic group-containing compound | Kind | K-1 | K-1 | K-1 | K-1 | K-1 | K-2 | K-1 | K-1 |
| | Content | 0.05 | 0.05 | 0.1 | 0.1 | 0.1 | 0.1 | 0.1 | 0.05 |
| Other component | Kind | — | — | — | — | — | — | — | — |
| | Content | — | — | — | — | — | — | — | — |
| Solvent | Kind | J-1/J-2 | J-1/J-2 | J-1/J-2 | J-1/J-2 | J-1/J-2 | J-1/J-2 | J-1/J-2 | J-3 |
| | Content | 44.2/11 | 44.2/11 | 43.7/10.9 | 43.7/10.9 | 43.7/10.9 | 43.7/10.9 | 43.7/10.9 | 55.2 |
| Laser exposure wavelength (nm) | | 355 | 355 | 405 | 405 | 405 | 405 | 405 | 355 |
| Chemical resistance | | B | B | A | A | A | A | A | A |
| Surface roughness | | B | B | A | A | A | A | A | B |

TABLE 3

| | | Example 17 | 18 | 19 | 20 | 21 | 22 | 23 | 24 |
|---|---|---|---|---|---|---|---|---|---|
| Specific precursor | Kind | A-1/A-2 | A-1/A-2 | A-3 | A-3 | A-3 | A-3 | A-3 | A-3 |
| | Content | 16.7/19 | 16.7/19 | 37.5 | 37.3 | 34.6 | 22.02 | 22.08 | 36.8 |
| Onium salt | Kind | D-1 | D-1 | D-1 | D-1 | D-1 | D-1 | D-1 | D-1 |
| | Content | 0.9 | 0.9 | 0.1 | 0.3 | 3 | 0.54 | 0.15 | 0.9 |
| Sulfurous ester structure | Kind | B-1 | B-1 | B-1 | B-1 | B-1 | B-1 | B-1 | B-1 |
| | Content | 1 | 1 | 1 | 1 | 1 | 0.6 | 0.6 | 1 |
| Group 4 element-containing compound | Kind | C-1/C-5/C-6 | C-2/C-3/C-4 | C-3 | C-3 | C-3 | C-3 | — | C-3 |
| | Content | 0.5/0.4/0.4 | 0.4/0.5/0.4 | 1.3 | 1.3 | 1.3 | 0.78 | — | 1.3 |
| Radically polymerizable compound | Kind | E-1 | E-1 | E-1 | E-1 | E-1 | E-1 | E-1 | E-1 |
| | Content | 4.5 | 4.5 | 4.5 | 4.5 | 4.5 | 2.7 | 2.7 | 4.5 |

TABLE 3-continued

| | | Example | | | | | | | |
|---|---|---|---|---|---|---|---|---|---|
| | | 17 | 18 | 19 | 20 | 21 | 22 | 23 | 24 |
| Photoradical polymerization initiator | Kind | F-1 | F-1 | — | — | — | — | F-1 | — |
| | Content | 1 | 1 | — | — | — | — | 0.78 | — |
| Polymerization inhibitor | Kind | G-2 | G-2 | G-2 | G-2 | G-2 | G-2 | G-2 | G-2 |
| | Content | 0.1 | 0.1 | 0.1 | 0.1 | 0.1 | 0.06 | 0.06 | 0.1 |
| Migration suppressing agent | Kind | H-2 | H-2 | H-2 | H-2 | H-2 | H-2 | H-2 | H-2 |
| | Content | 0.1 | 0.1 | 0.1 | 0.1 | 0.1 | 0.06 | 0.06 | 0.1 |
| Metal adhesiveness improving agent | Kind | I-2 | I-2 | I-2 | I-2 | I-2 | I-2 | I-2 | I-2 |
| | Content | 0.7 | 0.7 | 0.7 | 0.7 | 0.7 | 0.42 | 0.42 | 0.7 |
| Carboxylic group-containing compound | Kind | K-1 | K-1 | K-1 | K-1 | K-1 | K-1 | K-1 | — |
| | Content | 0.1 | 0.1 | 0.1 | 0.1 | 0.1 | 0.06 | 0.03 | — |
| Other component | Kind | — | — | — | — | — | — | — | — |
| | Content | — | — | — | — | — | — | — | — |
| Solvent | Kind | J-1/J-2 | J-1/J-2 | J-1/J-2 | J-1/J-2 | J-1/J-2 | J-1/J-2 | J-1/J-2 | J-1/J-2 |
| | Content | 43.7/10.9 | 43.7/10.9 | 43.7/10.9 | 43.7/10.9 | 43.7/10.9 | 58.26/14.5 | 58.54/14.58 | 43.7/10.9 |
| Laser exposure wavelength (nm) | | 405 | 405 | 405 | 405 | 405 | 405 | 355 | 405 |
| Chemical resistance | | A | A | B | A | B | A | A | A |
| Surface roughness | | A | A | A | A | A | A | B | B |

TABLE 4

| | | Example | | | | | | | |
|---|---|---|---|---|---|---|---|---|---|
| | | 25 | 26 | 27 | 28 | 29 | 30 | 31 | 32 |
| Specific precursor | Kind | A-3 | A-3 | A-6 | A-6 | A-3 | A-3 | A-4/A-3 | A-3 |
| | Content | 36.6 | 36.6 | 36.7 | 36.7 | 36.6 | 36.6 | 16.7/20 | 36.8 |
| Onium salt | Kind | D-1 | D-1 | D-1 | D-1 | D-1 | D-1 | D-1 | D-4 |
| | Content | 0.9 | 0.9 | 0.9 | 0.9 | 0.9 | 0.9 | 0.9 | 0.9 |
| Sulfurous ester structure | Kind | B-1 | B-1 | B-1 | B-1 | — | — | B-1 | B-2 |
| | Content | 1 | 1 | 1 | 1 | — | — | 1 | 1 |
| Group 4 element-containing compound | Kind | C-3 | C-3 | C-3 | C-3 | — | — | C-3 | C-3 |
| | Content | 1.3 | 1.3 | 1.3 | 1.3 | — | — | 1.3 | 1.3 |
| Radically polymerizable compound | Kind | E-1 | E-1 | E-1 | E-1 | E-1 | E-1 | E-1 | E-1 |
| | Content | 4.5 | 4.5 | 4.5 | 4.5 | 5.5 | 5.5 | 4.5 | 4.5 |
| Photoradical polymerization initiator | Kind | — | — | — | — | F-1 | F-1 | — | — |
| | Content | — | — | — | — | 1.3 | 1.3 | — | — |
| Polymerization inhibitor | Kind | G-2 | G-2 | G-2 | G-2 | G-2 | G-2 | G-2 | G-2 |
| | Content | 0.1 | 0.1 | 0.1 | 0.1 | 0.1 | 0.1 | 0.1 | 0.1 |
| Migration suppressing agent | Kind | H-2 | H-2 | H-2 | H-2 | H-2 | H-2 | H-2 | H-2 |
| | Content | 0.1 | 0.1 | 0.1 | 0.1 | 0.1 | 0.1 | 0.1 | 0.1 |
| Metal adhesiveness improving agent | Kind | I-2 | I-2 | I-2 | I-2 | I-2 | I-2 | I-2 | I-2 |
| | Content | 0.7 | 0.7 | 0.7 | 0.7 | 0.7 | 0.7 | 0.7 | 0.7 |
| Carboxylic group-containing compound | Kind | K-1 | K-1 | K-1 | K-1 | K-1 | K-1 | K-1 | — |
| | Content | 0.1 | 0.1 | 0.1 | 0.1 | 0.1 | 0.1 | 0.1 | — |
| Other component | Kind | L-1 | L-2 | — | — | L-2 | L-1 | — | — |
| | Content | 0.1 | 0.1 | — | — | 0.1 | 0.1 | — | — |
| Solvent | Kind | J-1/J-2 | J-1/J-2 | J-1/J-2 | J-1/J-2 | J-1/J-2 | J-1/J-2 | J-1/J-2 | J-1/J-2 |
| | Content | 43.7/10.9 | 43.7/10.9 | 43.7/10.9 | 43.7/10.9 | 43.7/10.9 | 43.7/10.9 | 43.7/10.9 | 43.7/10.9 |
| Laser exposure wavelength (nm) | | 405 | 355 | 405 | 355 | 405 | 355 | 405 | 405 |
| Chemical resistance | | A | A | A | A | B | B | A | A |
| Surface roughness | | A | A | A | A | B | B | A | B |

TABLE 5

| | | Example | | | | | | | |
|---|---|---|---|---|---|---|---|---|---|
| | | 33 | 34 | 35 | 36 | 37 | 38 | 39 | 40 |
| Specific precursor | Kind | A-3 | A-3 | A-6 | A-6 | A-4/A-3 | A-3 | A-3 | A-3 |
| | Content | 36.6 | 36.6 | 36.7 | 36.7 | 16.7/20 | 36.7 | 36.7 | 36.7 |
| Onium salt | Kind | D-4 | D-4 | D-4 | D-4 | D-4 | D-2 | D-3 | D-4 |
| | Content | 0.9 | 0.9 | 0.9 | 0.9 | 0.9 | 0.9 | 0.9 | 0.9 |
| Sulfurous ester structure | Kind | B-2 | B-2 | B-2 | B-2 | B-2 | B-3 | B-3 | B-3 |
| | Content | 1 | 1 | 1 | 1 | 1 | 1 | 1 | 1 |
| Group 4 element-containing compound | Kind | C-3 | C-3 | C-3 | C-3 | C-3 | C-3 | C-3 | C-3 |
| | Content | 1.3 | 1.3 | 1.3 | 1.3 | 1.3 | 1.3 | 1.3 | 1.3 |
| Radically polymerizable compound | Kind | E-1 | E-1 | E-1 | E-1 | E-1 | E-1 | E-1 | E-1 |
| | Content | 4.5 | 4.5 | 4.5 | 4.5 | 4.5 | 4.5 | 4.5 | 4.5 |
| Photoradical polymerization initiator | Kind | — | — | — | — | — | — | — | — |
| | Content | — | — | — | — | — | — | — | — |
| Polymerization inhibitor | Kind | G-2 | G-2 | G-2 | G-2 | G-2 | G-2 | G-2 | G-2 |
| | Content | 0.1 | 0.1 | 0.1 | 0.1 | 0.1 | 0.1 | 0.1 | 0.1 |
| Migration suppressing agent | Kind | H-2 | H-2 | H-2 | H-2 | H-2 | H-2 | H-2 | H-2 |
| | Content | 0.1 | 0.1 | 0.1 | 0.1 | 0.1 | 0.1 | 0.1 | 0.1 |
| Metal adhesiveness improving agent | Kind | I-2 | I-2 | I-2 | I-2 | I-2 | I-2 | I-2 | I-2 |
| | Content | 0.7 | 0.7 | 0.7 | 0.7 | 0.7 | 0.7 | 0.7 | 0.7 |
| Carboxylic group-containing compound | Kind | K-1 | K-1 | K-1 | K-1 | K-1 | K-1 | K-1 | K-1 |
| | Content | 0.1 | 0.1 | 0.1 | 0.1 | 0.1 | 0.1 | 0.1 | 0.1 |
| Other component | Kind | L-1 | L-2 | — | — | — | — | — | — |
| | Content | 0.1 | 0.1 | — | — | — | — | — | — |
| Solvent | Kind | J-1/J-2 | J-1/J-2 | J-1/J-2 | J-1/J-2 | J-1/J-2 | J-1/J-2 | J-1/J-2 | J-1/J-2 |
| | Content | 43.7/10.9 | 43.7/10.9 | 43.7/10.9 | 43.7/10.9 | 43.7/10.9 | 43.7/10.9 | 43.7/10.9 | 43.7/10.9 |
| Laser exposure wavelength (nm) | | 405 | 355 | 405 | 355 | 405 | 405 | 405 | 405 |
| Chemical resistance | | A | A | A | A | A | B | B | B |
| Surface roughness | | A | A | A | A | A | A | A | A |

TABLE 6

| | | Example | | | | | Comparative Example | | |
|---|---|---|---|---|---|---|---|---|---|
| | | 41 | 42 | 43 | 44 | 45 | 1 | 2 | 3 |
| Specific precursor | Kind | A-3 | A-3 | A-3 | A-1/A-2 | A-1/A-2 | A-3 | A-3 | A-3 |
| | Content | 35.6 | 35.7 | 36.8 | 16.7/19 | 16.7/19 | 36.7 | 36.7 | 36.7 |
| Onium salt | Kind | D-4 | D-4 | D-4 | D-4 | D-4 | D-1 | 0 | 0 |
| | Content | 0.9 | 0.9 | 0.25 | 0.9 | 0.9 | 0.9 | 0 | 0 |
| Sulfurous ester structure | Kind | B-2 | B-2 | B-2 | B-2 | B-2 | — | — | — |
| | Content | 1 | 1 | 1 | 1 | 1 | — | — | — |
| Group 4 element-containing | Kind | C-3 | C-3 | — | C-1/C-5/C-6 | C-2/C-3/C-4 | — | — | — |
| compound | Content | 1.3 | 1.3 | — | 0.5/0.4/0.4 | 0.4/0.5/0.4 | — | — | — |
| Radically polymerizable compound | Kind | E-1 | E-2 | E-1 | E-1 | E-1 | E-1 | E-1 | E-1 |
| | Content | 4.5 | 4.5 | 4.5 | 4.5 | 4.5 | 5.5 | 5.5 | 5.5 |
| Photoradical polymerization initiator | Kind | F-1 | F-2 | F-1 | F-1 | F-1 | F-1 | F-1 | F-1 |
| | Content | 1 | 1 | 1.3 | 1 | 1 | 1.3 | 1.3 | 1.3 |
| Polymerization inhibitor | Kind | G-2 | G-1 | G-2 | G-2 | G-2 | G-2 | G-2 | G-2 |
| | Content | 0.1 | 0.1 | 0.1 | 0.1 | 0.1 | 0.1 | 0.1 | 0.1 |
| Migration suppressing agent | Kind | H-1/H-2 | H-2 | H-2 | H-2 | H-2 | H-2 | H-2 | H-2 |
| | Content | 0.1/0.1 | 0.1 | 0.1 | 0.1 | 0.1 | 0.1 | 0.1 | 0.1 |
| Metal adhesiveness improving agent | Kind | I-2 | I-1 | I-2 | I-2 | I-2 | I-2 | I-2 | I-2 |
| | Content | 0.7 | 0.7 | 0.7 | 0.7 | 0.7 | 0.7 | 0.7 | 0.7 |
| Carboxylic group-containing compound | Kind | K-2 | K-1 | K-1 | K-1 | K-1 | K-1 | K-1 | K-1 |
| | Content | 0.1 | 0.1 | 0.05 | 0.1 | 0.1 | 0.1 | 0.1 | 0.1 |
| Other component | Kind | — | — | — | — | — | — | — | — |
| | Content | — | — | — | — | — | — | — | — |
| Solvent | Kind | J-1/J-2 | J-1/J-2 | J-3 | J-1/J-2 | J-1/J-2 | J-1/J-2 | J-1/J-2 | J-1/J-2 |
| | Content | 43.7/10.9 | 43.7/10.9 | 55.2 | 43.7/10.9 | 43.7/10.9 | 43.7/10.9 | 43.7/10.9 | 43.7/10.9 |
| Laser exposure wavelength (nm) | | 405 | 405 | 355 | 405 | 405 | i ray stepper | 405 | 355 |
| Chemical resistance | | A | A | A | A | A | B | C | C |
| Surface roughness | | A | A | B | A | A | C | B | B |

Details of the compounds used, shown in Table 1 to Table 6, are as follows.
<Specific Precursor>
A-1 to A-6: Compounds having the following structures.
The above compounds were synthesized with reference to the description of WO2018/025738A.
(A-1)
Mw:22000
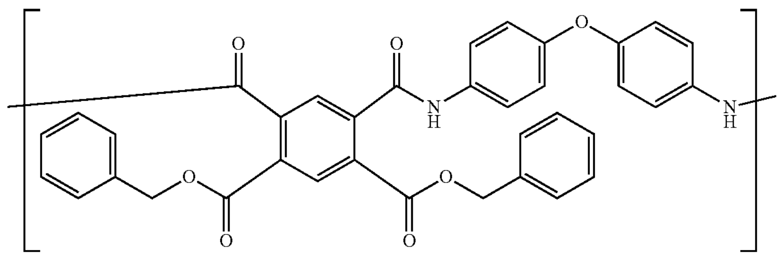
(A-2)
Mw:20000
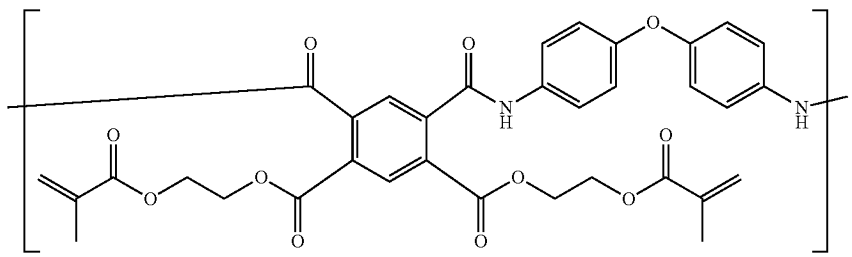
(A-3)
Mw:22000
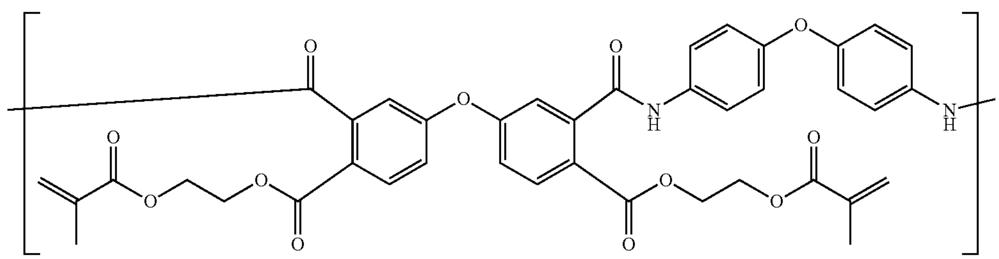
(A-4)
Mw:17000
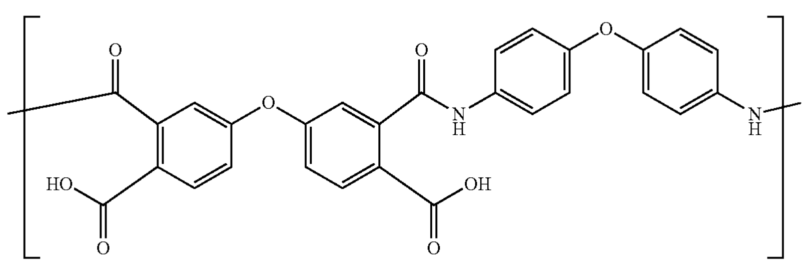
(A-5)
Mw:23000
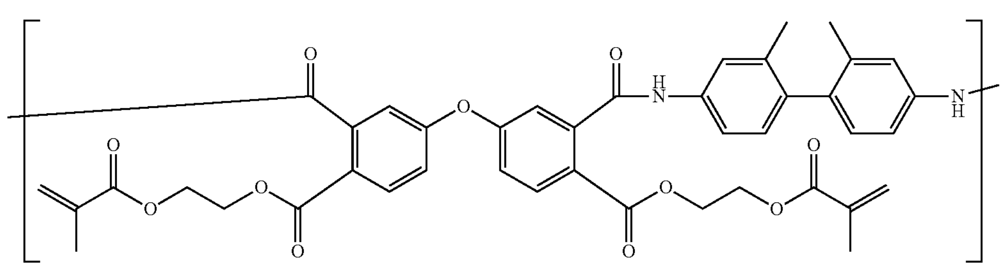

-continued (A-6)

Mw:11500

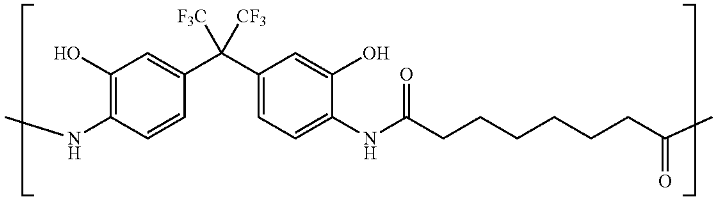

<Onium Salt>

D-1 to D-4: Compounds having the following structures.

Among the compounds having the following structures, the pKa of the conjugate acid of the anion structure (the tosylate anion) in D-2 and D-3 is-2.8, and the pKa of the conjugate acid of the anion structure (maleate anion) in D-1 and D-4 is 1.8.

(D-1)

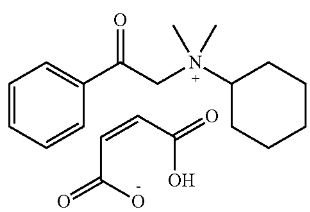

(D-2)

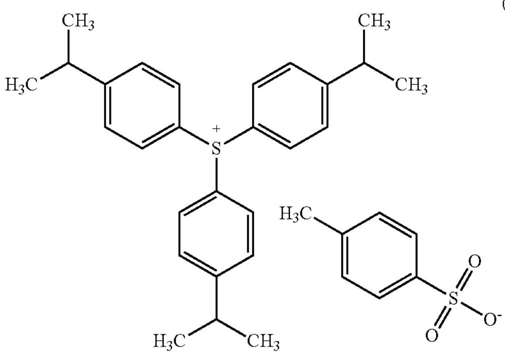

(D-3)

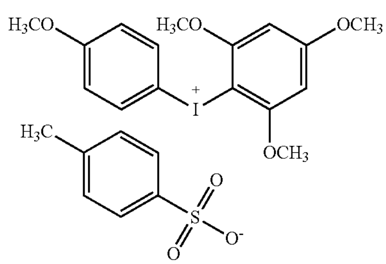

(D-4)

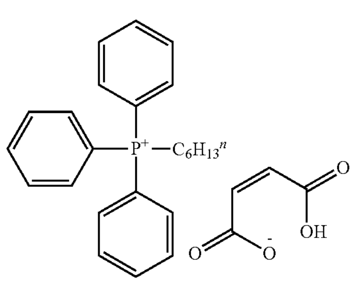

<Compound Having Sulfurous Ester Structure (Sulfurous Acid Ester Compound)>

B-1 to B-3: Compounds having the following structures.

The above compounds were manufactured by the following synthetic methods.

(B-1)

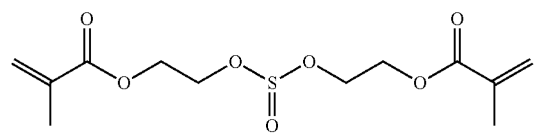

(B-2)

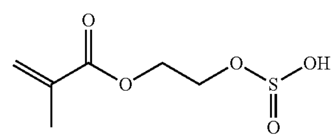

(B-3)

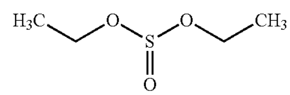

Synthesis Example 1: Synthesis of B-1

109.4 g of 2-hydroxyethyl methacrylate, 70.0 g of pyridine, and 500 mL of tetrahydrofuran were mixed. The mixed solution was cooled to 0° C., 50.0 g of $SOCl_2$ was added dropwise thereto over 60 minutes while keeping the temperature at 5° C. or lower, and then the mixture was stirred for 1 hour. 200 mL of distilled water was added thereto to stop the reaction, and then 500 mL of ethyl acetate was further added. The obtained organic phase was washed with distilled water 5 times, and then the low boiling point solvent was removed with an evaporator to obtain 220.1 g of a compound (B-1) having a sulfurous ester structure.

$^1$H NMR (400 MHZ, $CDCl_3$) δ (ppm): 6.15 (t, 2H), 5.62 (t, 2H), 4.37 (m, 4H), 4.30 (m, 2H), 4.21 (m, 2H), 1.95 (dd, 6H).

Synthesis Example 2: Synthesis of B-2

130.14 g of 2-hydroxyethyl methacrylate, 70.0 g of pyridine, and 500 mL of tetrahydrofuran were mixed. The mixed solution was cooled to 0° C., 119 g of $SOCl_2$ was added dropwise thereto over 60 minutes while keeping the temperature at 5° C. or lower, and then the mixture was stirred for 1 hour. 200 mL of distilled water was added thereto to stop the reaction, and then 500 mL of ethyl acetate was further added. The obtained organic phase was washed 5 times with distilled water and then purified by silica column chromatography to obtain 58.2 g of a compound (B-2) having a sulfurous ester structure.

$^1H$ NMR (400 MHZ, $CDCl_3$) δ (ppm): 6.15 (t, 1H), 5.62 (t, 1H), 4.37 (m, 2H), 4.30 (m, 1H), 4.21 (m, 1H), 1.95 (dd, 3H).

Synthesis Example 3: Synthesis of B-3

38.7 g of ethanol, 70.0 g of pyridine, and 500 mL of tetrahydrofuran were mixed. The mixed solution was cooled to 0° C., 50.0 g of $SOCl_2$ was added dropwise thereto over 60 minutes while keeping the temperature at 5° C. or lower, and then the mixture was stirred for 1 hour. 200 mL of distilled water was added thereto to stop the reaction, and then 500 mL of ethyl acetate was further added. The obtained organic phase was washed with distilled water 5 times, and then the low boiling point solvent was removed with an evaporator to obtain 99.3 g of a compound (B-3) having a sulfurous ester structure.

$^1H$ NMR (400 MHZ, $CDCl_3$) δ (ppm): 6.15 (t, 2H), 5.62 (t, 2H), 1.43 (m, 6H).

<Group 4 Element-Containing Compound>

C-1: Tetraisopropoxytitanium (manufactured by Matsumoto Fine Chemical Co., Ltd.)

C-2: Diisopropoxybis(acetylacetonato)titanium (manufactured by Matsumoto Fine Chemical Co., Ltd.).

C-3 to C-6: Compounds having the following structure (Here, C-3 is a compound having a radical polymerization initiation ability.)

C-3

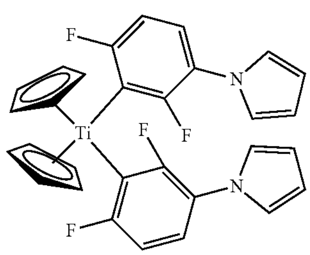

C-4

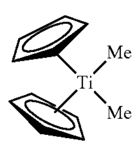

C-5

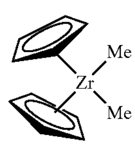

C-6

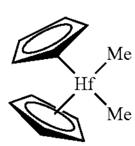

<<Radically Polymerizable Compound>>

E-1: SR-209 (tetraethylene glycol dimethacrylate, manufactured by Sartomer USA, LLC)

E-2: A-DPH (dipentaerythritol hexaacrylate, manufactured by Shin-Nakamura Chemical Co., Ltd.)

<Photoradical Polymerization Initiator>

F-1: IRGACURE OXE 01 (manufactured by BASF SE)·

F-2: IRGACURE OXE 02 (manufactured by BASF SE)

<Polymerization Inhibitor>

G-1: 2,6-di-tert-butyl-4-methylphenol (manufactured by Tokyo Chemical Industry Co., Ltd.)

G-2: Parabenzoquinone (manufactured by Tokyo Chemical Industry Co., Ltd.)

<Migration Suppressing Agent>

H-1: Compound having the following structure, manufactured by Tokyo Chemical Industry Co., Ltd.

H-2: Compound having the following structure, manufactured by Tokyo Chemical Industry Co., Ltd.

(H-1)

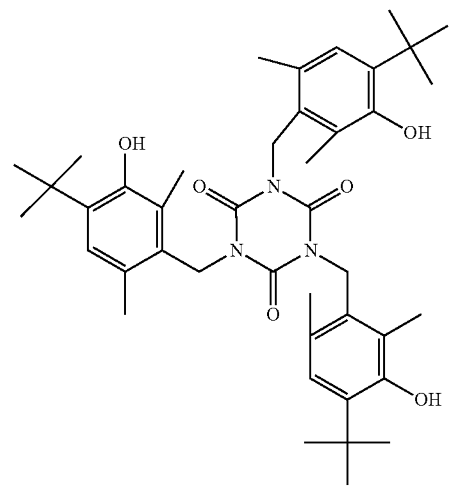

(H-2)

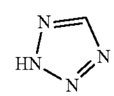

<Metal Adhesiveness Improving Agent>

I-1: Compound having the following structure, manufactured by Sigma-Aldrich Co., LLC I-2: Compound having the following structure, manufactured by Sigma-Aldrich Co., LLC (I-1)

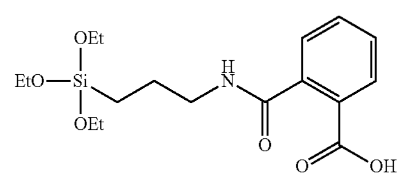

(I-2)

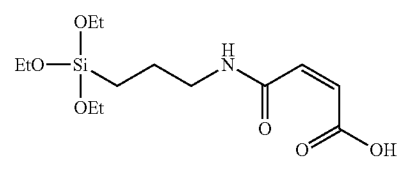

<Carboxy Group-Containing Compound>

K-1: Maleic acid (manufactured by Tokyo Chemical Industry Co., Ltd.)·

K-2: Phthalic acid (manufactured by Tokyo Chemical Industry Co., Ltd.)

<Solvent>

J-1: γ-Butyrolactone (manufactured by Sanwayuka Industry Corporation)·

J-2: Dimethyl sulfoxide (manufactured by FUJIFILM Wako Pure Chemical Corporation)

<Other Components>

L-1: MEGAFACE F-554 (manufactured by DIC Corporation)·

L-2: MEGAFACE F-563 (manufactured by DIC Corporation)

<Evaluation of Surface Roughness>

Each of the photosensitive resin compositions in Examples and Comparative Examples was pressure-filtered through a filter having a pore width of 0.8 μm at a pressure of 0.3 MPa, and then a silicon wafer having a diameter of 200 mm (8 inches, where 1 inch is 2.54 cm) was spin-coated with each of the filtered photosensitive resin compositions (Examples 1 to 21 and 24 to 45 and Comparative Examples). In Example 22 or 23, a 100 mm× 100 mm rectangular silicon wafer was slit-coated. The silicon wafer coated with the photosensitive resin composition was dried at 100° C. for 5 minutes on a hot plate to form, on the silicon wafer, a uniform photosensitive film having a film thickness of 10 μm. The coating was carried out by the spin coating for 30 seconds so that the film thickness was 10 μm by adjusting the rotation speed. In the case of the slit coating, the distance between the substrate and the slit die was set to 200 μm, the distance between the liquid ejection ports of the slit die was set to 150 μm, and the ejection liquid volume was adjusted so that the film thickness was 10 μm.

The photosensitive film on the silicon wafer was subjected to laser exposure, development, and heat curing.

For laser exposure, pattern exposure was carried out directly, without using a mask, by using a laser having a wavelength listed in the column of "Laser exposure wavelength (nm)" in Table 1 to Table 6. The irradiation dose was 500 mJ/cm$^2$. The exposure pattern was a line- and-space pattern having a width of 30 μm.

Further, in Comparative Example 1, the photosensitive film on the silicon wafer was exposed using a stepper (Nikon Corporation, NSR 2005 i9C). The i-ray was used for exposure, and the exposure was carried out at a wavelength of 365 nm with an exposure energy of 500 mJ/cm$^2$. A photo mask having a line- and-space pattern having a width of 30 μm was used.

The exposed photosensitive film (the resin layer) was shower-developed with cyclopentanone for 60 seconds to form a line- and-space pattern having a width of 30 μm. Next, the temperature was raised at a temperature elevation rate of 10° C./min under a nitrogen atmosphere, and after reaching 230° C., heating was carried out for 3 hours.

The surface roughness (Ra) of the cured film of the photosensitive resin composition after heat curing was measured using an atomic force microscope (AFM) system (Dimension 3100, manufactured by Digital instruments). The measurement area was a square of 10 μm×10 μm.

The obtained surface roughness Ra values were evaluated according to the evaluation standard described below, and the obtained evaluation results are shown in Table 1 to Table 6. It can be said that the smaller the surface roughness value is, the more excellent the surface smoothness of the obtained cured film is.

[Evaluation Standard]

A: Surface roughness Ra is less than 5 nm.

B: Surface roughness Ra is 5 nm or more and less than 10 nm

C: Surface roughness Ra is 10 nm or more.

<Evaluation of Chemical Resistance>

The cured film obtained by the same method as the surface roughness method described above was immersed in the following chemical under the following conditions, and the dissolution rate was calculated.

Chemical: A 90:10 (mass ratio) mixture of dimethyl sulfoxide (DMSO) and an aqueous solution containing 25% by weight of tetramethylammonium hydroxide (TMAH).

Evaluation conditions: The above-described cured film was immersed in the chemical at 75° C. for 15 minutes, the film thicknesses of the cured film before and after immersion were compared, and then the dissolution rate (nm/min) was calculated.

The obtained dissolution rate was evaluated according to the evaluation standard described below, and the obtained evaluation results are shown in Table 1 to Table 6. It can be said that the lower the dissolution rate is, the more excellent the chemical resistance is.

[Evaluation Standard]

A: Dissolution rate is less than 250 nm/min.

B: Dissolution rate is 250 nm/min or more and less than 500 nm/min.

C: Dissolution rate is 500 nm/min or more.

From the results of Examples and Comparative Examples, it can be seen that according to the pattern forming method of Examples, in which a laser is used for exposure and an onium salt is contained in the photosensitive film, a cured film excellent in surface smoothness and chemical resistance can be manufactured as compared with the case of using the photosensitive resin composition of Comparative Examples.

In the pattern forming method in Comparative Example 1, since an i-ray stepper was used as the exposure light source without using the laser light, the surface smoothness of the obtained cured film was inferior.

In the pattern forming method in Comparative Example 2 or Comparative Example 3, since the photosensitive film did not contain an onium salt, the chemical resistance of the obtained cured film was inferior.

Examples 100 to 145

Photosensitive resin compositions of Examples 1 to 45 were pressure-filtered in the same manner as in the method of Example 1, and then a silicon wafer was coated with each of the filtered compositions by a spin coating method. The silicon wafer coated with the above photosensitive resin composition was dried at 100° C. for 5 minutes on a hot plate to form a uniform photosensitive film having a film thickness of 10 μm, on the silicon wafer.

The photosensitive film on the silicon wafer was directly pattern-exposed using a 405 nm laser without using a mask. The exposure pattern was a pattern in which a hole pattern having a diameter of 20 μm was formed. Among the exposure doses of 200, 400, 600, and 800 mJ/cm$^2$, an exposure dose was selected so that the shape of the hole having a diameter of 20 μm was closest to the circular shape.

The photosensitive film (the resin layer) after exposure was shower-developed with cyclopentanone for 60 seconds to form a hole having a diameter of 20 μm. Next, the temperature was raised at a temperature elevation rate of 10° C./min under a nitrogen atmosphere, and after reaching 200° C., heating was carried out at 200° C. for 3 hours. After cooling to room temperature, a thin copper layer (a metal layer) having a thickness of 2 μm was formed by a vapor deposition method on a part of the surface of the cured photosensitive film (the cured film) so that the hole portion was covered. Further, the surfaces of the metal layer and the cured film were subjected to treatments from the filtration of the photosensitive resin composition to the 3 hour heating of the patterned film (the film having a hole) in the same manner as above, using again the same kind of photosensitive resin composition, thereby preparing a laminate consisting of the cured film, the metal layer, and the cured film in order.

An interlayer insulating film for a rewiring layer consisting of these laminates was excellent in insulating properties.

Further, when a semiconductor device was manufactured using this interlayer insulating film for a rewiring layer, it has been confirmed that the semiconductor device operates without any problem.

Explanation of References

1: semiconductor device
2: semiconductor chip
2*a*: terminal
3: sealing agent
4: rewiring layer
5: wire
6: interlayer insulating film
7: external connection terminal

What is claimed is:

1. A pattern forming method comprising:
an exposure step of exposing a photosensitive film to laser light; and
a development step of developing the photosensitive film after the exposure to obtain a pattern,
wherein the photosensitive film contains at least one precursor selected from the group consisting of a polyimide precursor and a polybenzoxazole precursor, an onium salt, and a compound having a plurality of carboxy groups and having a molecular weight of 1,000 or less.

2. The pattern forming method according to claim 1, wherein a wavelength of the laser light is 250 to 550 nm.

3. The pattern forming method according to claim 1, wherein the photosensitive film further contains a compound having a sulfurous ester structure.

4. The pattern forming method according to claim 1, further comprising a curing step of heating the pattern to obtain a cured pattern, after the development step.

5. The pattern forming method according to claim 1, wherein a cation in the onium salt includes at least one cation selected from the group consisting of a tetraalkylammonium cation, a sulfonium cation, and an iodonium cation.

6. The pattern forming method according to claim 1, wherein the onium salt contains an ammonium cation as a cation, and the onium salt contains an anion of which a conjugate acid has a pKa of 1.8 or less, as an anion.

7. The pattern forming method according to claim 1, wherein the photosensitive film further contains a Group 4 element-containing compound.

8. The pattern forming method according to claim 7, wherein the Group 4 element-containing compound is a photoradical generator.

9. The pattern forming method according to claim 7, wherein the Group 4 element-containing compound is an organic compound containing at least one selected from the group consisting of a titanium atom, a zirconium atom, and a hafnium atom.

10. The pattern forming method according to claim 7, wherein the Group 4 element-containing compound includes at least one selected from the group consisting of metallocene and a metallocene derivative.

11. The pattern forming method according to claim 1, wherein the photosensitive film is a photosensitive film formed by slit coating.

12. The pattern forming method according to claim 1, wherein the photosensitive film is formed on a rectangular base material.

13. A photosensitive resin composition comprising:
at least one precursor selected from the group consisting of a polyimide precursor and a polybenzoxazole precursor;
an onium salt; and
a compound having a plurality of carboxy groups and having a molecular weight of 1,000 or less,
wherein the photosensitive resin composition is used for forming the photosensitive film in the pattern forming method according to claim 1.

14. A cured film formed from the photosensitive resin composition according to claim 13.

15. The cured film according to claim 14, wherein the cured film is used as an interlayer insulating film for a rewiring layer.

16. A laminate comprising two or more layers of the cured films according to claim 14.

17. The laminate according to claim 16, further comprising a metal layer between the cured films.

18. A device comprising the cured film according to claim 14.

19. The pattern forming method according to claim 1, wherein the photosensitive film contains a photopolymerization initiator, and a polymerizable compound.

20. The pattern forming method according to claim 1, wherein the polyimide precursor contains a repeating unit represented by Formula (2), the polybenzoxazole precursor contains a repeating unit represented by Formula (3),

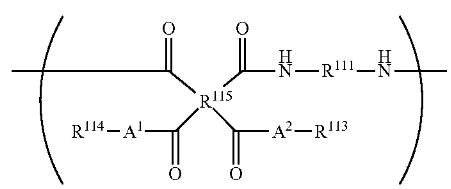

(2)

in Formula (2), $A^1$ and $A^2$ each independently represent an oxygen atom or —NH—, $R^{111}$ represents a divalent organic group, $R^{115}$ represents a tetravalent organic group, and $R^{113}$ and $R^{114}$ each independently represent a hydrogen atom or a monovalent organic group,

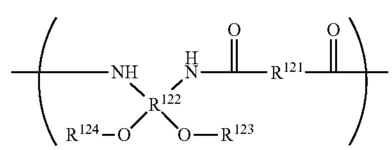

(3)

in Formula (3), $R^{121}$ represents a divalent organic group, $R^{122}$ represents a tetravalent organic group, and $R^{123}$ and $R^{124}$ each independently represent a hydrogen atom or a monovalent organic group.

21. The pattern forming method according to claim 1, wherein the photosensitive film contains a photopolymerization initiator, and a polymerizable compound,
the polyimide precursor contains a repeating unit represented by Formula (2), the polybenzoxazole precursor contains a repeating unit represented by Formula (3), (2)

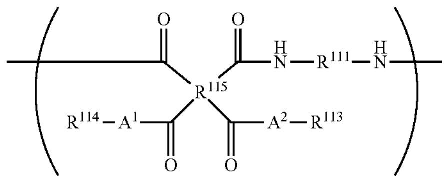

in Formula (2), $A^1$ and $A^2$ each independently represent an oxygen atom or —NH—, $R^{111}$ represents a divalent organic group, $R^{115}$ represents a tetravalent organic group, and $R^{113}$ and $R^{114}$ each independently represent a hydrogen atom or a monovalent organic group, (3)

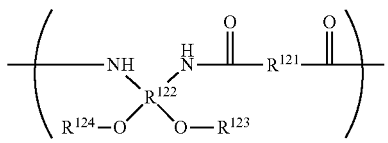

in Formula (3), $R^{121}$ represents a divalent organic group, $R^{122}$ represents a tetravalent organic group, and $R^{123}$ and $R^{124}$ each independently represent a hydrogen atom or a monovalent organic group.

22. The photosensitive resin composition according to claim 13, wherein the photosensitive resin composition contains a photopolymerization initiator, and a polymerizable compound.

23. The photosensitive resin composition according to claim 13, wherein the polyimide precursor contains a repeating unit represented by Formula (2), the polybenzoxazole precursor contains a repeating unit represented by Formula (3), (2)

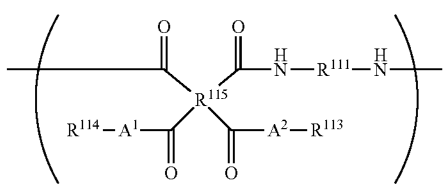

in Formula (2), $A^1$ and $A^2$ each independently represent an oxygen atom or —NH—, $R^{111}$ represents a divalent organic group, $R^{115}$ represents a tetravalent organic group, and $R^{113}$ and $R^{114}$ each independently represent a hydrogen atom or a monovalent organic group, (3)

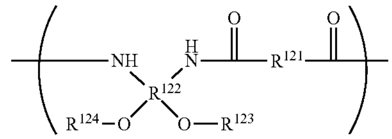

in Formula (3), $R^{121}$ represents a divalent organic group, $R^{122}$ represents a tetravalent organic group, and $R^{123}$ and $R^{124}$ each independently represent a hydrogen atom or a monovalent organic group.

24. The photosensitive resin composition according to claim 13, wherein the photosensitive resin composition contains a photopolymerization initiator, and a polymerizable compound, the polyimide precursor contains a repeating unit represented by Formula (2), the polybenzoxazole precursor contains a repeating unit represented by Formula (3), (2)

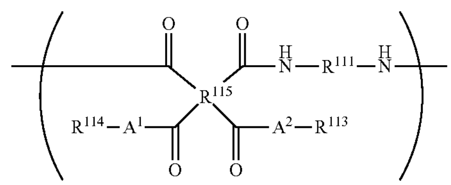

in Formula (2), $A^1$ and $A^2$ each independently represent an oxygen atom or —NH—, $R^{111}$ represents a divalent organic group, $R^{115}$ represents a tetravalent organic group, and $R^{113}$ and $R^{114}$ each independently represent a hydrogen atom or a monovalent organic group, (3)

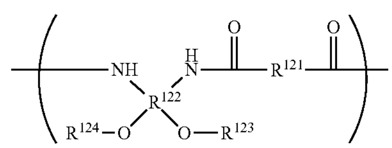

in Formula (3), $R^{121}$ represents a divalent organic group, $R^{122}$ represents a tetravalent organic group, and $R^{123}$ and $R^{124}$ each independently represent a hydrogen atom or a monovalent organic group.

* * * * *